United States Patent
Yamada et al.

(10) Patent No.: US 8,663,883 B2
(45) Date of Patent: Mar. 4, 2014

(54) CHARGE-TRANSPORTING FILM, PHOTOELECTRIC CONVERSION DEVICE, ELECTROPHOTOGRAPHIC PHOTORECEPTOR, PROCESS CARTRIDGE, AND IMAGE FORMING APPARATUS

(75) Inventors: Wataru Yamada, Kanagawa (JP); Katsumi Nukada, Kanagawa (JP); Takatsugu Doi, Kanagawa (JP); Yuko Iwadate, Kanagawa (JP); Tomoya Sasaki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/368,791

(22) Filed: Feb. 8, 2012

(65) Prior Publication Data
US 2013/0052570 A1 Feb. 28, 2013

(30) Foreign Application Priority Data
Aug. 22, 2011 (JP) ................. 2011-181012

(51) Int. Cl.
G03G 5/07 (2006.01)
(52) U.S. Cl.
USPC ................ 430/58.85; 430/58.65; 430/58.7; 399/159
(58) Field of Classification Search
USPC ................ 430/58.65, 58.7, 58.85; 399/159
See application file for complete search history.

(56) References Cited

U.S. PATENT DOCUMENTS 5,695,898 A 12/1997 Go et al.
6,180,303 B1 1/2001 Uematsu et al.

FOREIGN PATENT DOCUMENTS

| JP | A-2000-019749 | 1/2000 | | |
|----|---------------|--------|---|---|
| JP | A-2000-066424 | 3/2000 | | |
| JP | 2000-147814 | * 5/2000 | ............... | G03G 5/06 |
| JP | B2-3287678 | 3/2002 | | |
| JP | A-2004-240079 | 8/2004 | | |
| JP | A-2005-234546 | 9/2005 | | |
| JP | A-2007-156081 | 6/2007 | | |

OTHER PUBLICATIONS

Translation of JP 2000-147814 published May 2000.*

* cited by examiner

*Primary Examiner* — Peter Vajda
(74) *Attorney, Agent, or Firm* — Oliff PLC

(57) ABSTRACT

A charge-transporting film includes a polymer of a compound represented by Formula (I):

$$(Ra)_n\text{-Fa-Xa-Fa'-}(Ra')_{n'} \qquad (I)$$

wherein Fa and Fa' independently represent a charge-transporting sub-unit including an aromatic ring, Ra and Ra' independently represent a —CH=CH$_2$ directly bonded to the aromatic ring of the charge-transporting sub-unit or a group represented by Formula (a),

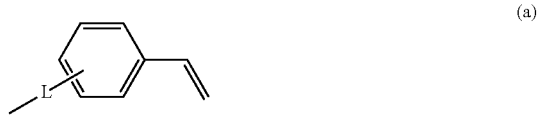

Xa represents an alkylene group or a bivalent group in which an alkylene group and a group selected from —O—, —S—, and ester are combined, n and n' independently represent an integer of 0 or more (wherein n and n' are not simultaneously 0), and L represents a linking group which is represented by *—(CH$_2$)$_{n''}$—O—CH$_2$— and which is bonded to the aromatic ring of the charge-transporting sub-unit, wherein n" is 1 or 2 and the linking group is bonded to the aromatic, ring of the charge-transporting sub-unit with *.

18 Claims, 6 Drawing Sheets

CHARGE-TRANSPORTING FILM, PHOTOELECTRIC CONVERSION DEVICE, ELECTROPHOTOGRAPHIC PHOTORECEPTOR, PROCESS CARTRIDGE, AND IMAGE FORMING APPARATUS

CROSS-REFERENCE TO RELATED APPLICATIONS

This application is based on and claims priority under 35 USC 119 from Japanese Patent Application No. 2011-181012 filed Aug. 22, 2011.

BACKGROUND

1. Technical Field

The present invention relates to a charge-transporting film, a photoelectric conversion device, an electrophotographic photoreceptor, a process cartridge, and an image forming apparatus.

2. Related Art

Recently, charge-transporting films using organic compounds used in electronic devices such as electrophotographic photoreceptors, organic EL devices, organic transistors, and organic solar cells have been actively developed.

Particularly, a charge-transporting film is an important element in the field of electrophotographic photoreceptors.

SUMMARY

According to an aspect of the invention, there is provided a charge-transporting film including a polymer of a compound represented by Formula (I):

$$(Ra)_n\text{-Fa-Xa-Fa'-}(Ra')_{n'} \quad (I)$$

wherein Fa and Fa' independently represent a charge-transporting sub-unit including an aromatic ring, Ra and Ra' independently represent a —CH=CH₂ directly bonded to the aromatic ring of the charge-transporting sub-unit represented by Fa and Fa' or a group represented by Formula (a), Xa represents an alkylene group or a bivalent group in which an alkylene group and a group selected from —O—, —S—, and ester are combined, n and n' independently represent an integer of 0 or more (wherein n and n' are not simultaneously 0), and L represents a linking group which is represented by *—(CH₂)ₙ″—O—CH₂— and which is bonded to the aromatic ring of the charge-transporting sub-unit represented by Fa and Fa', wherein n" is 1 or 2 and the linking group is bonded to the aromatic ring of the charge-transporting sub-unit with *.

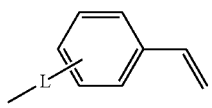

(a)

BRIEF DESCRIPTION OF THE DRAWINGS

Exemplary embodiments of the present invention will be described in detail based on the following figures, wherein.

DETAILED DESCRIPTION

Charge-Transporting Film

Figure 1:
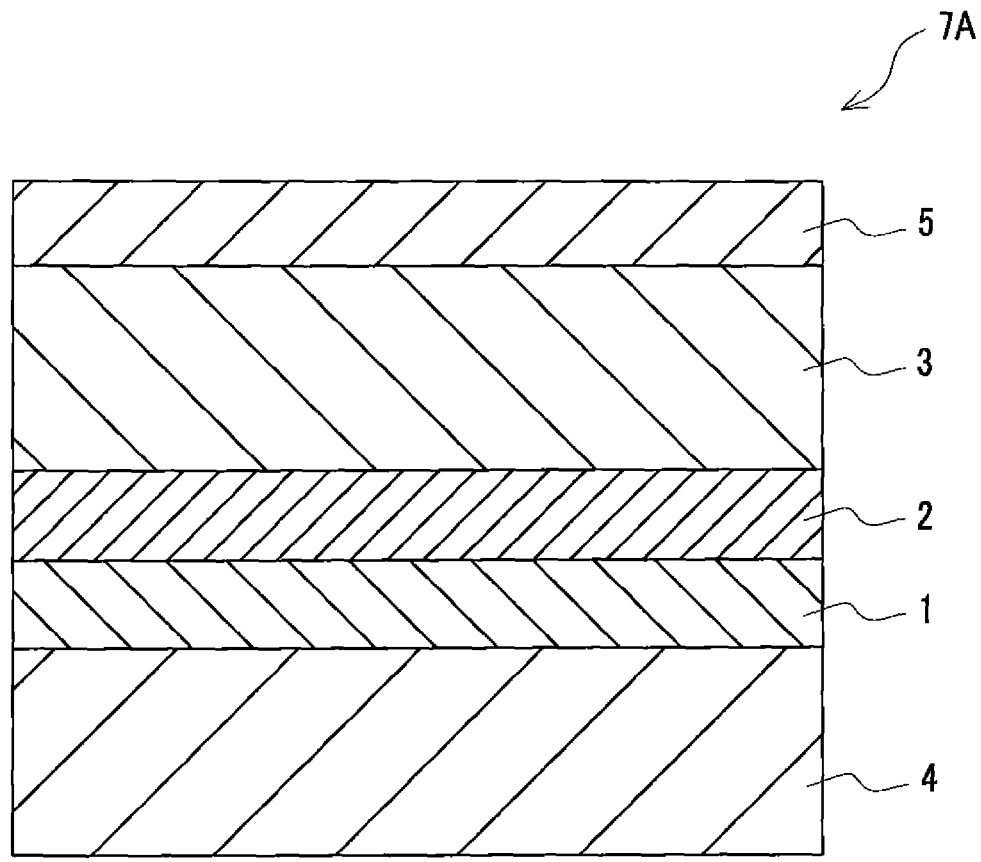
FIG. 1 is a partial sectional view schematically illustrating an electrophotographic photoreceptor according to an exemplary embodiment of the invention.

A charge-transporting film according to an exemplary embodiment of the invention includes a polymer of a compound represented by Formula (I).

$$(Ra)_n\text{-Fa-Xa-Fa'-}(Ra')_{n'} \quad (I)$$

In Formula (I), Fa and Fa' independently represent a charge-transporting sub-unit including an aromatic ring, Ra and Ra' independently represent a —CH=CH₂ directly bonded to the aromatic ring of the charge-transporting sub-unit represented by Fa and Fa' respectively or a group represented by Formula (a), Xa represents an alkylene group or a bivalent group in which an alkylene group and a group selected from —O—, —S—, and ester are combined, n and n' independently represent an integer of 0 or more (wherein n and n' are not simultaneously 0), and L represents a linking group which is represented by *—(CH₂)ₙ″—O—CH₂— and which is bonded to the aromatic ring of the charge-transporting sub-unit represented by Fa and F wherein n" is 1 or 2 and the linking group is bonded to the aromatic ring of the charge-transporting sub-unit with *.

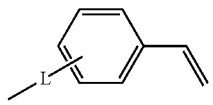

(a)

Charge-transporting compounds having a (meth)acrylic group, which are conventionally used have a strong hydrophilic property of the (meth)acrylic group and it can be thus thought that they form a certain layer-separated state in a site of a skeleton exhibiting the charge transportability during polymerization, thereby hindering hopping conduction. Accordingly, it is thought that a charge-transporting film including a polymer of a charge-transporting compound having a (meth)acrylic group is poor in charge-transporting efficiency and environmental stability is deteriorated due to partial adsorption of moisture or the like.

On the contrary, the compound represented by Formula (I) and used in this exemplary embodiment has a vinyl-based chain-polymerizable group not highly hydrophilic and has plural skeletons expressing charge transportability in one molecule, and the skeletons are linked to each other with aromatic rings or flexible linking groups not having a conjugated bond such as a conjugated double bond. Due to this structure, it is thought that it is possible to achieve efficient charge transportability and an increase in strength and it is possible to suppress the formation of the layer-separated state during polymerization. As a result, it is thought that the charge-transporting film including the polymer of the compound represented by Formula (I) is excellent in both charge transportability and mechanical strength and it is possible to reduce the environmental dependency of charge transportability (temperature and humidity dependency).

The charge-transporting sub-unit including an aromatic ring, which is represented by Fa and Fa' in Formula (I), may be a sub-unit originating from an electron-transporting compound or a hole-transporting compound including an aromatic ring and triarylamine is preferably used which is excellent in charge mobility, oxidation stability, and the like.

The substitution number of Ra and Ra', that is, n+n', in Formula (I) is equal to or more than 1 and the value of n+n' is preferably equal to or more than 2 from the viewpoints of stacked film formability and strength. The upper limit of n+n' is preferably 8 in terms of material stability. In Formula (a) expressing Ra and Ra', L may be substituted with any position and an isomer may be mixed thereinto.

The compound represented by Formula (I) is preferably a compound represented by Formula (III), in that charge mobility, oxidation stability, and the like are excellent.

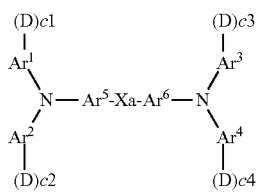

(III)

In Formula (III), $Ar^1$ to $Ar^4$ independently represent a substituted or non-substituted aryl group, $Ar^5$ and $Ar^6$ independently represent a substituted or non-substituted allylene group, Xa represents an alkylene group or a bivalent group in which an alkylene group and a group selected from —O—, —S—, and ester are combined, D represents —CH=$CH_2$ or a group represented by Formula (a'), c1 to c4 each independently represent 0 or 1, the total number of D is 2 or more, and L represents a linking group which is represented by *—$(CH_2)_{n''}$—O—$CH_2$— and which is bonded to the aromatic ring of the charge-transporting sub-unit represented by Fa and Fa', wherein n'' is 1 or 2 and the linking group is bonded to the aromatic ring of the charge-transporting sub-unit with *.

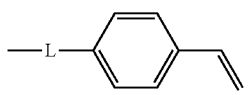

(a')

Substituted or non-substituted aryl groups represented by $Ar^1$ to $Ar^4$ in Formula (III) may be equal to or different from each other.

Here, examples of the substituent in the substituted aryl group include an alkyl group with a carbon number of from 1 to 4, an alkoxy group with a carbon number of 1 to 4, a phenyl group substituted with an alkoxy group with a carbon number of from 1 to 4, a non-substituted phenyl group, an aralkyl group with a carbon number of from 7 to 10, and a halogen atom, other than "D".

$Ar^1$ to $Ar^4$ are preferably any one of Structural Formulas (1) to (7). Structural Formulas (1) to (7) are represented along with "-$(D)_C$" which can be linked to $Ar^1$ to $Ar^4$. Here, "-$(D)_C$" has the same definition as "-$(D)_{C1}$", "-$(D)_{C2}$", "-$(D)_{C3}$", "-$(D)_{C4}$" in Formula (III) and preferable examples thereof are the same.

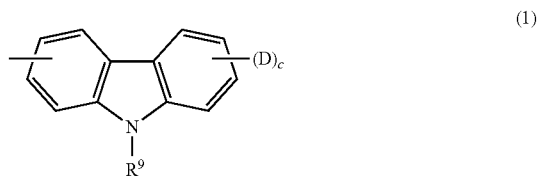

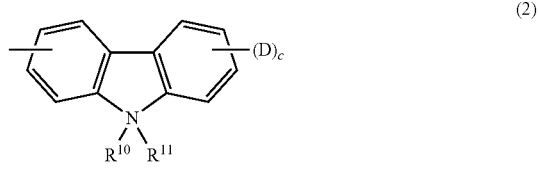

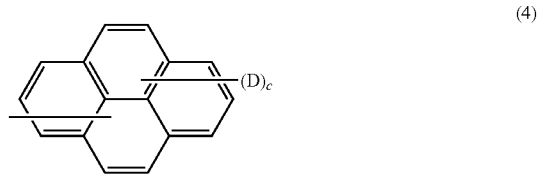

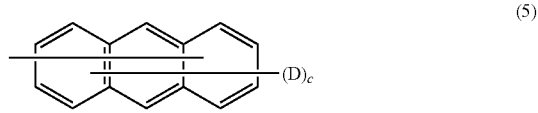

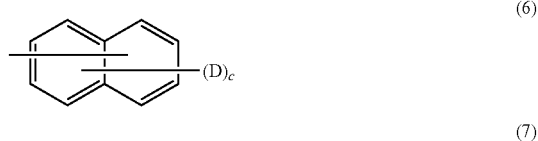

In Structural Formula (1), $R^9$ represents one selected from the group consisting of a hydrogen atom, an alkyl group with a carbon number of from 1 to 4, a phenyl group substituted with an alkyl group with a carbon number of from 1 to 4 or an alkoxy group with a carbon number of from 1 to 4, a non-substituted phenyl group, and an aralkyl group with a carbon number of from 7 to 10.

In Structural Formulas (2) and (3), $R^{10}$ to $R^{12}$ independently represent one selected from the group consisting of a hydrogen atom, an alkyl group with a carbon number of from 1 to 4, an alkoxy group with a carbon number of from 1 to 4, a phenyl group substituted with an alkoxy group with a carbon number of from 1 to 4, a non-substituted phenyl group, an aralkyl group with a carbon number of from 7 to 10, and a halogen atom. Here, t represents an integer of from 1 to 3.

In Structural Formula (7), Ar represents a substituted or non-substituted allylene group.

Here, in Structural Formula (7), Ar is preferably represented by Structural Formula (8) or (9).

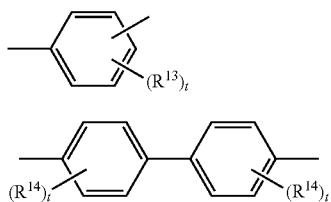

(8)

(9)

In Structural Formulas (8) and (9), $R^{13}$ and $R^{14}$ independently represent one selected from the group consisting of a hydrogen atom, an alkyl group with a carbon number of from 1 to 4, an alkoxy group with a carbon number of from 1 to 4, a phenyl group substituted with an alkoxy group with a carbon number of from 1 to 4, a non-substituted phenyl group, an aralkyl group with a carbon number of from 7 to 10, and a halogen atom. Here, t represents an integer of from 1 to 3.

In Structural Formula (7), Z' represents a bivalent organic linking group and is preferably represented by any one of Structural Formulas (10) to (17). In addition, s represents 0 or 1.

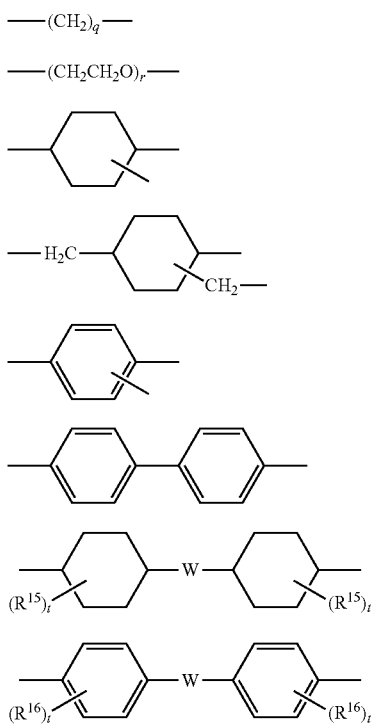

(10)
(11)
(12)
(13)
(14)
(15)
(16)
(17)

In Structural Formulas (10) to (17), $R^{15}$ and $R^{16}$ independently represent one selected from the group consisting of a hydrogen atom, an alkyl group with a carbon number of from 1 to 4, an alkoxy group with a carbon number of from 1 to 4, a phenyl group substituted with an alkoxy group with a carbon number of from 1 to 4, a non-substituted phenyl group, an aralkyl group with a carbon number of from 7 to 10, and a halogen atom. W represents a bivalent group, q and r independently represent an integer of from 1 to 10, and t represents an integer of from 1 to 3.

In Structural Formula (16) and (17), W is preferably any one of bivalent groups represented by Structural Formulas (18) to (26). In Structural Formula (25), u represents an integer of 0 to 3.

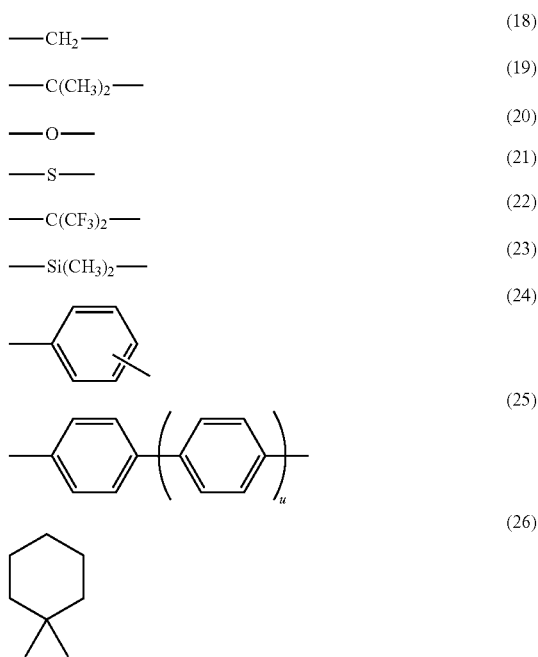

—CH$_2$— (18)

—C(CH$_3$)$_2$— (19)

—O— (20)

—S— (21)

—C(CF$_3$)$_2$— (22)

—Si(CH$_3$)$_2$— (23)

(24)

(25)

(26)

Regarding the substituted or non-substituted allylene group represented by $Ar^5$ and $Ar^6$ in Formula (III), an example of the allylene group is an allylene group obtained by removing one hydrogen atom at a predetermined position from the aryl group exemplified in the description of $Ar^1$ to $Ar^4$.

Examples of the substituent in the substituted allylene group are the same as the examples of the substituents other than "D" in the substituted aryl group exemplified in description of $Ar^1$ to $Ar^4$.

Xa in Formula (III) will be described below.

Xa represents an alkylene group or a bivalent group in which an alkylene group and a group selected from —O—, —S—, and ester are combined which is a linking group not including an aromatic ring or a conjugated bond such as a conjugated double bond.

Specifically, Xa may be an alkylene group with a carbon number of from 1 to 10 or a bivalent group in which an alkylene group with a carbon number of from 1 to 10 and a group selected from —O—, —S—, —O—C(=O)—, and —C(=O)—O— are combined.

When Xa is an alkylene group, the alkylene group may have a substituent such as alkyl, alkoxy, and halogen or two of the substituents may be bonded to each other to form the structure of the bivalent group represented by Formula (26) and described as a specific example of W.

The total number of D in Formula (III) is equal to or more than 2 and preferably equal to or more than 3 in terms of stacked film formability and strength. The upper limit of the total number of D is 8 in terms of material stability.

Specific examples of the compound represented by Formula (III) are described below. The compound represented by Formula (III) is not limited to the examples.

Here, Compounds ii-1 to ii-34 are specific examples of the compound in which the total number of D in Formula (III) is 2, Compounds iii-1 to iii-9 are specific examples of the compound in which the total number of D in Formula (III) is 3, and Compounds iv-1 to iv-17 are specific examples of the compound in which the total number of D in Formula (III) is 4.

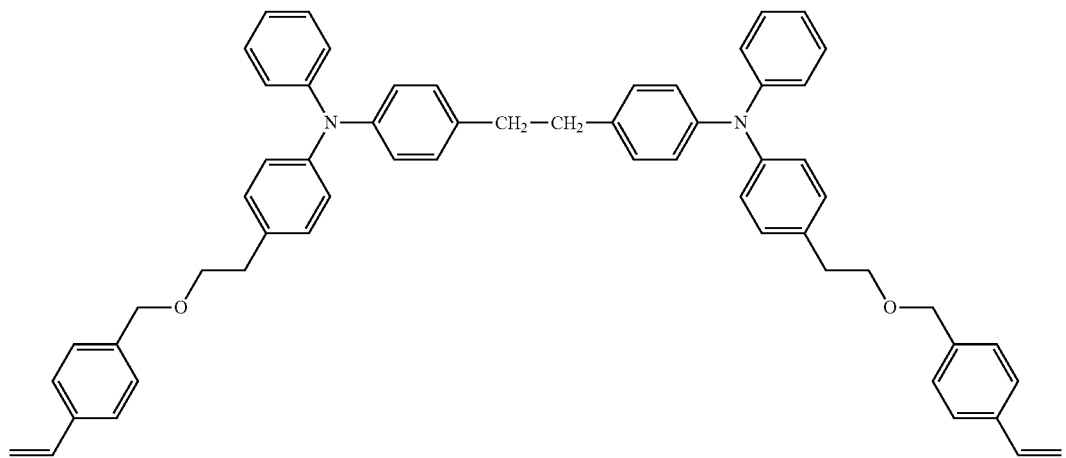
ii-1
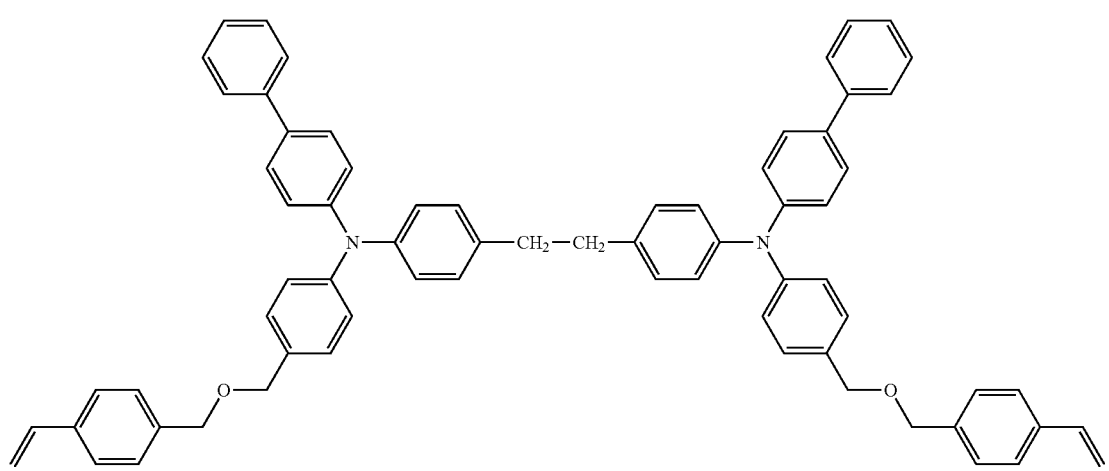
ii-2
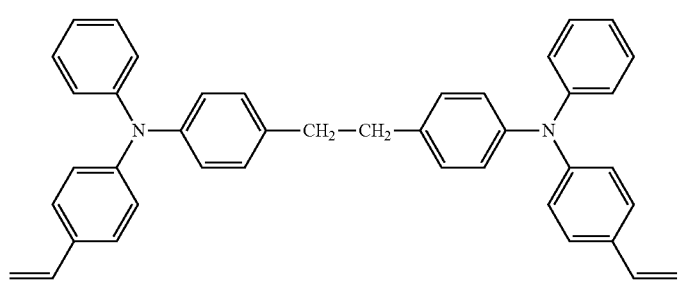
ii-3

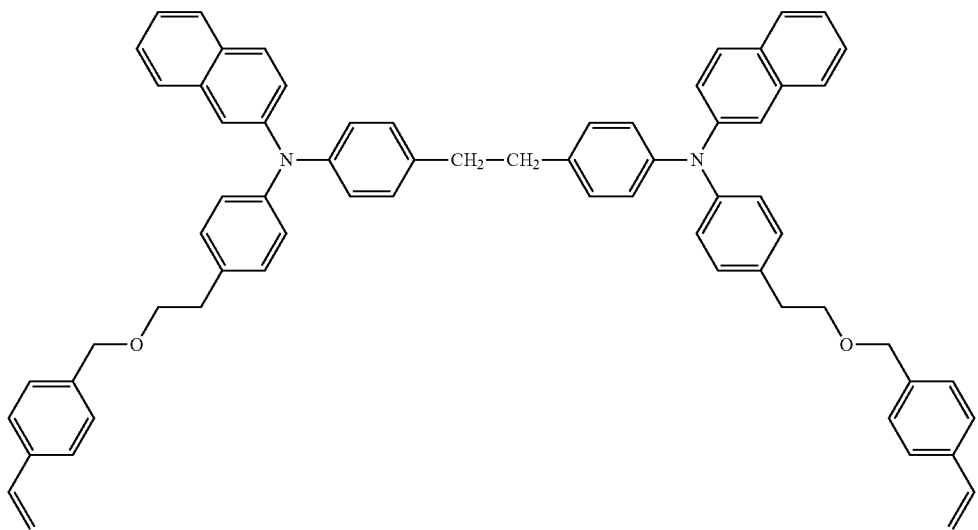
ii-4
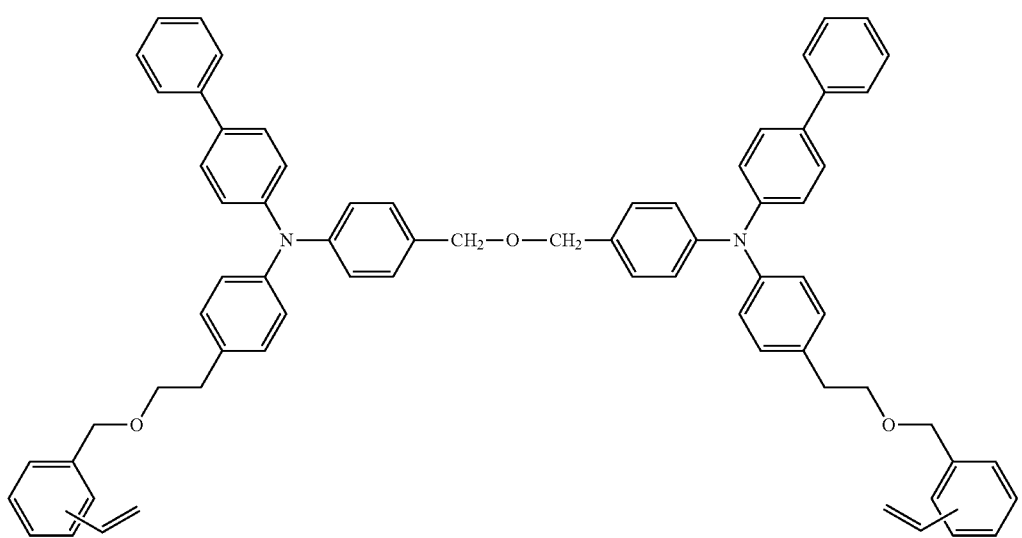
ii-5
m/p ≈ 50/50
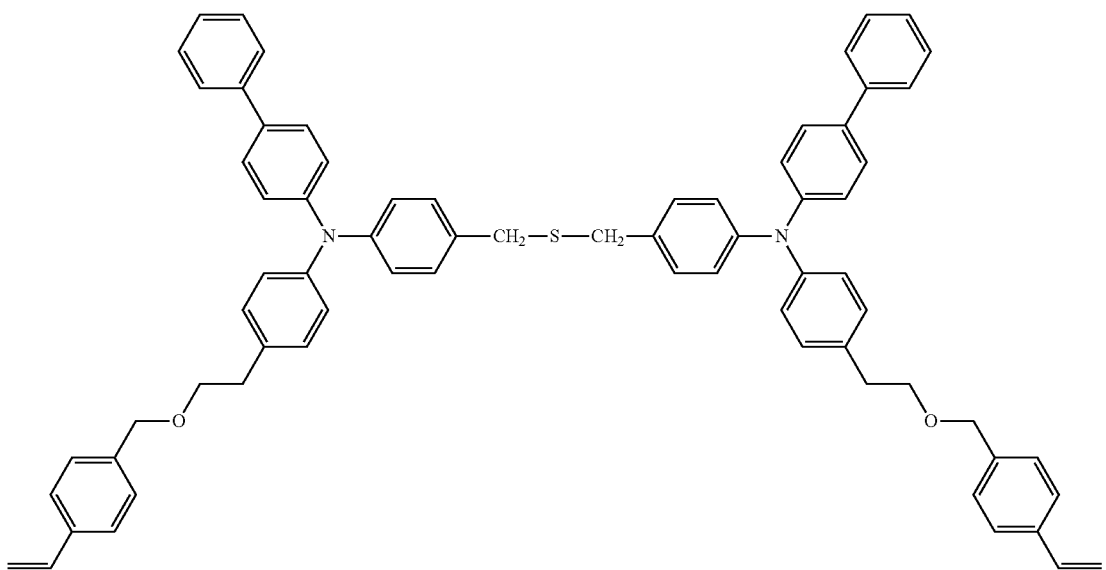
ii-6 ii-7
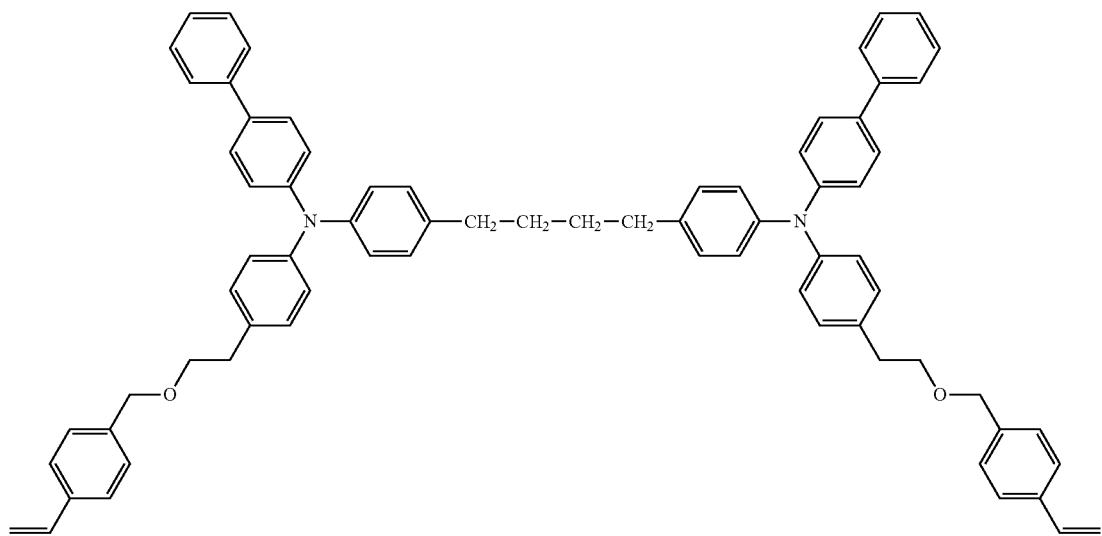
ii-8
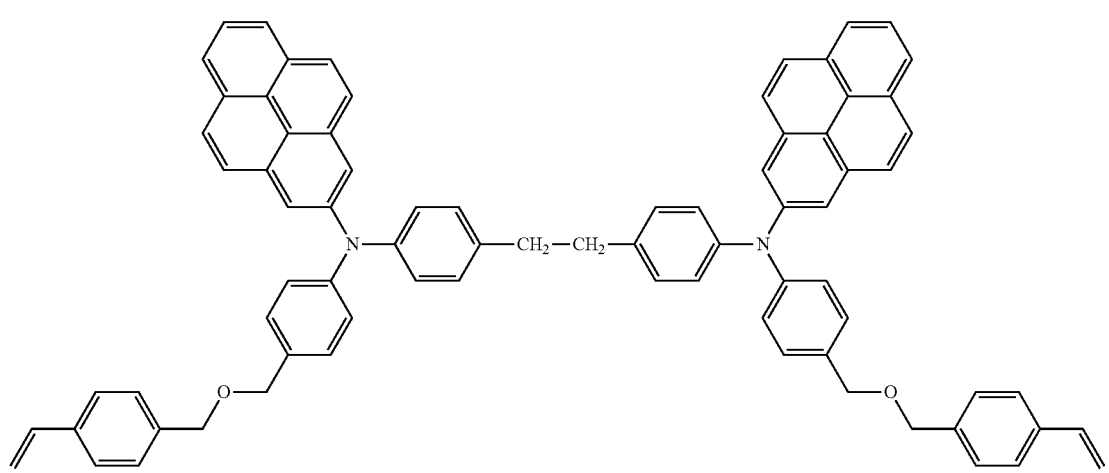
ii-9
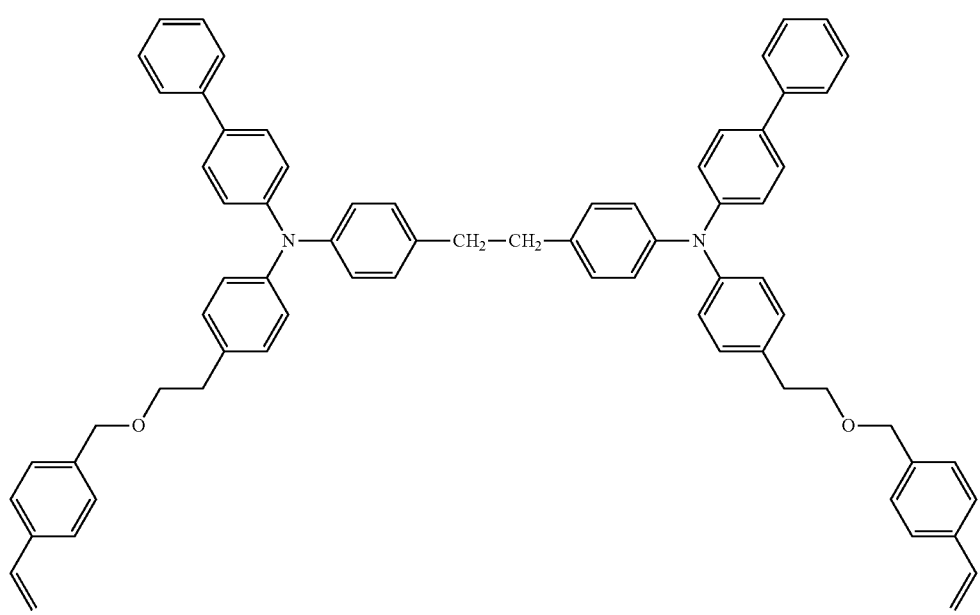

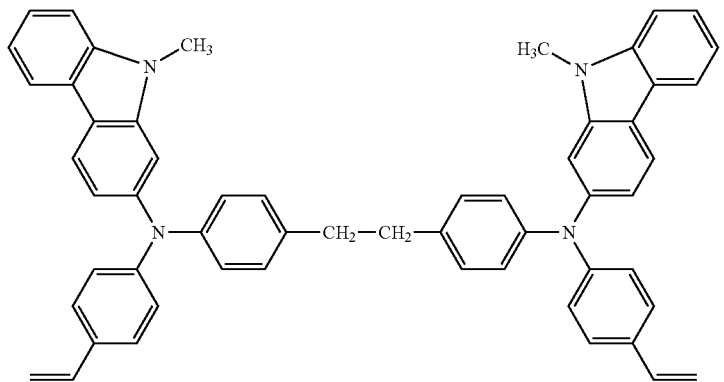
ii-10
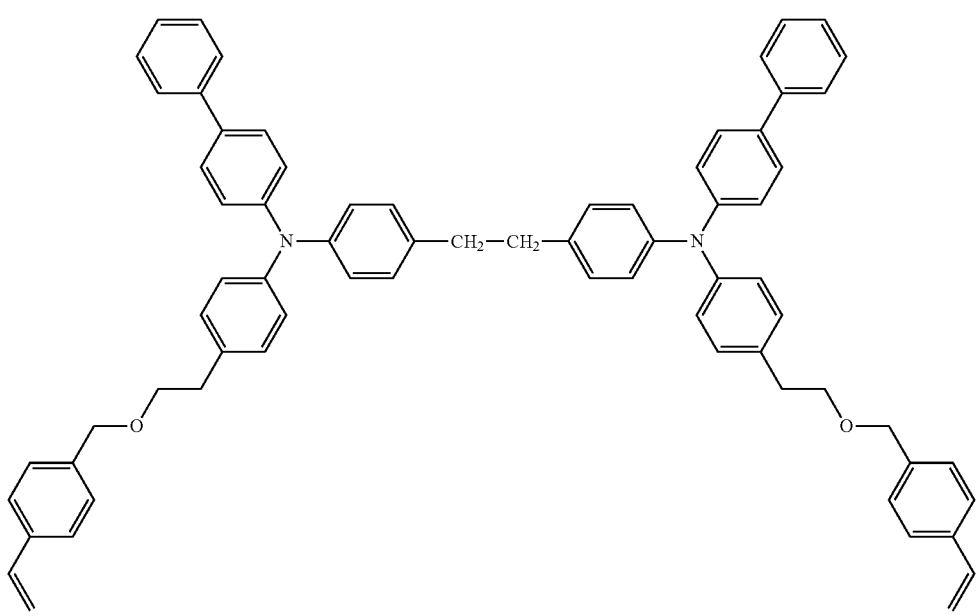
ii-11
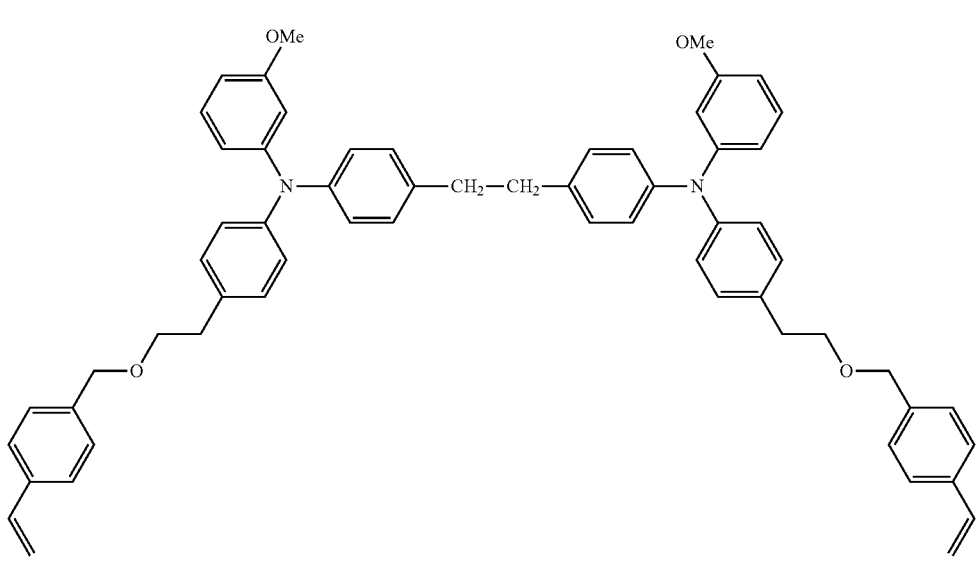
ii-12

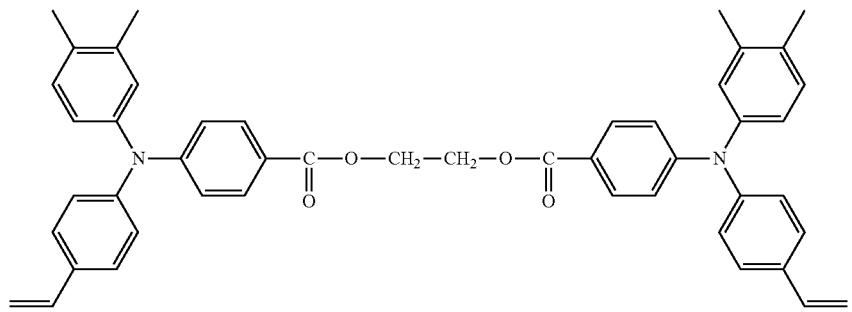
ii-13
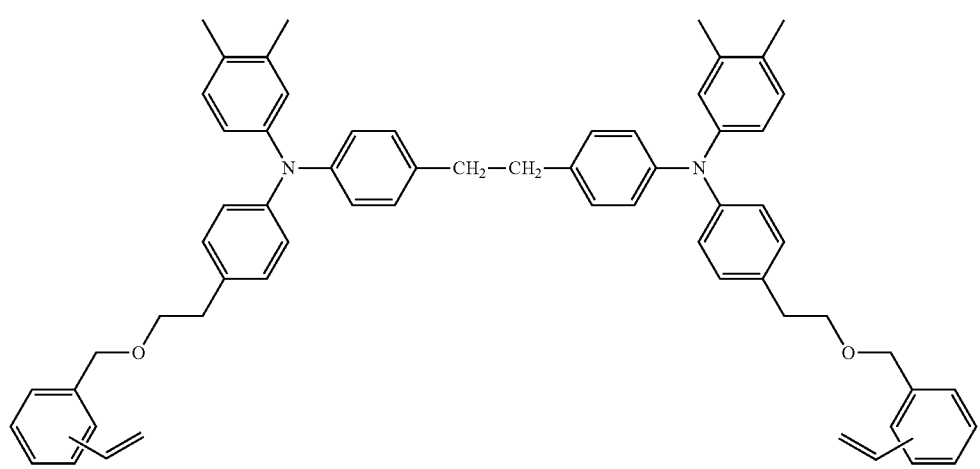
ii-14
m/p ≈ 50/50
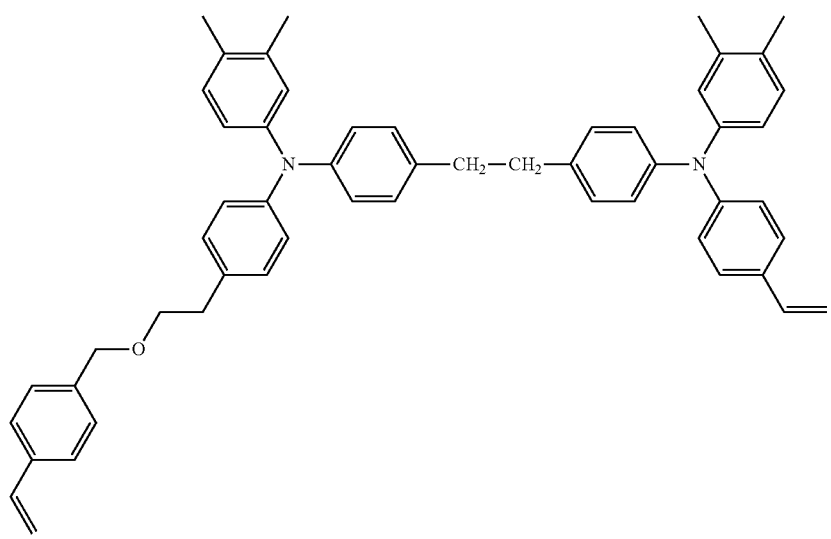
ii-15

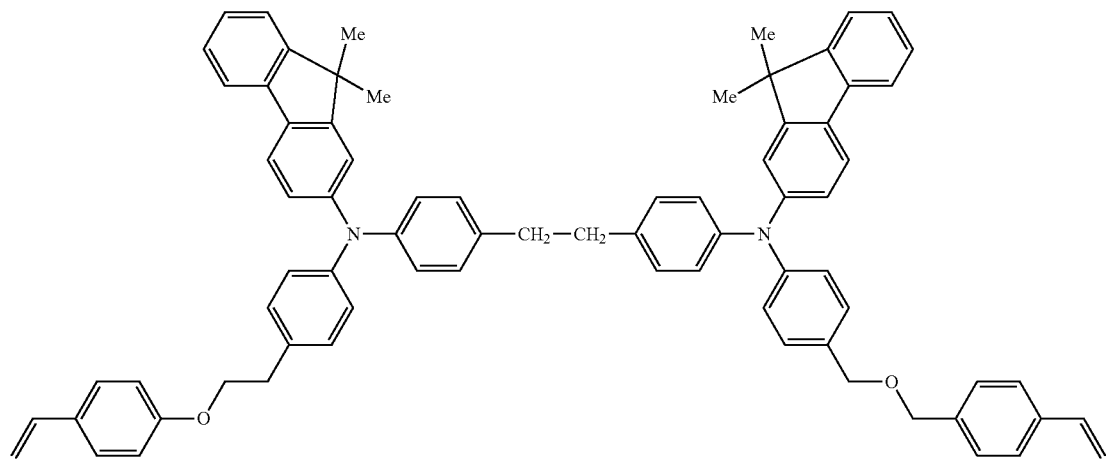
ii-16
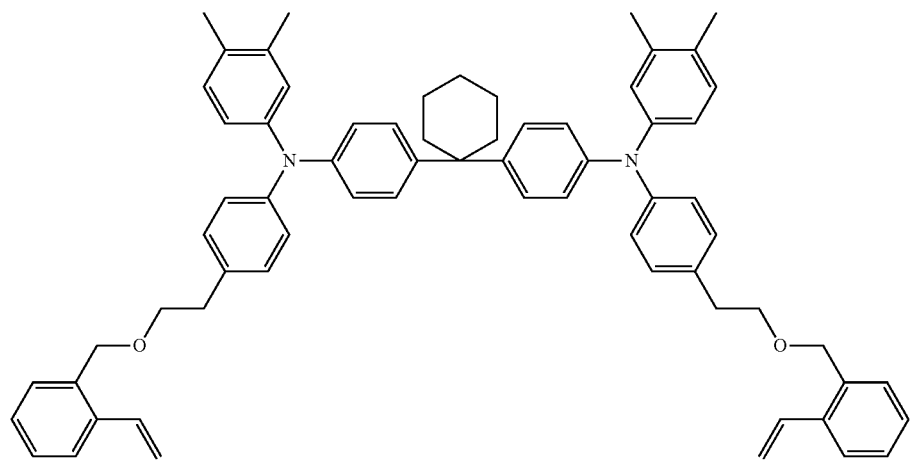
ii-17
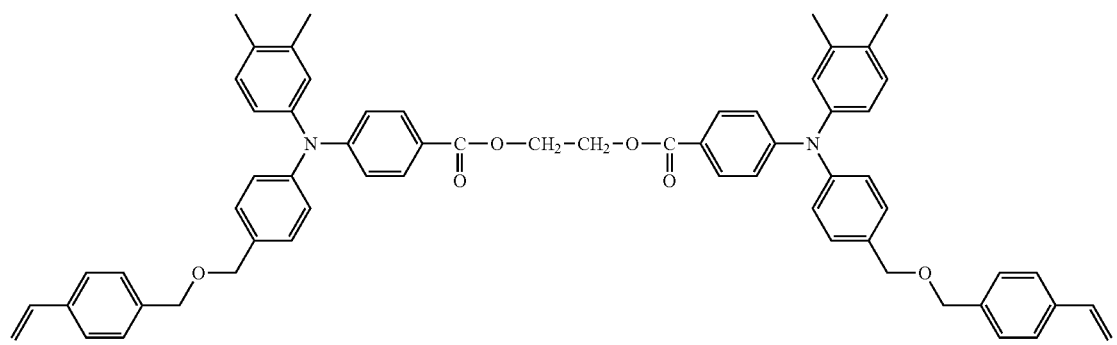
ii-18 ii-19
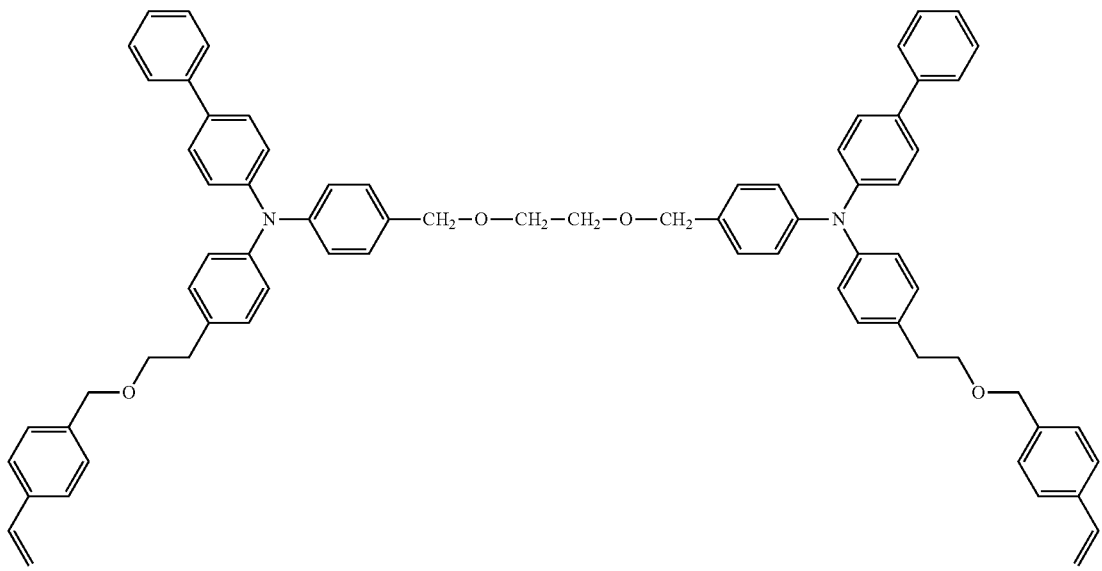
ii-20
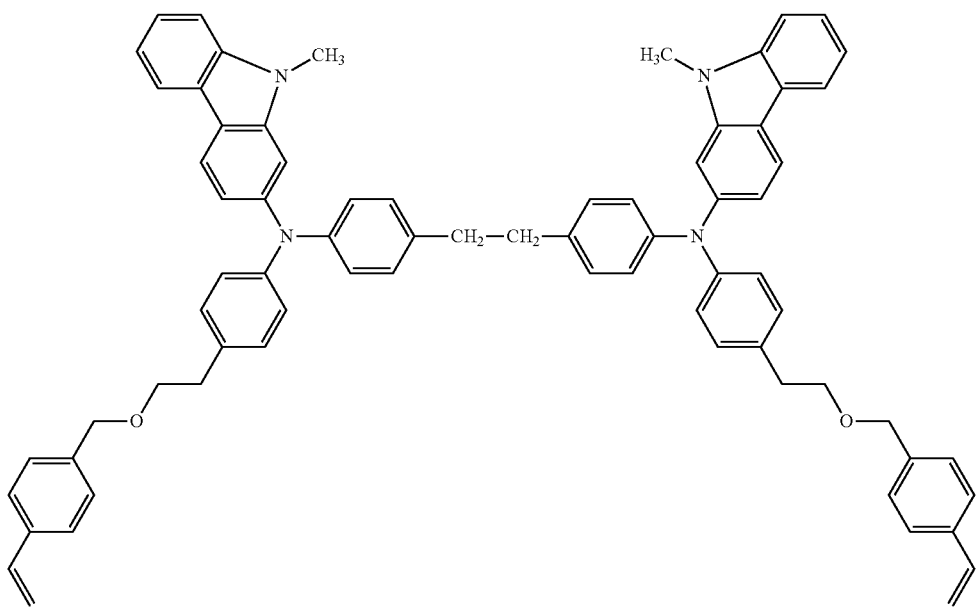
ii-21
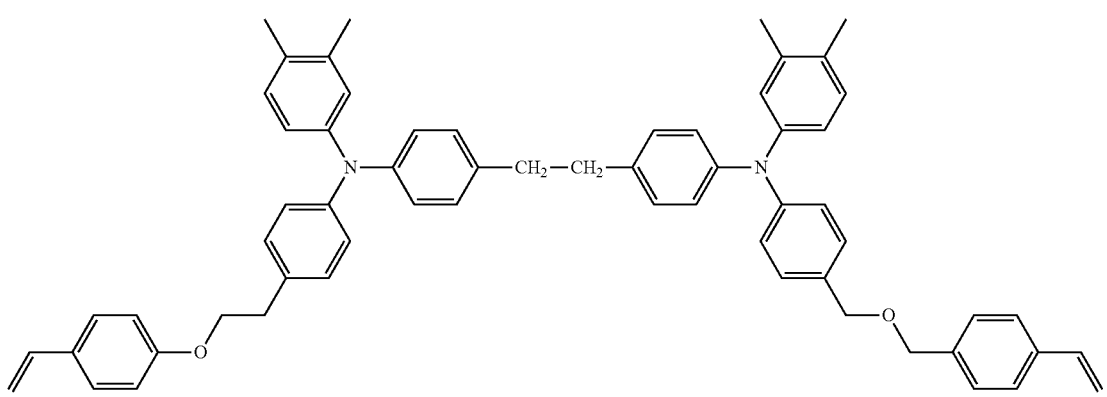

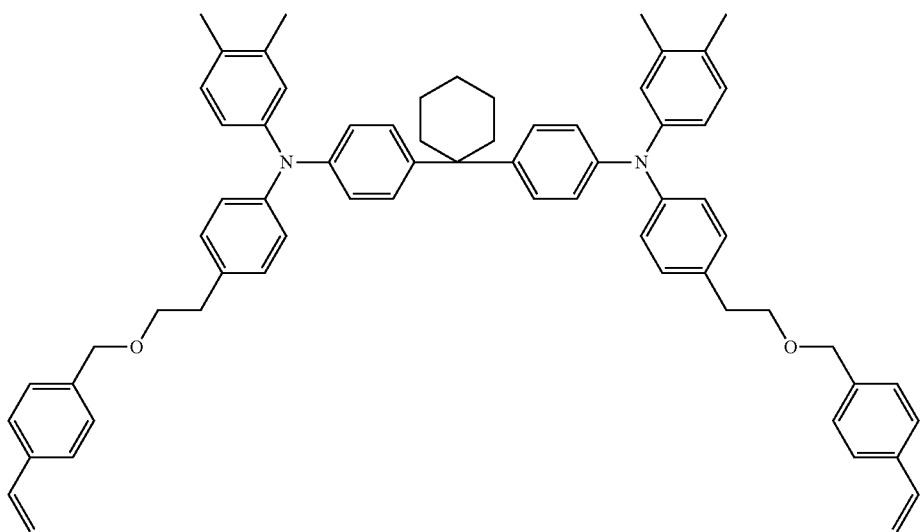
ii-22
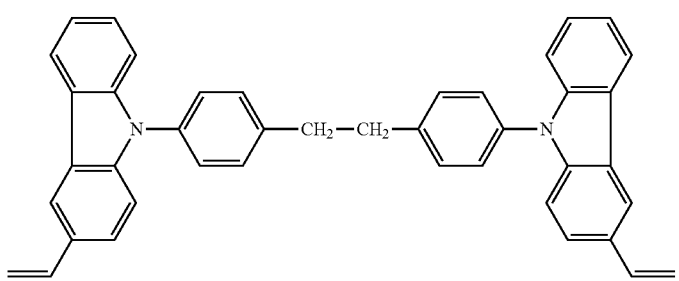
ii-23
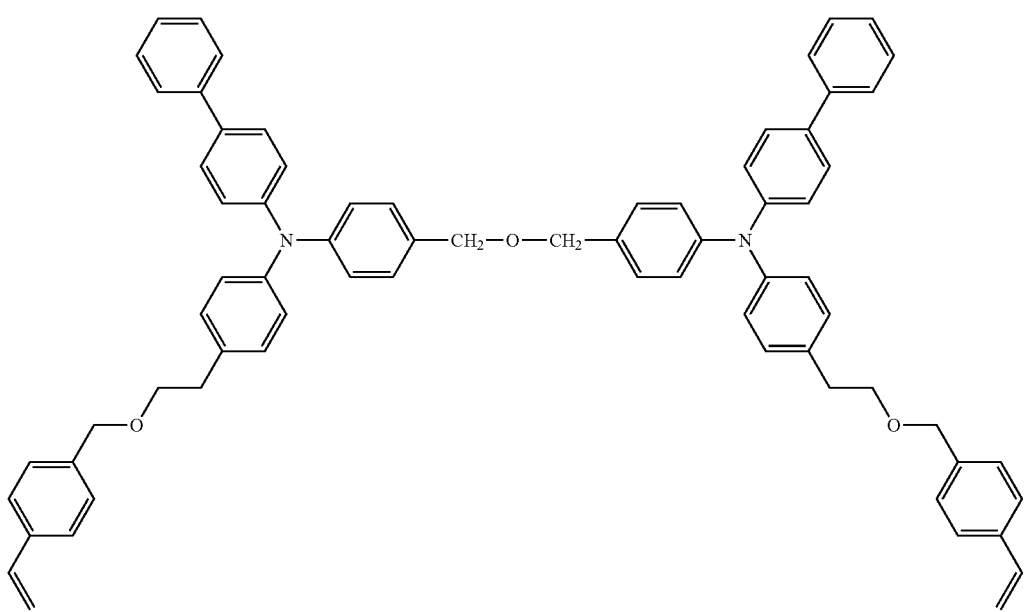
ii-24

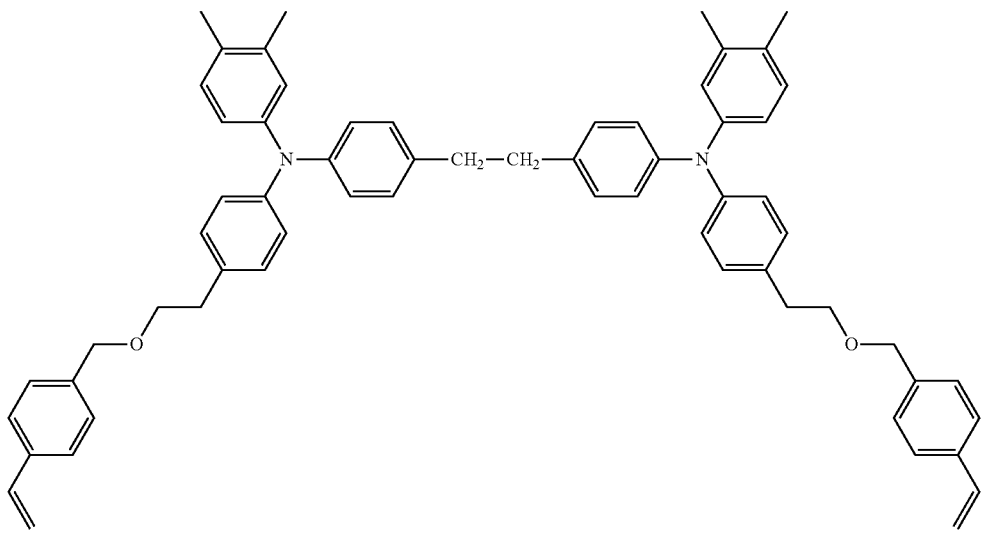
ii-25
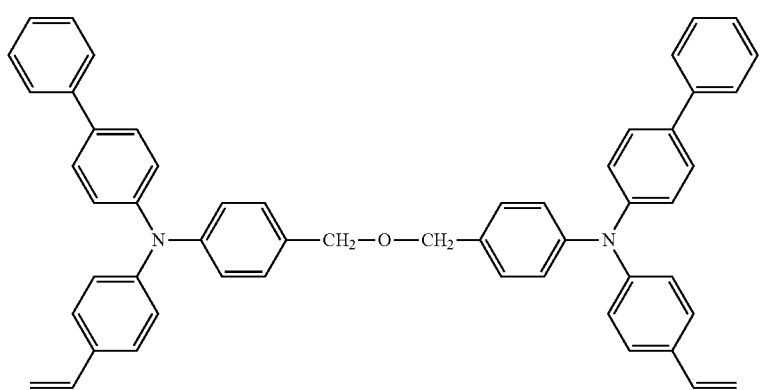
ii-26
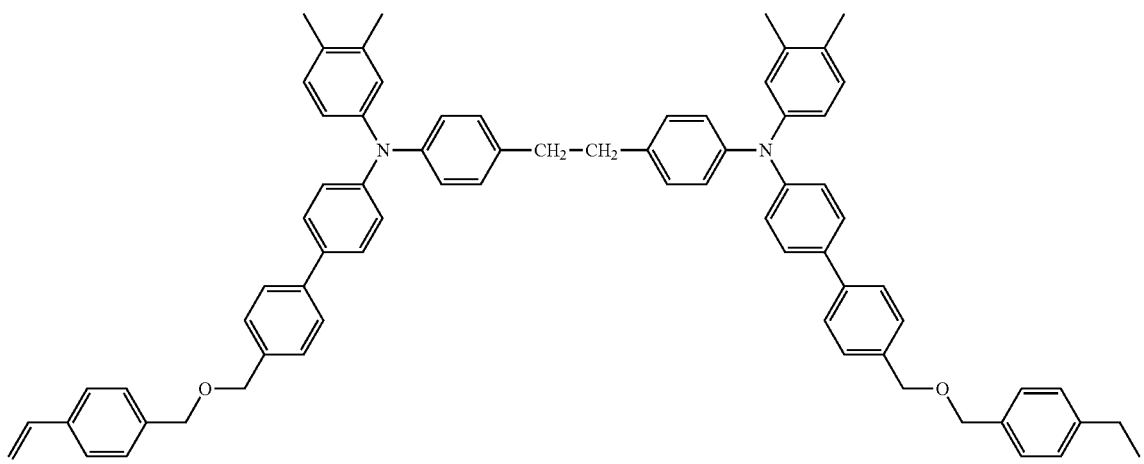
ii-27

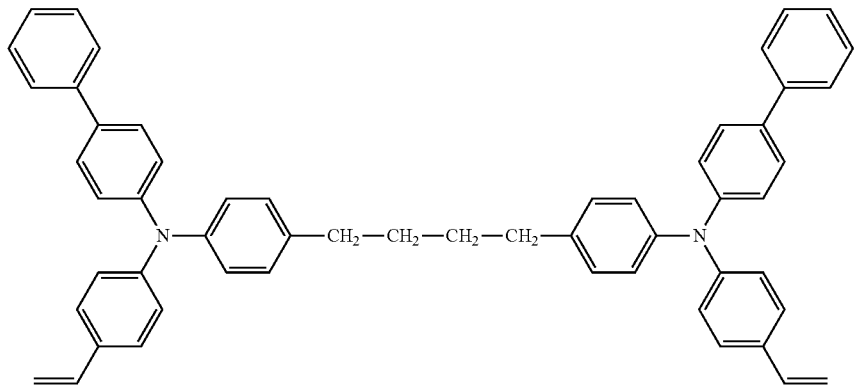
ii-28
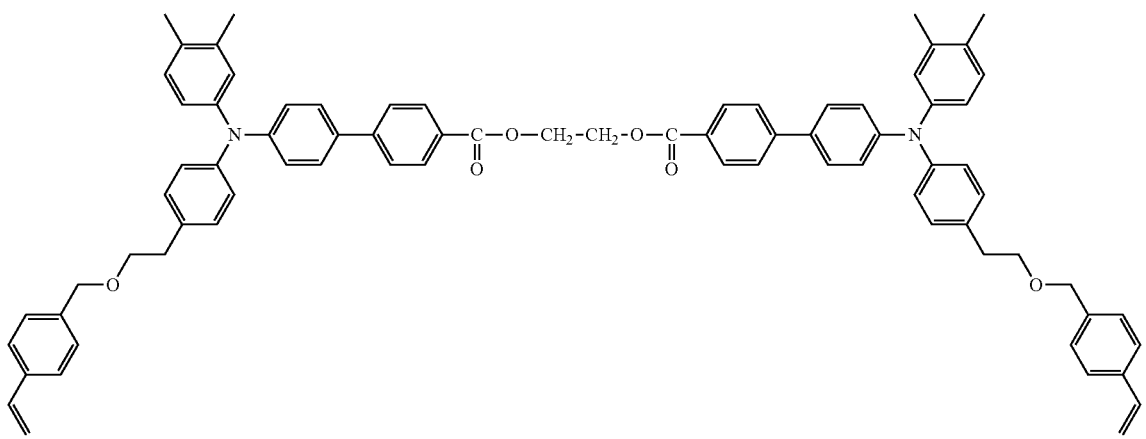
ii-29
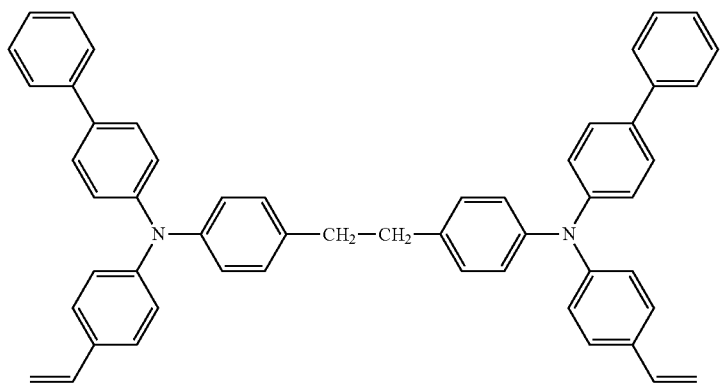
ii-30
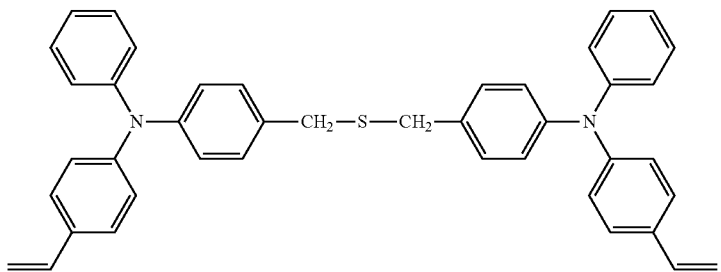
ii-31 ii-32
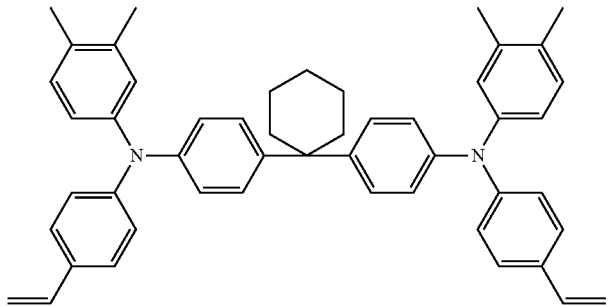
ii-33
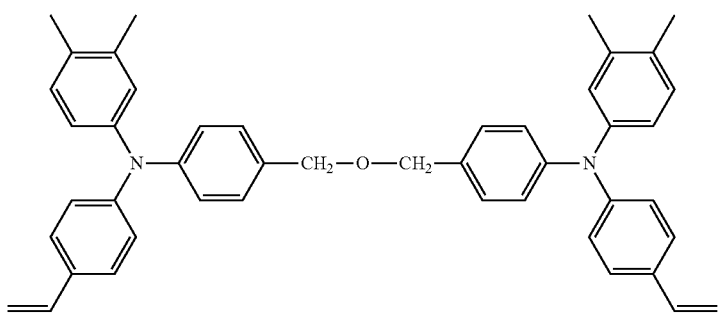
ii-34
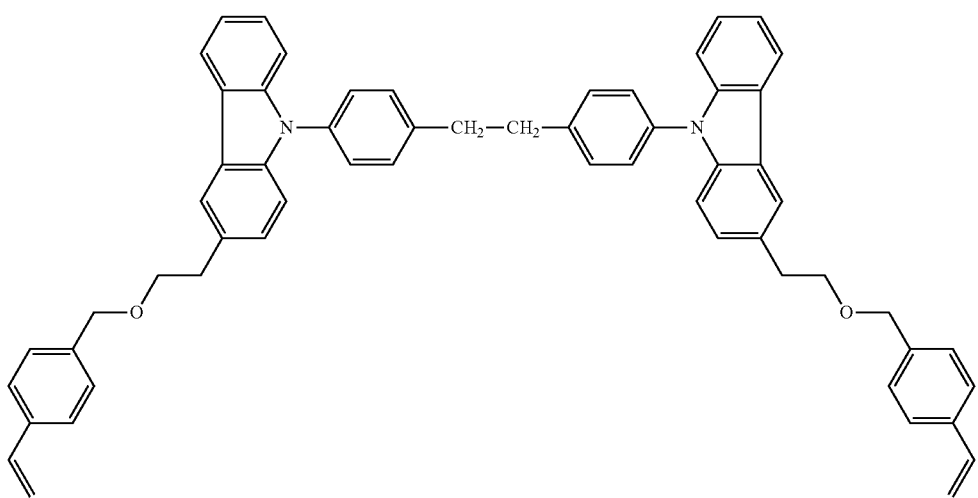

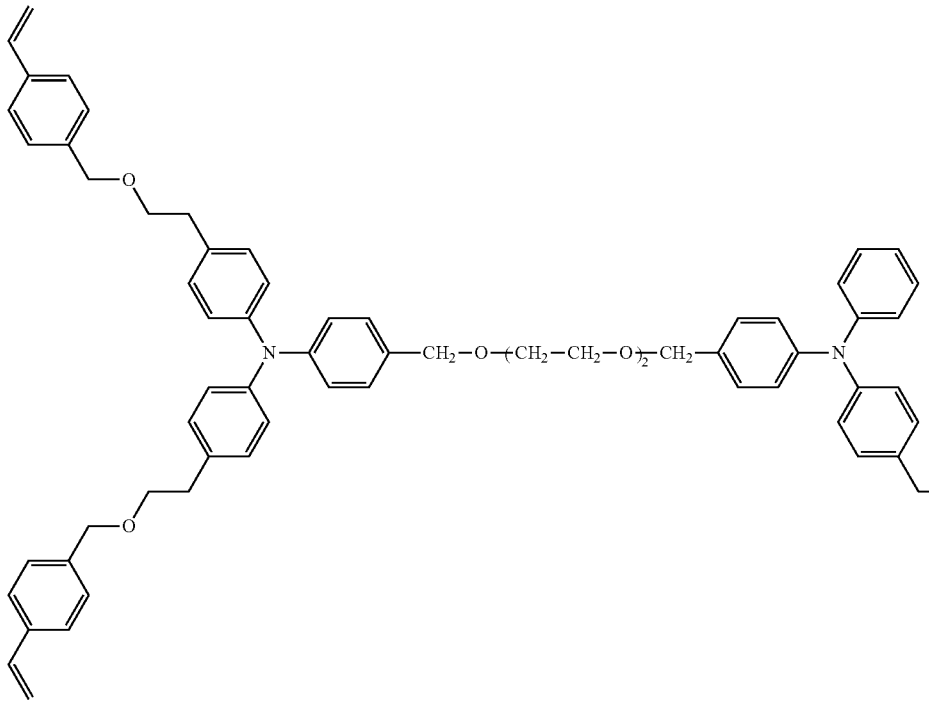
iii-1
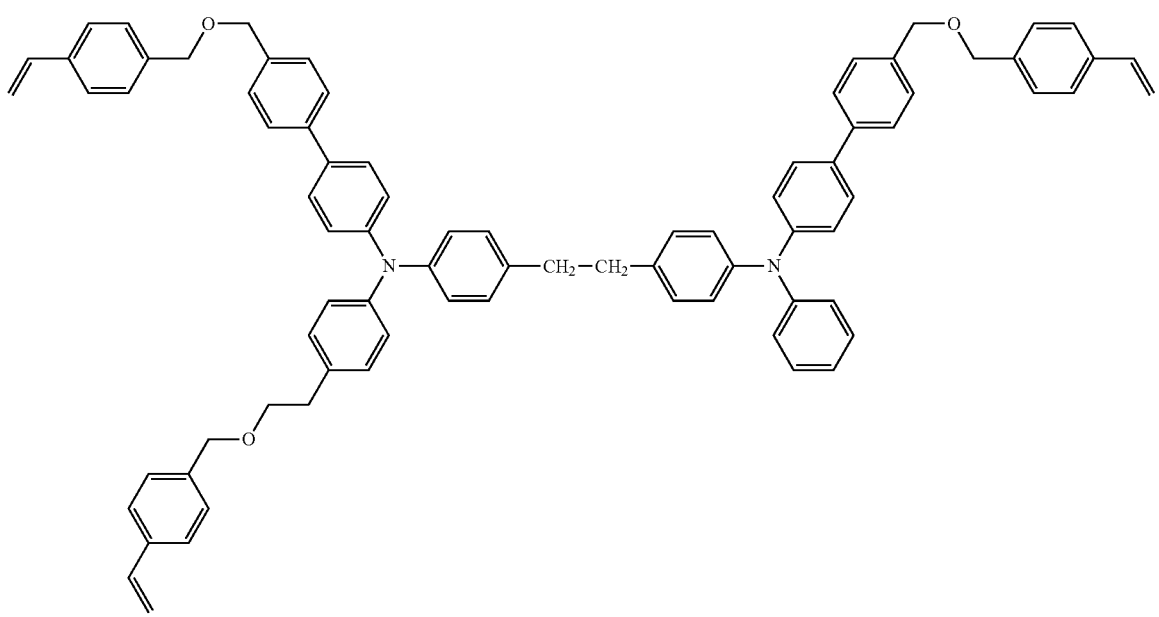
iii-2
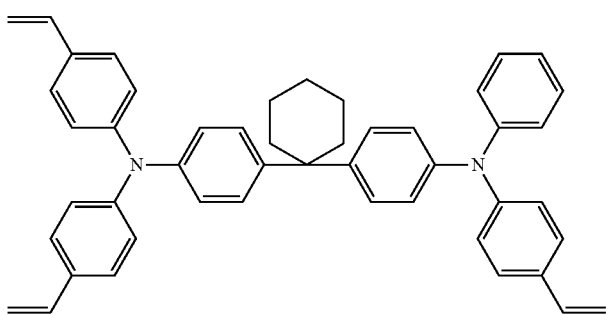
iii-3

-continued
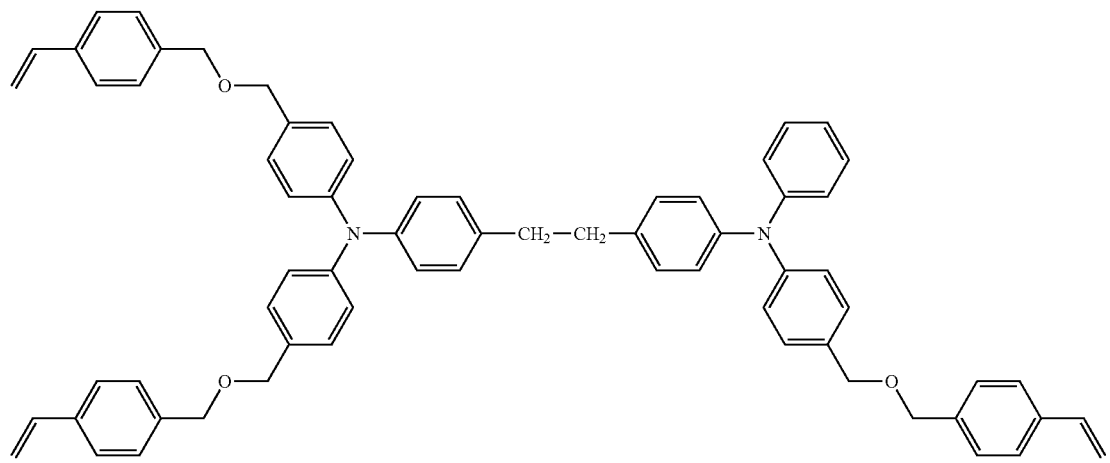
iii-4
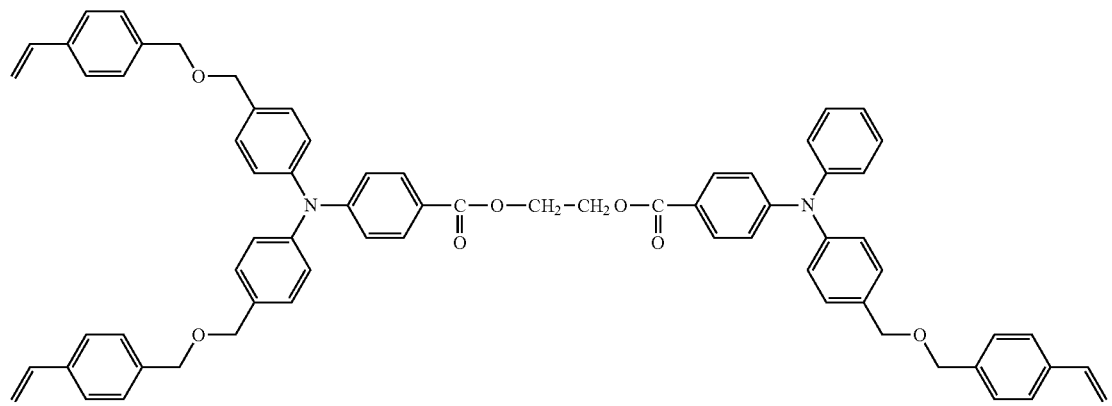
iii-5
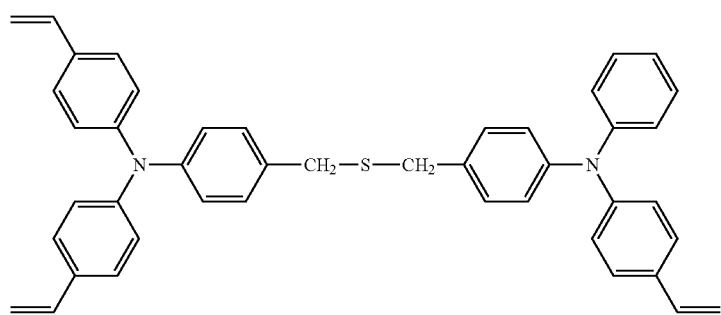
iii-6
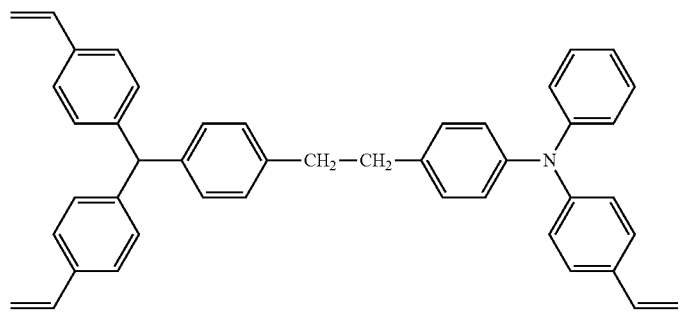
iii-7

-continued
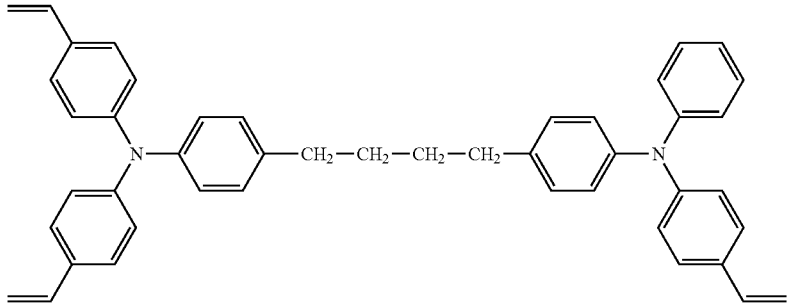
iii-8
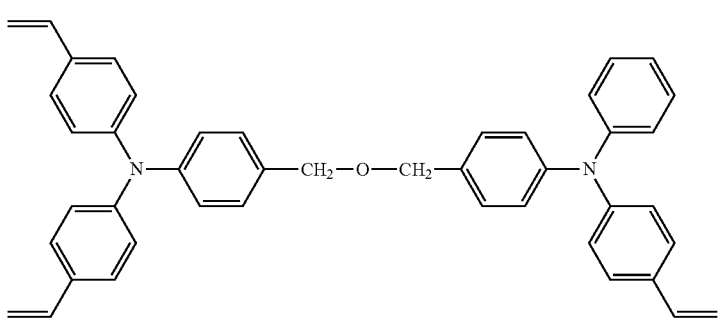
iii-9
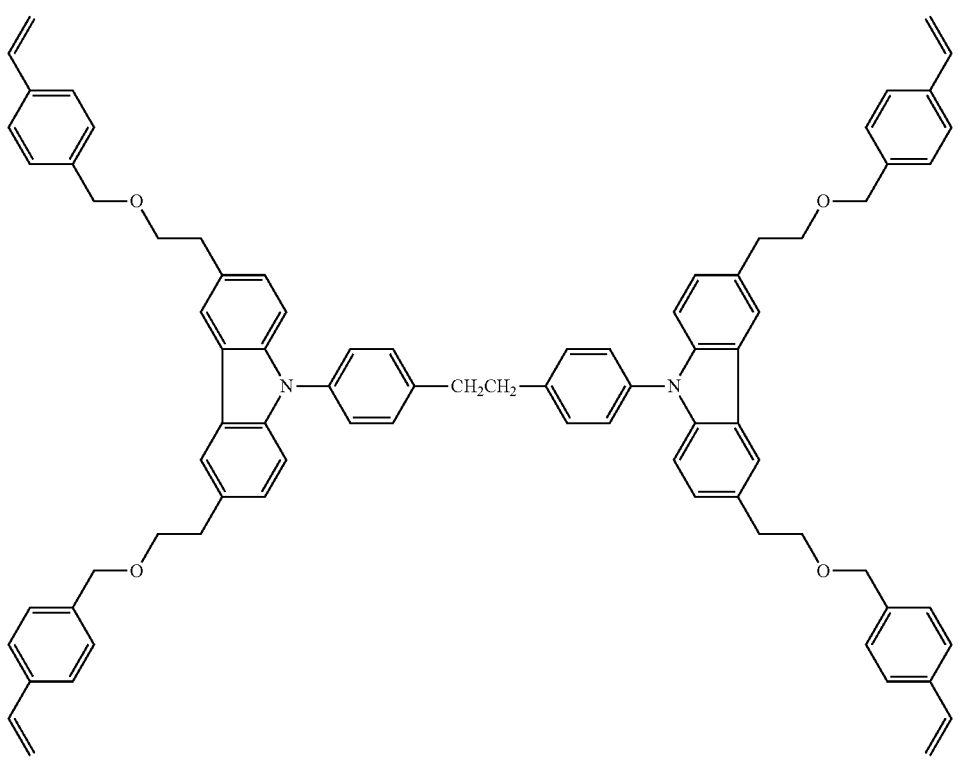
iv-1

-continued
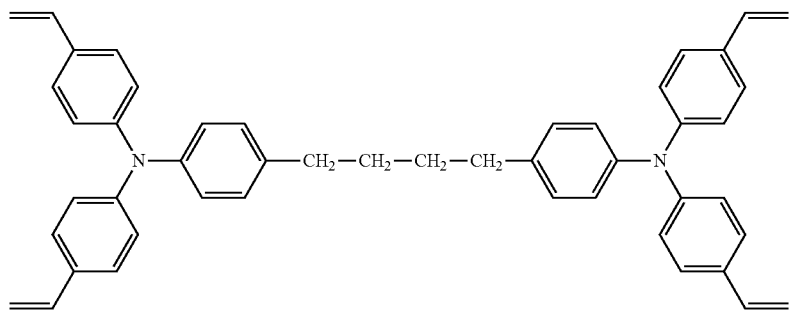
iv-2
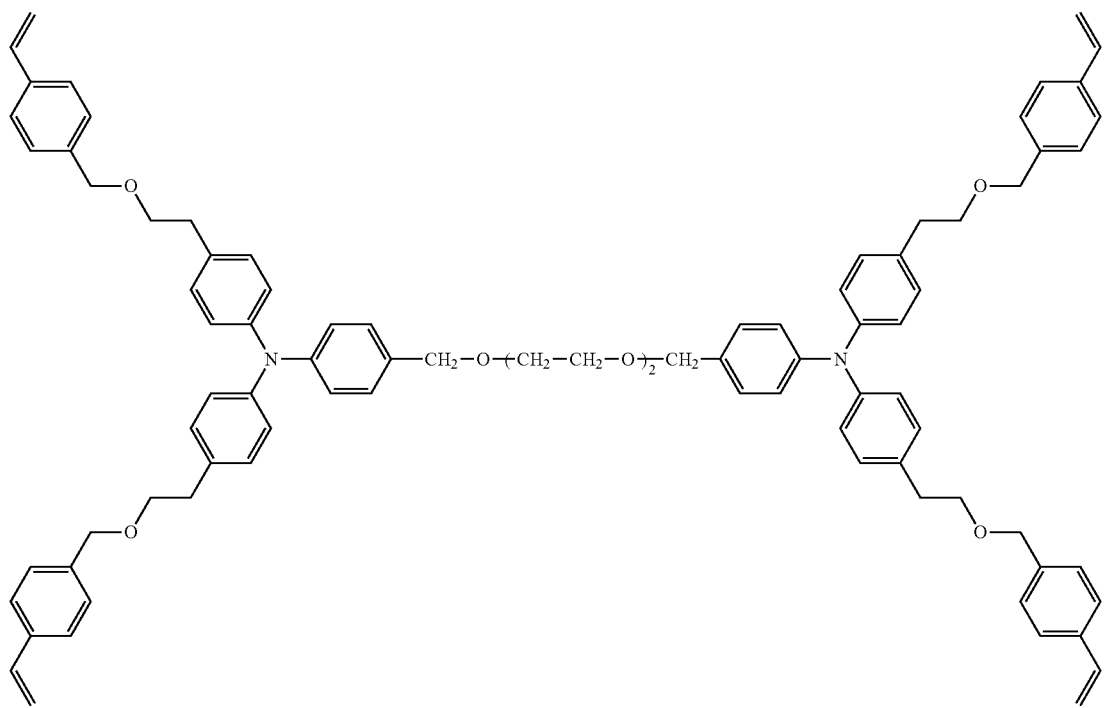
iv-3

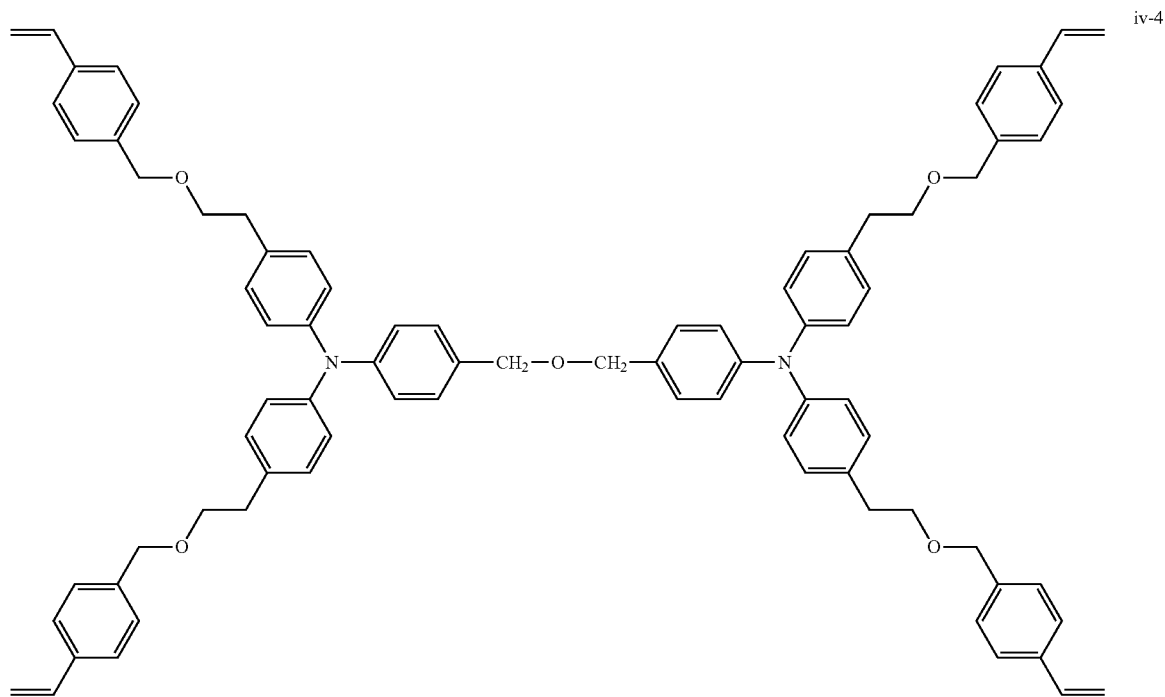
iv-4
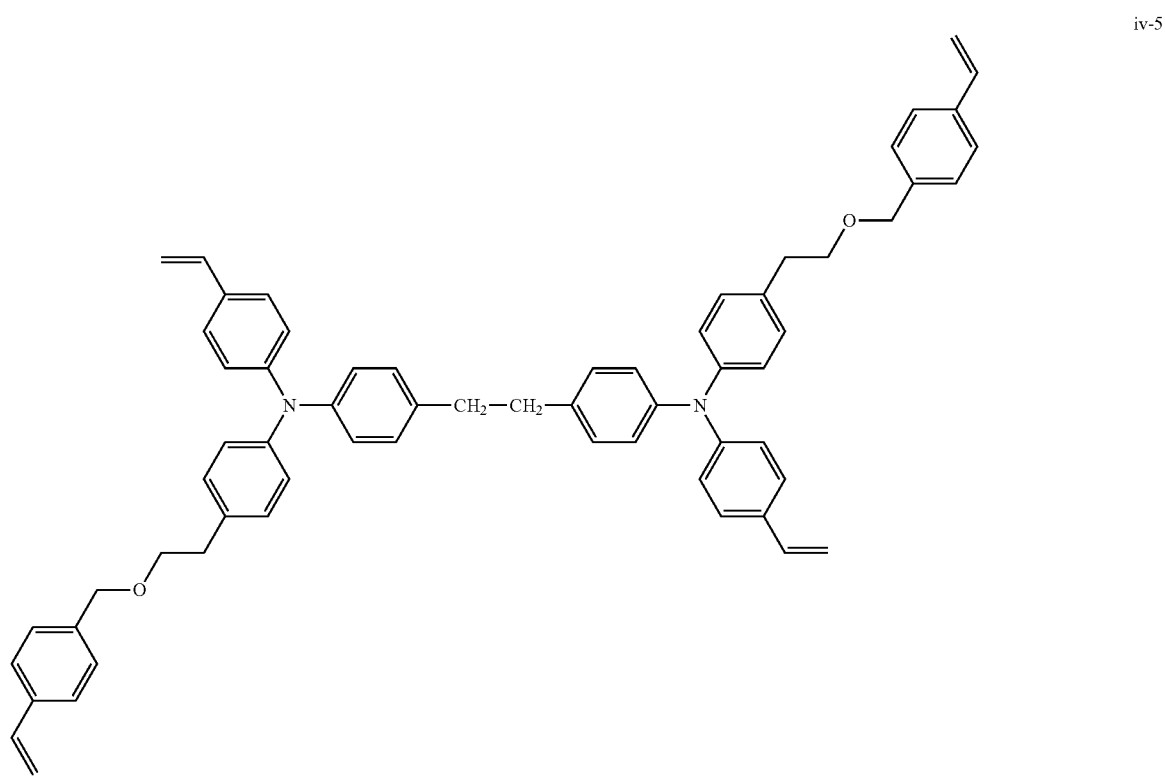
iv-5

-continued
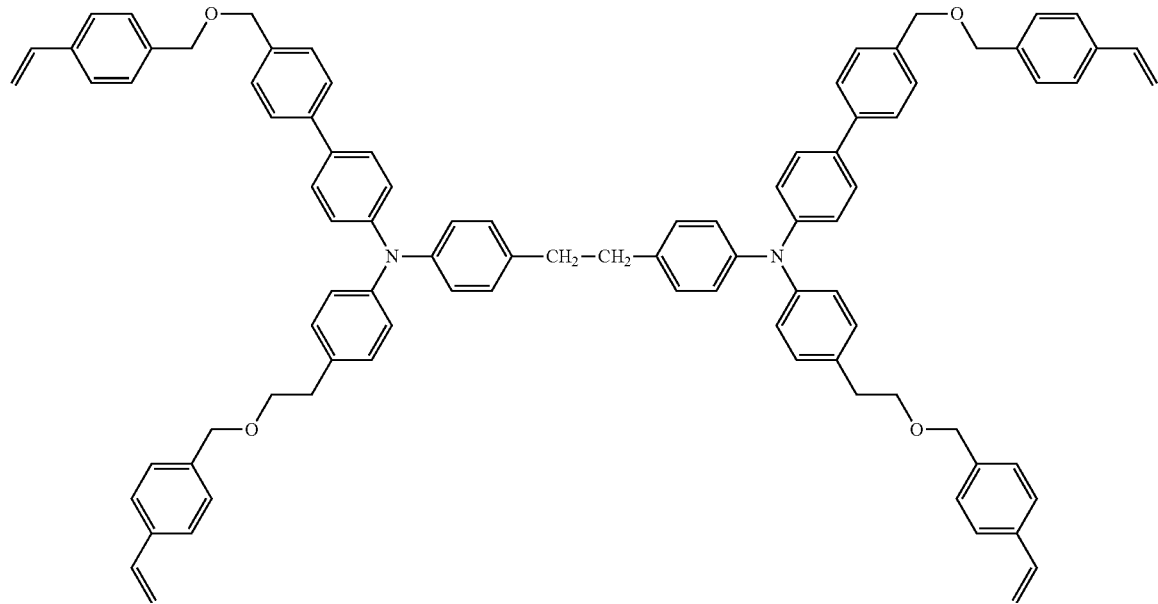
iv-6
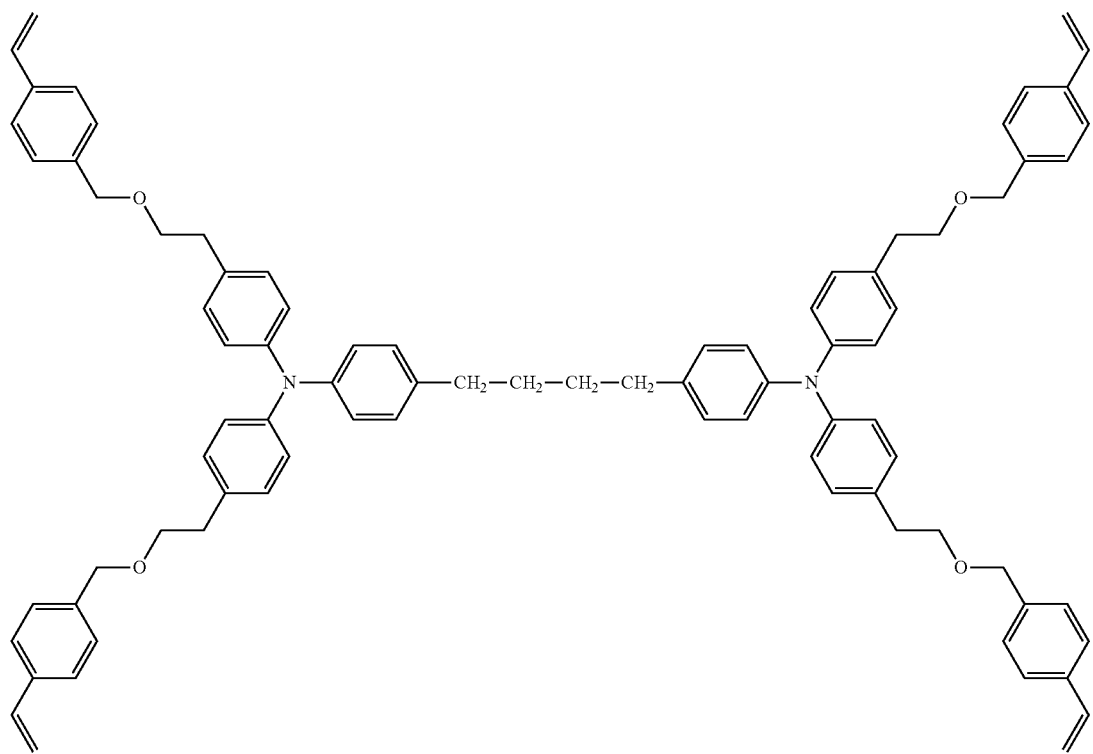
iv-7

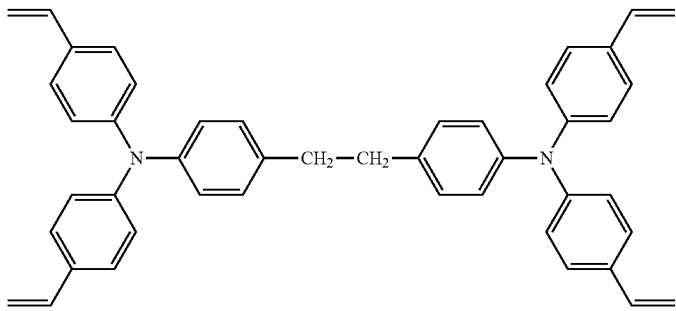
iv-8
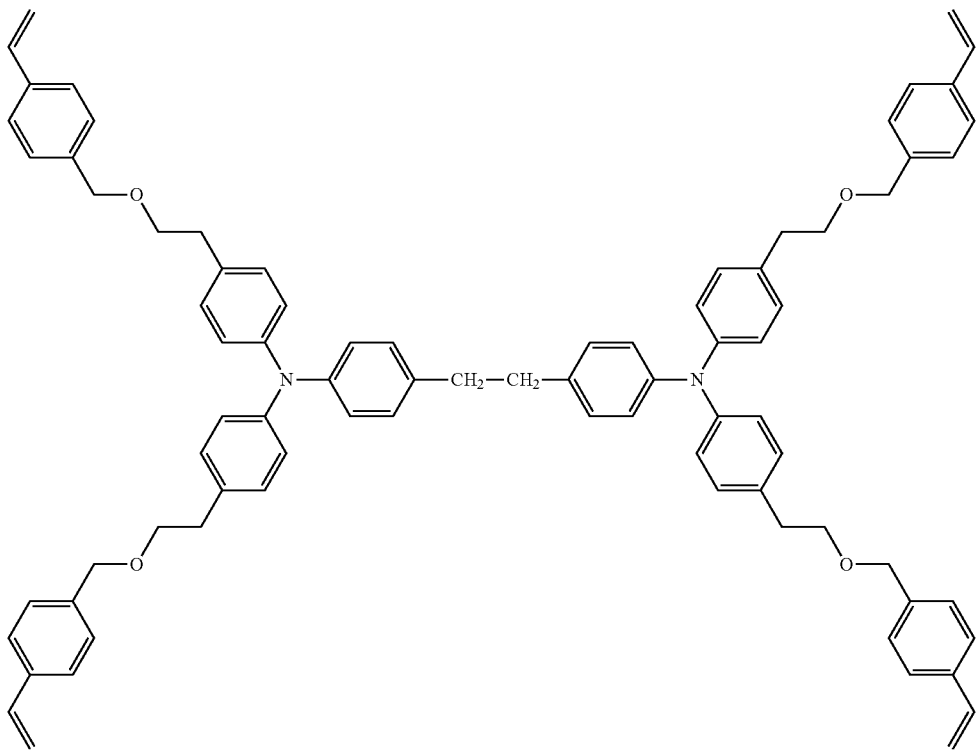
iv-9
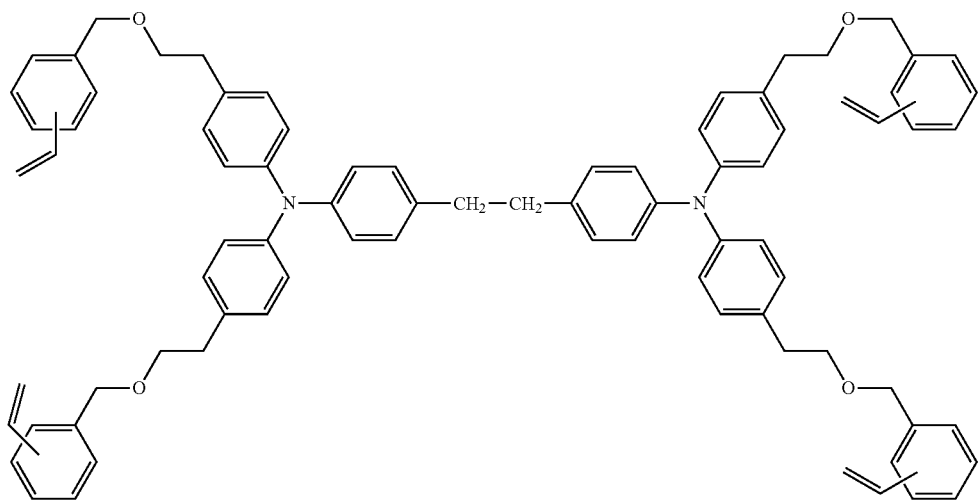
iv-10
m/p ≈ 50/50

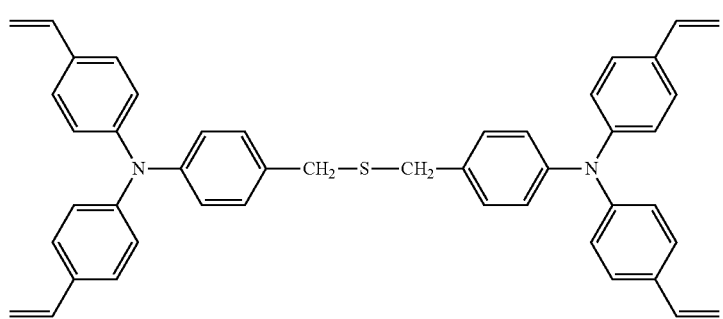
iv-11
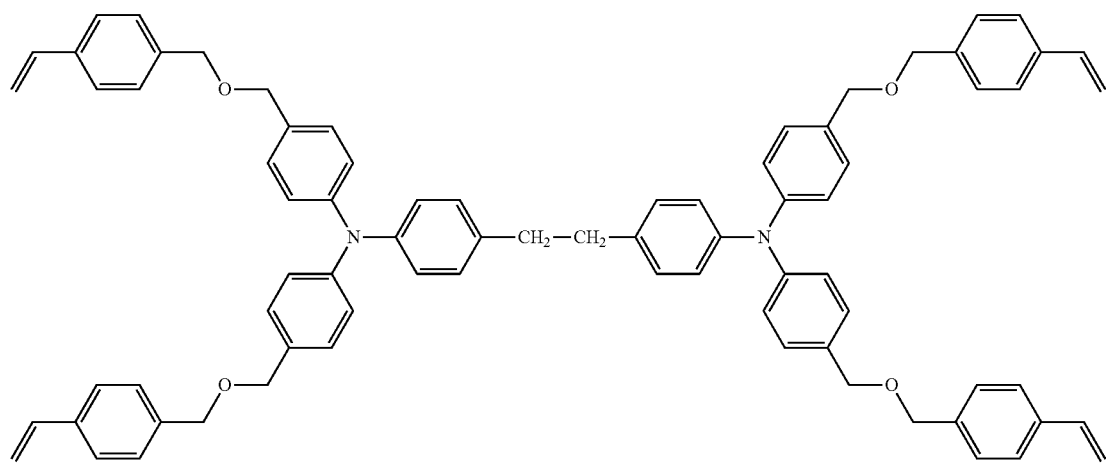
iv-12
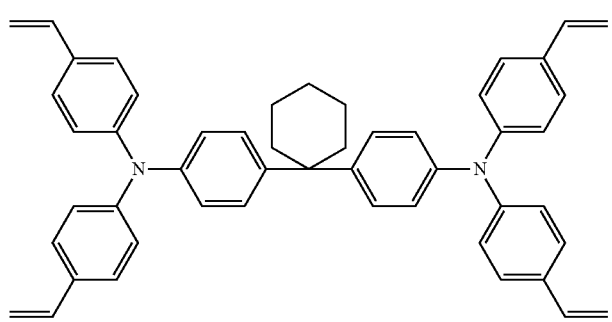
iv-13

-continued
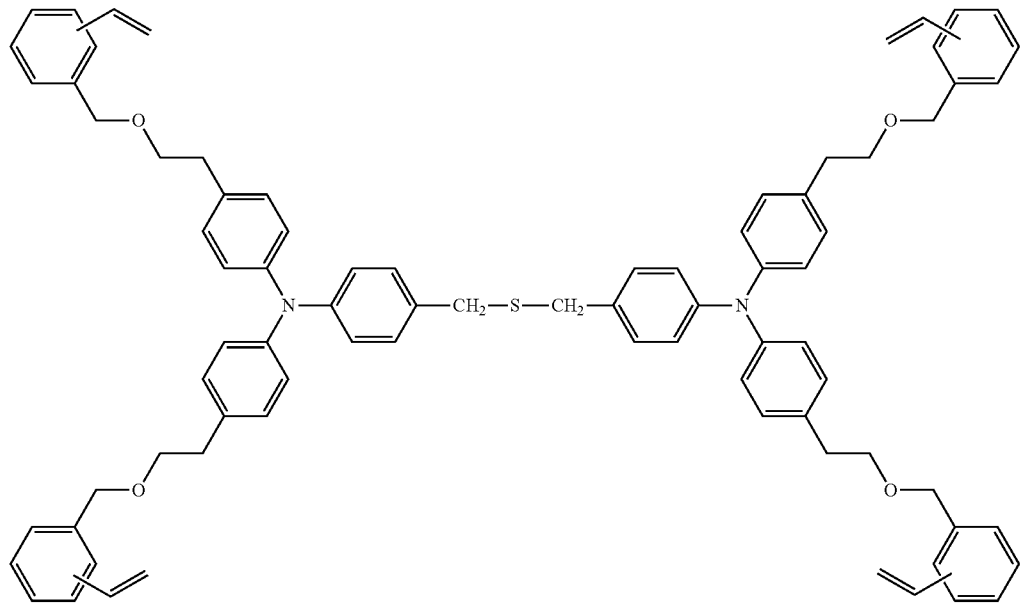
iv-14
m/p ≈ 50/50
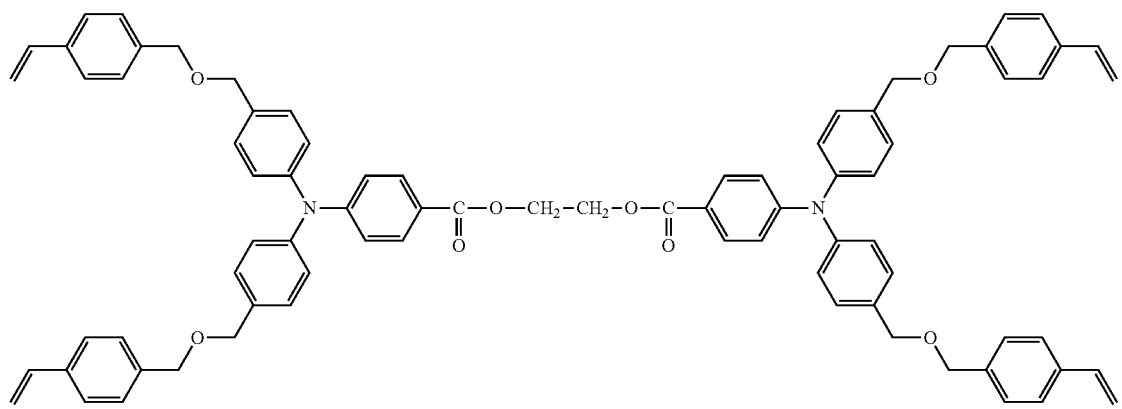
iv-15
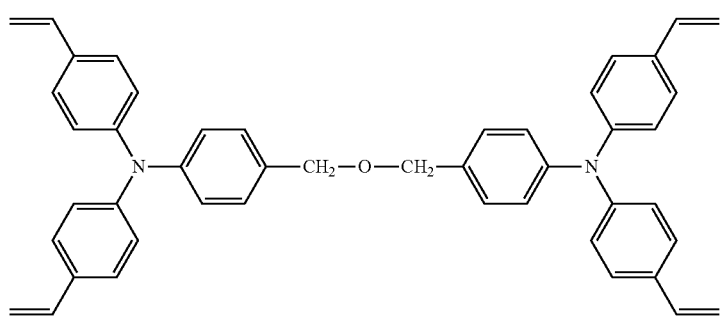
iv-16

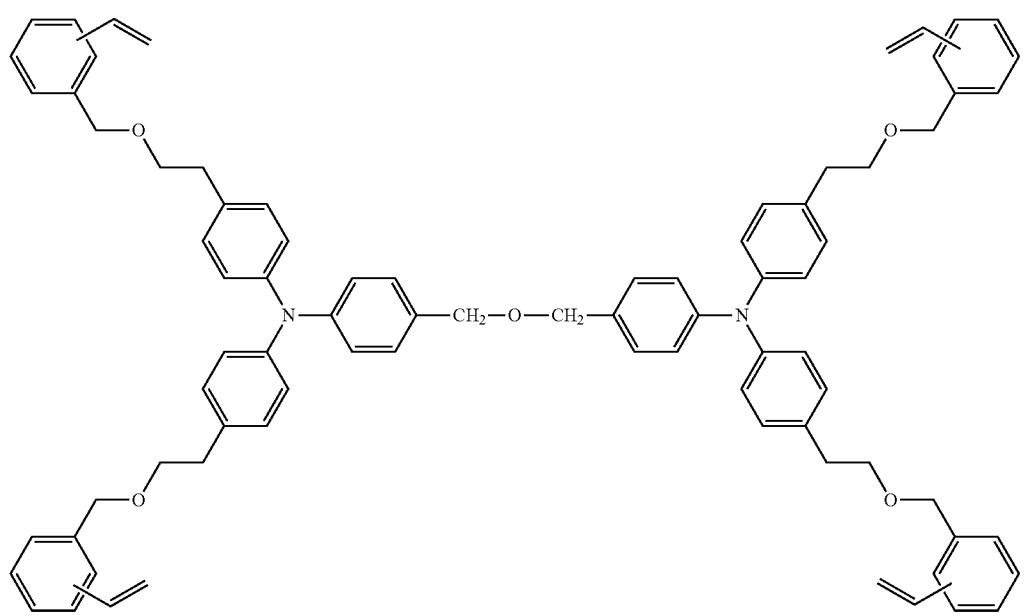
iv-17
m/p ≈ 50/50
30
Synthesis Method
Synthesis Pathway of Compound Represented by Formula ii-30
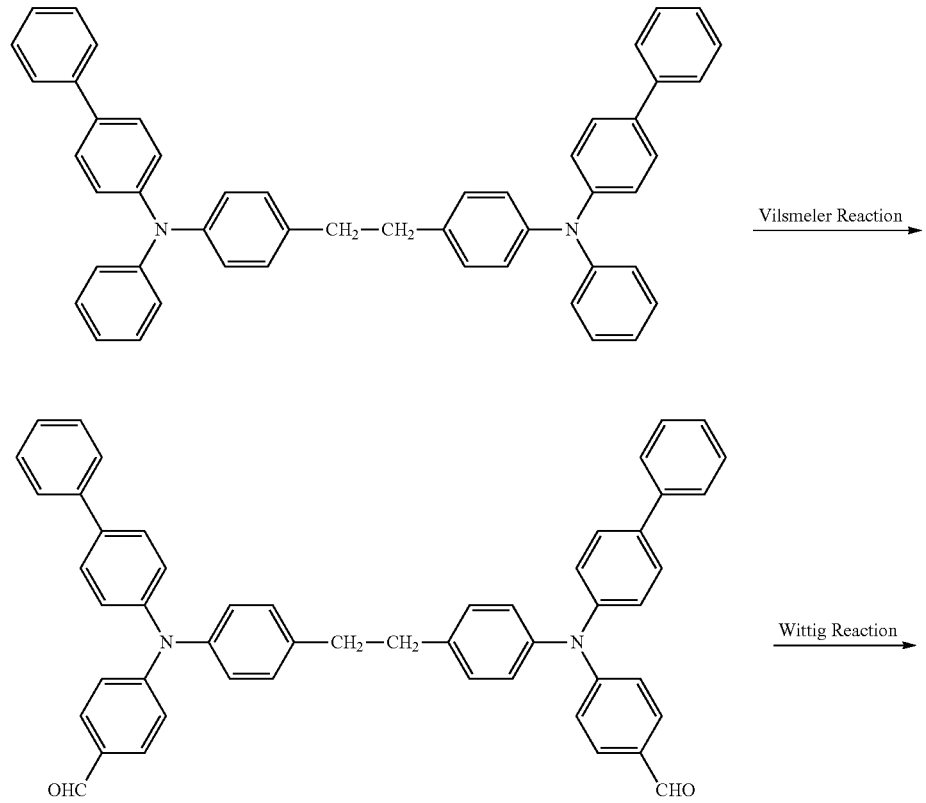

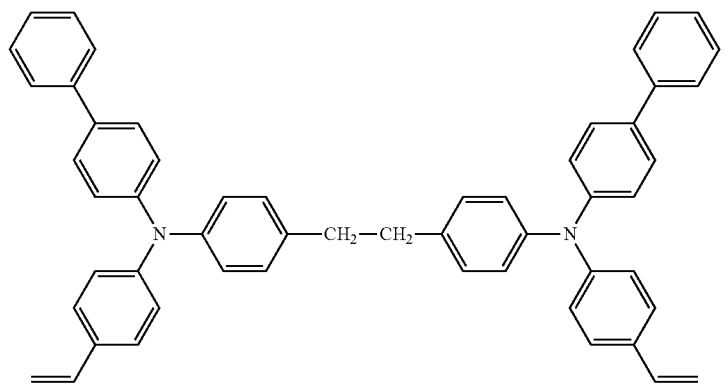
Synthesis Pathway of Compound Represented by Formula ii-2
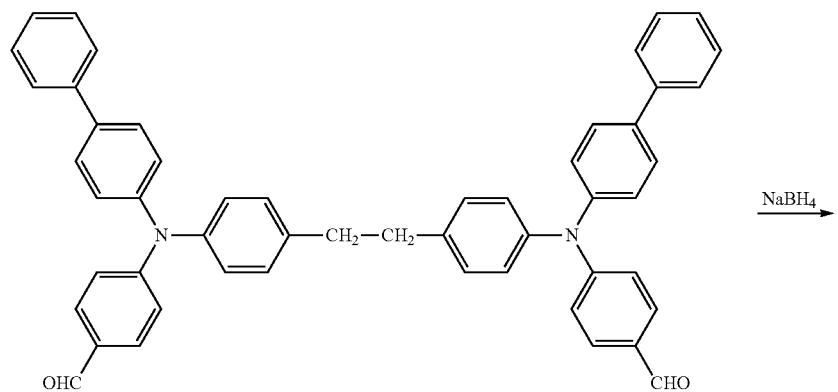
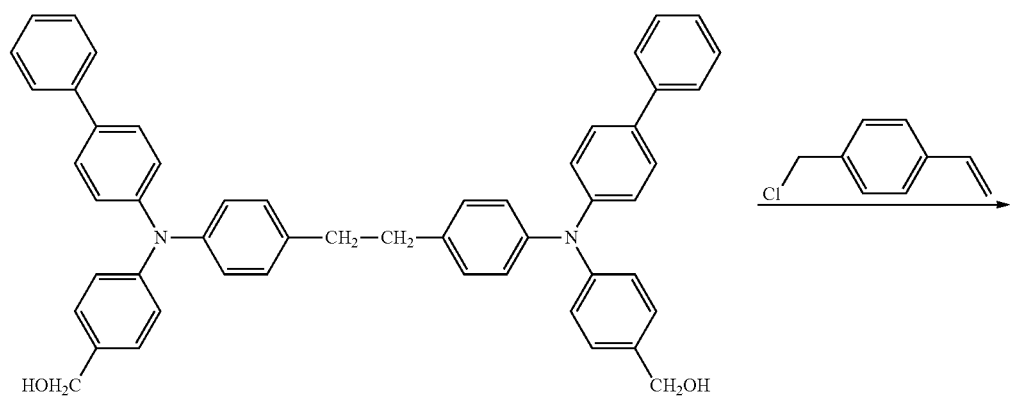

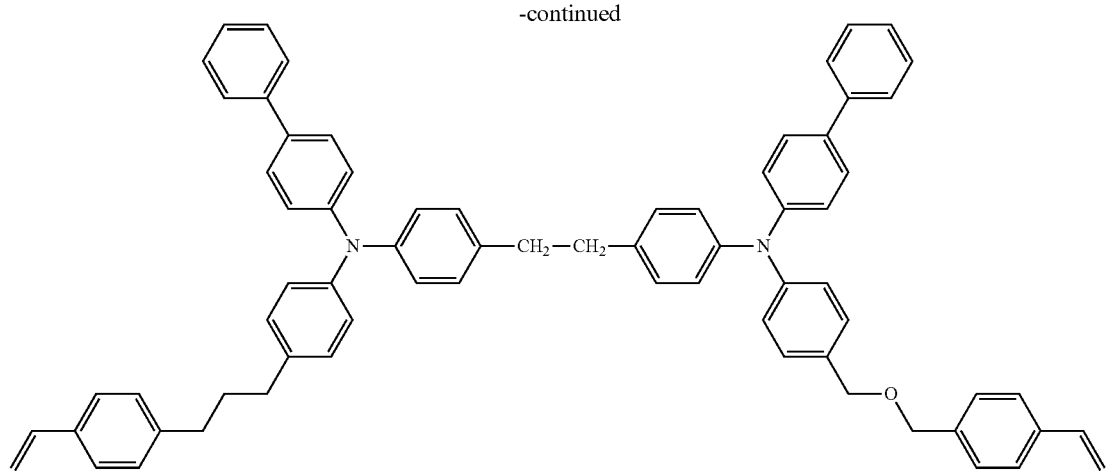

Regarding the compound used in this exemplary embodiment and represented by Formula (I), the strength of a hardened material may be adjusted without deteriorating the charge transportability by together using compounds having different function numbers of chain-polymerizable functional groups, that is, different values of n+n'.

Specifically, as the compound represented by Formula (III), a compound with the total number of D of 4 or more and a compound with the total number of D of from 1 to 3 may be together used to adjust the strength of the hardened material without deteriorating the charge transportability.

When two compounds are together used, the content of the compound with a total number of D of 4 or more may be set to the range of from 5% by mass to 95% by mass (preferably the range of from 20% by mass to 90% by mass) with respect to the total content of the compound represented by Formula (III).

The charge-transporting film according to this exemplary embodiment includes at least a polymer of the compound represented by Formula (I).

This polymer may be obtained by polymerizing the compound represented by Formula (I) through the use of energy of heat, light, electron beams, and the like.

The charge-transporting film including the polymer may be obtained by preparing a composition including the compound represented by Formula (I) and other components as needed and polymerizing (hardening) the composition through the use of energy of heat, light, electron beams, and the like.

Here, other components used to form the charge-transporting film may be appropriately selected depending on the applications of the charge-transporting film, and examples thereof include polymerizable compounds not having charge transportability, compounds having charge transportability but other than the compound represented by Formula (I), charge-transporting compounds not having a polymerizable property, and binder resins or surfactants used in a charge-transporting layer to be described later as compounds related to hardening and polymerization.

The content of the polymer of the compound represented by Formula (I) in the charge-transporting film according to this exemplary embodiment may be set on the basis of the charge transportability depending on the application of the charge-transporting film and may be generally set to the range of from 10% by mass to 100% by mass in the charge-transporting film (preferably the range of from 20% by mass to 100% by mass).

The charge-transporting film according to this exemplary embodiment may include the compound (non-reacted state) itself represented by Formula (I), in addition to the polymer of the compound represented by Formula (I).

Photoelectric Conversion Device

A photoelectric conversion device according to this exemplary embodiment includes the charge-transporting film according to this exemplary embodiment.

As described above, since the charge-transporting film according to this exemplary embodiment is excellent in both mechanical strength and charge transportability and is reduced in environmental dependency of the charge transportability, the deterioration in electrical characteristics is suppressed in spite of environmental variations.

Examples of the photoelectric conversion device according to this exemplary embodiment include an electrophotographic photoreceptor, an organic EL device, an organic thin film transistor, and an organic solar cell.

Specifically, for example, an organic EL device includes a pair of electrodes of which at least one is transparent or translucent and one or more organic compound layers interposed between the electrodes. The charge-transporting film according to this exemplary embodiment may be used as at least one layer of the organic compound layers and the layer structure is not particularly limited. Specifically, the charge-transporting film according to this exemplary embodiment may be used as a light-emitting layer, a hole-transporting layer, and a hole-injecting layer.

For example, an organic thin film transistor includes an organic semiconductor layer in contact with both the source electrode and the drain electrode disposed to face each other, a gate electrode separated from both the source electrode and the drain electrode, and an insulating layer disposed between the organic semiconductor layer and the gate electrode. The charge-transporting film according to this exemplary embodiment may be used as at least one layer of the organic semiconductor layer and the layer structure is not particularly limited.

Electrophotographic Photoreceptor

An electrophotographic photoreceptor according to this exemplary embodiment will be described.

The electrophotographic photoreceptor according to this exemplary embodiment includes the charge-transporting film according to this exemplary embodiment.

As described above, since the charge-transporting film according to this exemplary embodiment is excellent in both mechanical strength and charge transportability and is reduced in environmental dependency of the charge transportability, the deterioration in electrical characteristics in the electrophotographic photoreceptor employing the charge-transporting film is suppressed in spite of environmental variations. As a result, a stable image is obtained.

Particularly, when the charge-transporting film is used as the outermost surface layer of the electrophotographic photoreceptor, the mechanical strength thereof is enhanced and thus the deterioration in electrical characteristics is suppressed in spite of long-term repeated use. As a result, stable images may be successively obtained.

The electrophotographic photoreceptor according to this exemplary embodiment includes the charge-transporting film according to this exemplary embodiment, and the charge-transporting film may be used as any of the outermost surface layer and layers other than the outermost surface layer but is preferably used as the outermost surface layer, as described above, in that it is excellent in both mechanical strength and charge transportability and the environmental dependency of the charge transportability is reduced.

Here, the outermost surface layer constitutes the top surface of the electrophotographic photoreceptor itself and is preferably provided as a protective layer or a charge-transporting layer.

When the outermost surface layer is a protective layer, for example, the electrophotographic photoreceptor includes a photosensitive layer and a protective layer as the outermost surface layer on an electroconductive substrate and the protective layer is formed of the charge-transporting film.

On the other hand, when the outermost surface layer is a charge-transporting layer, for example, the electrophotographic photoreceptor includes a charge-generating layer and a charge-transporting layer as the outermost surface layer on an electroconductive substrate and the charge-transporting layer is formed of the charge-transporting film.

When the charge-transporting film constitutes a layer other than the outermost surface layer, the electrophotographic photoreceptor includes a photosensitive layer having a charge-generating layer and an outermost surface layer and additionally includes a protective layer as the outermost surface layer on the photosensitive layer, and the charge-transporting layer is formed of the charge-transporting film.

The electrophotographic photoreceptor according to this exemplary embodiment when the charge-transporting film is a protective layer which is the outermost surface layer will be described in detail below with reference to the accompanying drawings. In the drawings, like or corresponding elements are referenced by like reference signs and the description thereof is not repeated.

FIG. 1 is a sectional view schematically illustrating an electrophotographic photoreceptor according to an exemplary embodiment of the invention.

Figure 2:
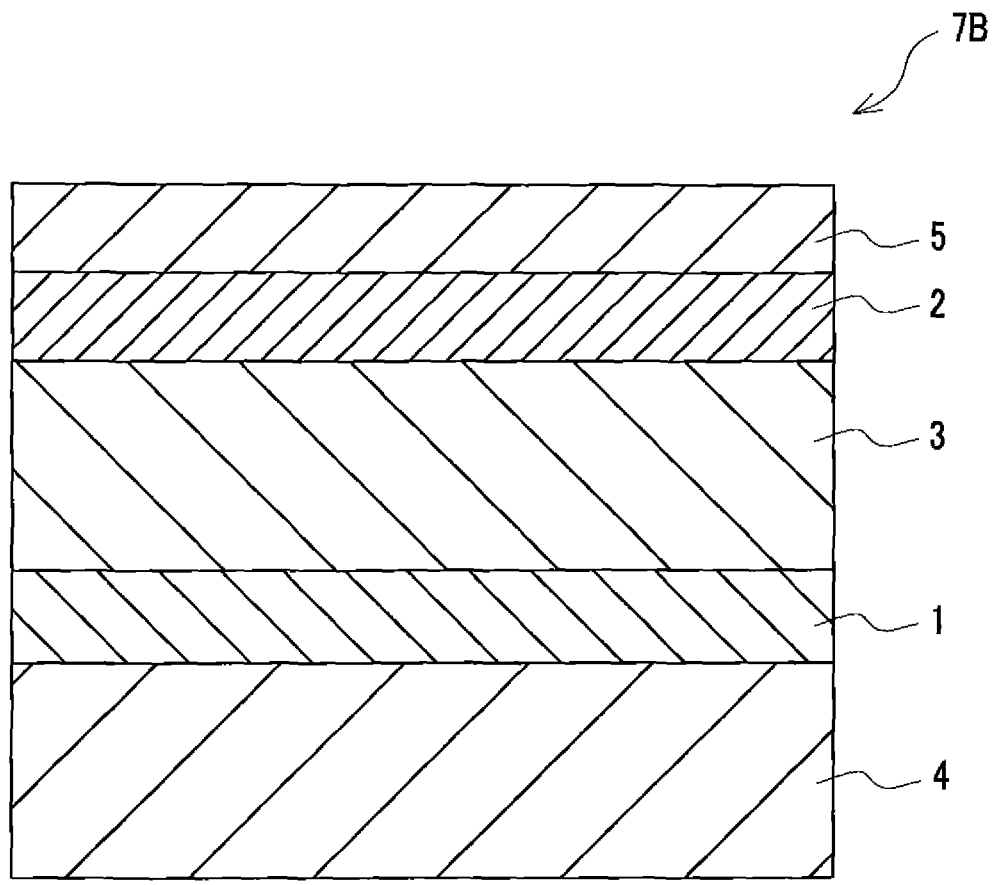
FIG. 2 is a partial sectional view schematically illustrating an electrophotographic photoreceptor according to another exemplary embodiment of the invention.
Figure 3:
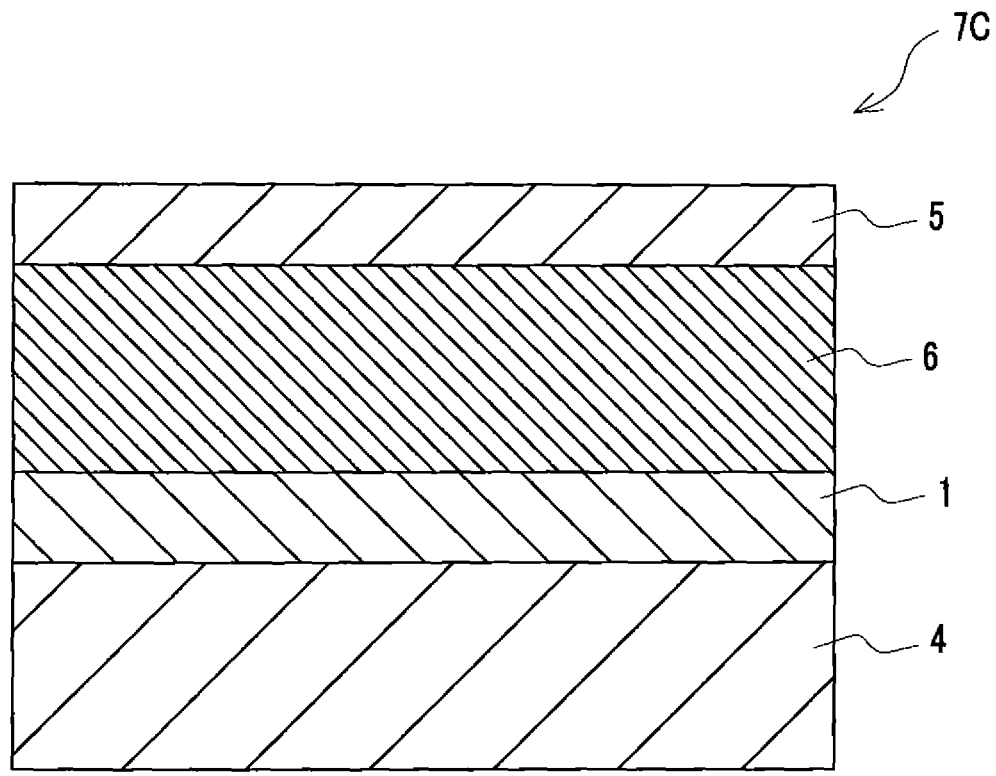
FIG. 3 is a partial sectional view schematically illustrating an electrophotographic photoreceptor according to another exemplary embodiment of the invention.

FIGS. 2 and 3 are sectional views, schematically illustrating an electrophotographic photoreceptor according to another exemplary embodiment of the invention.

The electrophotographic photoreceptor 7A shown in FIG. 1 is a so-called function-separated photoreceptor (or a multi-layered photoreceptor) and has a structure in which an undercoat layer 1 is formed on an electroconductive substrate 4 and a charge-generating layer 2, a charge-transporting layer 3, and a protective layer 5 are sequentially formed thereon. In the electrophotographic photoreceptor 7A, a photosensitive layer is constructed by the charge-generating layer 2 and the charge-transporting layer 3.

The electrophotographic photoreceptor 7B shown in FIG. 2 is a function-separated photoreceptor of which the function is separated into the charge-generating layer 2 and the charge-transporting layer 3, similarly to the electrophotographic photoreceptor 7A shown in FIG. 1. The electrophotographic photoreceptor 7C shown in FIG. 3 includes a charge-generating material and a charge-transporting material in the same layer (a single-layered photosensitive layer 6 (charge-generating/charge-transporting layer).

The electrophotographic photoreceptor 7B shown in FIG. 2 has a structure in which an undercoat layer 1 is formed on an electroconductive substrate 4 and a charge-transporting layer 3, a charge-generating layer 2, and a protective layer 5 are sequentially formed thereon. In the electrophotographic photoreceptor 7B, a photosensitive layer is constructed by the charge-transporting layer 3 and the charge-generating layer 2.

The electrophotographic photoreceptor 7C shown in FIG. 3 has a structure in which an undercoat layer 1 is formed on an electroconductive substrate 4 and a single-layered photosensitive layer 6 and a protective layer 5 are sequentially formed thereon.

In the electrophotographic photoreceptors 7A to 7C shown in FIGS. 1 to 3, the protective layer 5 is the outermost surface layer disposed farthest from the electroconductive substrate and the outermost surface layer is formed of the charge-transporting film.

The electrophotographic photoreceptors shown in FIGS. 1 to 3 may or may not be provided with the undercoat layer 1.

Elements of the electrophotographic photoreceptor 7A shown as a representative example in FIG. 1 will be described below.

Electroconductive Substrate

Any used in the past may be used as the electroconductive substrate. Examples thereof include plastic films having a thin film formed thereon (metals such as aluminum, nickel, chromium, and stainless steel and films of aluminum, titanium, nickel, chromium, stainless steel, gold, vanadium, tin oxide, indium oxide, indium tin oxide (ITO)), paper which is coated or impregnated with a conductivity-imparting agent, plastic films which are coated or impregnated with a conductivity-imparting agent. The shape of the base is not limited to a cylindrical shape, and may be a sheet shape or a plate shape.

The electroconductive substrate preferably has conductivity, for example, with volume resistivity of less than $10^7$ $\Omega \cdot cm$.

When a metal pipe is used as the electroconductive substrate, the surface thereof may be in an original pipe state or may be subjected to processes such as specular cutting, etching, anodization, coarse cutting, centerless grinding, sand blasting, and wet honing in advance.

Undercoat Layer

The undercoat layer is provided if necessary for the purpose of prevention of reflection of light from the surface of the electroconductive substrate, prevention of unnecessary inflow of carriers into the photosensitive layer from the electroconductive substrate, and the like.

The undercoat layer includes, for example, a binder resin and other additives as needed.

Examples of the binder resin included in the undercoat layer include known polymer resin compounds such as an acetal resin such as polyvinyl butyral, a polyvinyl alcohol resin, casein, a polyamide resin, a cellulose resin, gelatin, a polyurethane resin, a polyester resin, a methacrylic resin, an acrylic resin, a polyvinyl chloride resin, a polyvinyl acetate resin, a vinyl chloride-vinyl acetate-maleic anhydride resin, a silicone resin, a silicone-alkyd resin, a phenol resin, a phenol-formaldehyde resin, a melamine resin, and an urethane resin, a charge-transporting resin having a charge-transporting group, and a conductive resin such as polyaniline. Among these, the resins insoluble in a coating solvent for the upper layer are preferably used and particularly, the phenol resin, the phenol-formaldehyde resin, the melamine resin, the urethane resin, and an epoxy resin are preferably used.

The undercoat layer may include a metal compound such as a silicon compound, an organic zirconium compound, an organic titanium compound, and an organic aluminum compound.

The ratio of the metal compound and the binder resin is not particularly limited but may be set to achieve a desired electrophotographic photoreceptor characteristic.

Resin particles may be added to the undercoat layer for the purpose of adjustment of surface roughness. Examples of the resin particles include silicone resin particles and crosslinking polymethyl methacrylate (PMMA) resin particles. For the purpose of the adjustment of surface roughness, the surface of the undercoat layer may be polished after the undercoat layer formed. Buffing, sand blasting, wet honing, grinding, and the like are used as the polishing method.

Here, the undercoat layer may have a configuration including at least a binder resin and conductive particles. The conductive particles preferably has, for example, conductivity with volume resistivity of $10^7$ Ω·cm.

Examples of the conductive particles include metal particles (particles of aluminum, copper, nickel, silver, or the like), conductive metal oxide particles (particles of antimony oxide, indium oxide, tin oxide, zinc oxide, or the like), conductive material particles (particles of carbon fiber, carbon black, and graphite powder). Among these, the conductive metal oxide particles are preferably used. Two or more kinds of the conductive particles may be mixed for use.

The surface of the conductive particles may be treated with a hydrophobizing agent (such as a coupling agent) to adjust the resistance thereof for use.

The content of the conductive particles is preferably in the range of from 10% by mass to 80% by mass, for example, with respect to the binder resin and more preferably in the range of from 40% by mass to 80% by mass.

A coating solution for forming an undercoat layer in which the above-mentioned component is added to a solvent is used to form an undercoat layer.

A media disperser such as a ball mill, a vibration ball mill, an attritor, a sand mill, and a horizontal sand mill or a medialess disperser such as a stirrer, an ultrasonic disperser, a roll mill, and a high-pressure homogenizer is used to disperse particles in the coating solution for forming an undercoat layer. Here, examples of the high-pressure homogenizer include a collision system in which a dispersion is prepared through the use of liquid-liquid collision or liquid-wall collision in a high pressure state and a penetration system in which a dispersion is prepared by penetrating fine flow channels in a high pressure state.

Examples of a method of coating the electroconductive substrate with the coating solution for forming an undercoat layer include a dip coating method, a push-up coating method, a wire-bar coating method, a spray coating method, a blade coating method, and a knife coating method, and a curtain coating method.

The thickness of the undercoat layer is preferably equal to or more than 15 µm and more preferably in the range of from 20 µm to 50 µm.

Here, although not shown in the drawings, an intermediate layer may be disposed between the undercoat layer and the photosensitive layer. Examples of the binder resin used in the intermediate layer include organic metal compounds including zirconium, titanium, aluminum, manganese, silicon atoms, and the like, in addition to polymer resin compounds such as an acetal resin such as polyvinyl butyral, a polyvinyl alcohol resin, casein, a polyamide resin, a cellulose resin, gelatin, a polyurethane resin, a polyester resin, a methacrylic resin, an acrylic resin, a polyvinyl chloride resin, a polyvinyl acetate resin, a vinyl chloride-vinyl acetate-maleic anhydride resin, a silicone resin, a silicon-alkyd resin, a phenol-formaldehyde resin, and a melamine resin. These compounds may be used singly or as mixtures or polycondensates of plural compounds. Among these, the organic metal compounds including zirconium or silicon may be preferably used, since they has a low residual potential, a small variation in potential due to the environmental variations, and a small variation in potential due to repeated use.

A coating solution for forming an intermediate layer in which the above-mentioned components are added to a solvent is used to form the intermediate layer.

Normal methods such as a dip coating method, a push-up coating method, a wire-bar coating method, a spray coating method, a blade coating method, and a knife coating method, and a curtain coating method are used as a coating method of forming the intermediate layer.

The intermediate layer serves as an electrical barrier layer as well as to improve the coatability of an upper layer. However, when the thickness thereof is excessively large, an electrical barrier may be excessively high, thereby causing an increase in potential due to desensitization or repeated use. Therefore, when the intermediate layer is formed, the thickness thereof is preferably in the range of from 0.1 µm to 3 µm. In this case, the intermediate layer may be used as the undercoat layer.

Charge-Generating Layer

The charge-generating layer includes, for example, a charge-generating material and a binder resin. Examples of the charge-generating material include phthalocyanine pigments such as metal-free phthalocyanine, chlorogallium phthalocyanine, hydroxygallium phthalocyanine, dichlorotin phthalocyanine, and titanyl phthalocyanine. Particularly, chlorogallium phthalocyanine crystals having an intensive diffraction peak at least at Bragg angles (2θ±0.2°) of 7.4°, 16.6°, 25.5°, and 28.3° with respect to CuKα characteristic X-rays, metal-free phthalocyanine crystals having an intensive diffraction peak at least at Bragg angles (2θ±0.2°) of 7.7°, 9.3°, 16.9°, 17.5°, 22.4°, and 28.8° with respect to CuKα characteristic X-rays, hydroxygallium phthalocyanine crystals having an intensive diffraction peak at least at Bragg angles (2θ±0.2°) of 7.5°, 9.9°, 12.5°, 16.3°, 18.6°, 25.1°, and 28.3° with respect to CuKα characteristic X-rays, and titanyl phthalocyanine crystals having an intensive diffraction peak at least at Bragg angles (2θ±0.2°) of 9.6°, 24.1°, and 27.2° with respect to CuKα characteristic X-rays can be preferably used. Other examples of the charge-generating material include quinone pigments, perylene pigments, indigo pigments, bisbenzimidazole pigments, anthrone pigments, and quinacridone pigments. These charge-generating materials may be used singly or in combination of two or more kinds thereof.

Examples of the binder resin constituting the charge-generating layer include polycarbonate resins of Bisphenol A type or Bisphenol Z type, acrylic resins, methacrylic resins, polyarylate resins, polyester resins, polyvinyl chloride resins, polystyrene resins, acrylonitrile-styrene copolymer resins, acrylonitrile-butadiene copolymer resins, polyvinyl acetate resins, polyvinyl formal resins, polysulfone resins, styrene-butadiene copolymer resins, vinylidene chloride-acrylonitrile copolymer resins, vinyl chloride-vinyl acetate-vinyl-maleic anhydride resins, silicone resins, phenol-formaldehyde resins, polyacrylamide resins, polyamide resins, and poly-N- vinylcarbazole resins. These binder resins may be used singly or in combination of two or more kinds thereof.

The blending ratio of the charge-generating material and the binder resin is preferably in the range of 10:1 to 1:10.

A coating solution for forming a charge-generating layer in which the above-mentioned components are added to a solvent is used to form the charge-generating layer.

A media disperser such as a ball mill, a vibration ball mill, an attritor, a sand mill, and a horizontal sand mill or a media-less disperser such as a stirrer, an ultrasonic disperser, a roll mill, and a high-pressure homogenizer is used to disperse particles (for example, the charge-generating material) in the coating solution for forming a charge-generating layer. Examples of the high-pressure homogenizer include a collision system in which a dispersion is prepared through the use of liquid-liquid collision or liquid-wall collision in a high pressure state and a penetration system in which a dispersion is prepared by penetrating fine flow channels in a high pressure state.

Examples of the method of coating the undercoat layer with the coating solution for forming a charge-generating layer include a dip coating method, a push-up coating method, a wire-bar coating method, a spray coating method, a blade coating method, and a knife coating method, and a curtain coating method.

The thickness of the charge-generating layer is preferably in the range of from 0.01 μm to 5 μm and more preferably in the range of from 0.05 μm to 2.0 μm.

Charge-Transporting Layer

The charge-transporting layer includes a charge-transporting material and a binder resin if necessary.

Examples of the charge-transporting material include hole-transporting materials such as oxadiazole derivatives such as 2,5-bis(p-diethylaminophenyl)-1,3,4-oxadiazole, pyrazoline derivatives such as 1,3,5-triphenyl-pyrazoline and 1-[pyridyl-(2)]-3-(p-diethylaminostyryl)-5-(p-diethylamino styryl)pyrazoline, aromatic tertiary amino compounds such as triphenylamine, N,N'-bis(3,4-dimethylphenyl)biphenyl-4-amine, tri(p-methylphenyl)aminyl-4-amine, and dibenzylaniline, aromatic tertiary diamino compounds such as N,N'-bis(3-methylphenyl)-N,N'-diphenylbenzidine, 1,2,4-triazine derivatives such as 3-(4'-dimethylaminophenyl)-5,6-di(4'-methoxyphenyl)-1,2,4-triazine, hydrazone derivatives such as 4-diethylaminobenzaldehyde-1,1-diphenyl hydrozone, quinazoline derivatives such as 2-phenyl-4-styrylquinazoline, benzofuran derivatives such as 6-hydroxy-2,3-di(p-methoxyphenyl)benzofuran, α-stilbene derivatives such as p-(2,2-diphenylvinyl)-N,N-diphenylaniline, enamine derivatives, carbazole derivatives such as N-ethylcarbazole, poly-N-vinylcarbazole and derivatives thereof, electron-transporting materials such as quinone-based compounds such as chloranil and bromoanthraquinone, tetracyanoquinodimethane-based compounds, fluorenone-based compounds such as 2,4,7-trinitrofluorenone and 2,4,5,7-tetranitro-9-fluorenone, xanthone-based compounds, and thiophene-based compounds, and polymers having a group including the above-mentioned compounds in a main chain or a side chain. These charge-transporting materials may be used singly or in combination of one or two or more kinds thereof.

Examples of the binder resin constituting the charge-transporting layer include insulating resins such as polycarbonate resins of Bisphenol A type or Bisphenol Z type, acrylic resins, methacrylic resins, polyarylate resins, polyester resins, polyvinyl chloride resins, polystyrene resins, acrylonitrile-styrene copolymer resins, acrylonitrile-butadiene copolymer resins, polyvinyl acetate resins, polyvinyl formal resins, polysulfone resins, styrene-butadiene copolymer resins, vinylidene chloride-acrylonitrile copolymer resins, vinyl chloride-vinyl acetate-maleic anhydride resins, silicone resins, phenol-formaldehyde resins, polyacrylamide resins, polyamide resins, and chlorinated rubber and organic photoconductive polymers such as polyvinyl carbazole, polyvinyl anthracene, and polyvinyl pyrene. These binder resins may be used singly or in combination of two or more kinds thereof.

The blending ratio of the charge-transporting material and the binder resin is preferably in the range of 10:1 to 1:5.

A coating solution for forming a charge-transporting layer in which the above-mentioned components are added to a solvent is used to form the charge-transporting layer.

A media disperser such as a ball mill, a vibration ball mill, an attritor, a sand mill, and a horizontal sand mill or a media-less disperser such as a stirrer, an ultrasonic disperser, a roll mill, and a high-pressure homogenizer is used to disperse particles (for example, fluorine resin particles) in the coating solution for forming a charge-transporting layer. Examples of the high-pressure homogenizer include a collision system in which a dispersion is prepared through the use of liquid-liquid collision or liquid-wall collision in a high pressure state and a penetration system in which a dispersion is prepared by penetrating fine flow channels in a high pressure state.

Normal method such as a dip coating method, a push-up coating method, a wire-bar coating method, a spray coating method, a blade coating method, and a knife coating method, and a curtain coating method can be used to coat the charge-generating layer with the coating solution for forming a charge-transporting layer.

The thickness of the charge-transporting layer is preferably in the range of from 5 μm to 50 μm and more preferably in the range of from 10 μm to 40 μm.

Protective Layer

The protective layer employs the above-mentioned charge-transporting film and includes a polymer of a compound represented by Generation Formula (I).

A charge-transporting composition including the compound represented by Formula (I) is used to form the protective layer, but the total content of the compound represented by Formula (I) is preferably equal to or more than 40% by mass with respect to the charge-transporting composition (the total mass of solid from which a solvent is removed), more preferably equal to or more than 50% by mass, and still more preferably equal to or more than 60% by mass.

By setting this range, electrical characteristics are excellent and an increase in thickness of a hardened film is realized.

In this exemplary embodiment, the compound represented by Formula (I) and a known charge-transporting material not having a reactive group may be used together. Since the known charge-transporting material not having a reactive group does not have a function to transport charge, the component concentration of the charge-transporting material is made to increase to further improve the electrical characteristics, which is effective.

The above-mentioned examples of the charge-transporting material constituting the charge-transporting layer may be used as the known charge-transporting material.

Other components of the charge-transporting composition for forming the protective layer will be described below.

The charge-transporting composition used to form the protective layer may include the following surfactants, from the viewpoint of improving the film formability.

Examples of the surfactant include surfactants containing one or more species of structures out of (A) a structure formed by polymerizing an acryl monomer having a fluorine atom, (B) a structure having a carbon-carbon double bond and a fluorine atom, (C) a structure of alkylene oxide, and (D) a structure having a carbon-carbon triple bond and a hydroxyl group, in a molecule.

These surfactants may include one or more of the structures (A) to (D) in a molecule and may include two or more thereof.

The structures (A) to (D) and the surfactants having the structures will be described below.

(A) Structure Formed by Polymerizing an Acryl Monomer Having a Fluorine Atom

The structure (A) formed by polymerizing an acryl monomer having a fluorine atom is not particularly limited, but a structure formed by polymerizing an acryl monomer having a fluoroalkyl group can be preferably used and a structure formed by polymerizing an acryl monomer having a perfluoroalkyl group can be more preferably used.

Specific examples of the surfactant having the structure (A) include Poly-flow KL-600 (made by Kyoeisha Chemical Co., Ltd) and Eftop EF-351, Eftop EF-352, Eftop EF-801, Eftop EF-802, and Eftop EF-601 (made by JEMCO Inc.).

(B) Structure Having a Carbon-Carbon Double Bond and a Fluorine Atom

The structure (B) having a carbon-carbon double bond and a fluorine atom is not particularly limited but a group represented by at least one of Structural Formulas (B1) and (B2) can be preferably used.

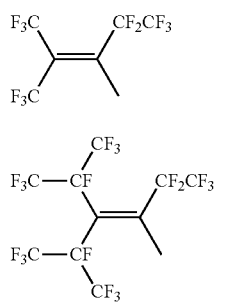

As the surfactant having the structure (B), compounds having a group represented by at least one of Structural Formulas (B1) and (B2) in a side chain of an acryl polymer or compounds represented by at least one of Structural Formulas (B3) to (B5) can be preferably used.

When compounds having a group represented by at least one of Structural Formulas (B1) and (B2) in a side chain of an acryl polymer is used as the surfactant having the structure (B), the acrylic structure has a property of being friendly with other components in the composition, thereby forming a homogeneous outermost surface layer.

When compounds represented by at least one of Structural Formulas (B3) to (B5) are used as the surfactant having the structure (B), there is a tendency that a splash during coating is prevented, thereby suppressing a coating defect.

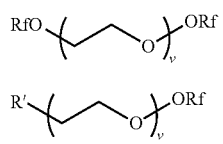

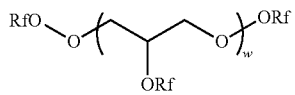

In Structural Formulas (B3) to (B5), v and w independently represent an integer equal to or greater than 1, R' represents a hydrogen atom or a monovalent organic group, and Rf independently represents a group represented by Structural Formula (B1) or (B2).

In Structural Formulas (B3) to (B5), examples of the monovalent organic group represented by R' include an alkyl group with a carbon number of 1 to 30 and a hydroxyalkyl group with a carbon number of 1 to 30.

Examples of a commercially-available product of the surfactant having the structure (B) include the following.

Examples of the compound represented by any of Structural Formulas (B3) to (B5) include FTERGENT 100, FTERGENT 100C, FTERGENT 110, FTERGENT 140A, FTERGENT 150, FTERGENT 150CH, FTERGENT A-K, FTERGENT 501, FTERGENT 250, FTERGENT 251, FTERGENT 222F, FTX-218, FTERGENT 300, FTERGENT 310, FTERGENT 400SW, FTERGENT 212M, FTERGENT 245M, FTERGENT 290M, FTX-207S, FTX-211S, FTX-220S, FTX-230S, FTX-209F, FTX-213F, FTX-222F, FTX-233F, FTX-245F, FTX-208G, FTX-218G, FTX-230G, FTX-240G, FTX-204D, FTX-280D, FTX-212D, FTX-216D, FTX-218D, FTX-220D, and FTX-222D (made by Neos Co., Ltd.).

Examples of the compound having a group represented by at least one of Structural Formulas (B1) and (B2) in a side chain of an acryl polymer include KB-L82, KB-L85, KB-L97, KB-L109, KB-L110, KB-F2L, KB-F2M, KB-F2S, KB-F3M, and KB-FaM (made by Neos Co., Ltd.).

(C) Structure of Alkylene Oxide

Examples of the structure (C) of alkylene oxide include alkylene oxide and polyalkylene oxide. Specific examples of alkylene oxide include ethylene oxide and propylene oxide and polyalkylene oxide with a repeating number of alkylene oxide of from 2 to 10000 may be used.

Examples of the surfactant having the structure (C) of alkylene oxide include polyethylene glycol, an antifoaming agent of polyether and polyether-denatured silicone oil.

The polyethylene glycol preferably has an average molecular weight equal to or less than 2000. Examples of polyethylene glycol with an average molecular weight equal to or less than 2000 include polyethylene glycol 2000 (with an average molecular weight of 2000), polyethylene glycol 600 (with an average molecular weight of 600), polyethylene glycol 400 (with an average molecular weight of 400), and polyethylene glycol 200 (with an average molecular weight of 200).

Polyether antifoaming agents such as PE-M and PE-L (made by Wako Pure Chemical Industries Ltd.) and Antifoaming agent No. 1 and Antifoaming agent No. 5 (made by Kao Corporation) can be used as suitable examples.

Examples of the surfactants including a fluorine atom in a molecule thereof other than the structure (C) of alkylene oxide include surfactants in which a side chain of a polymer having a fluorine atom has alkylene oxide or polyalkylene oxide and surfactants in which a terminal of alkylene oxide or polyalkylene oxide is substituted with a substituent having a fluorine atom.

Specific examples of the surfactants including a fluorine atom in a molecule thereof other than the structure (C) of alkylene oxide include MEGAFACE F-443, MEGAFACE F-444, MEGAFACE F-445, and MEGAFACE F-446 (made by DIC Corporation), FTERGENT 250, FTERGENT 251, and FTERGENT 222F (made by Neos Co., Ltd.), and POLYFOX PF636, POLYFOX PF6320, POLYFOX PF6520, and POLYFOX PF656 (made by Kitamura Chemicals Co., Ltd.).

Specific examples of the surfactant including a silicone structure in a molecule other than the structure (C) of alkylene oxide include KF351(A), KF352(A), KF353(A), KF354(A), KF355(A), KF615(A), KF618, KF945(A), and KF6004 (made by Shin-Etsu Chemical Co., Ltd.), TSF4440, TSF4445, TSF4450, TSF4446, TSF4452, TSF4453, and TSF4460 (made by GE Toshiba Silicones Co., Ltd.), and BYK-300, BYK-302, BYK-306, BYK-307, BYK-310, BYK-315, BYK-320, BYK-322, BYK-323, BYK-325, BYK-330, BYK-331, BYK-333, BYK-337, BYK-341, BYK-344, BYK-345, BYK-346, BYK-347, BYK-348, BYK-370, BYK-375, BYK-377, BYK-378, BYK-UV3500, BYK-UV3510, and BYK-UV3570 (made by BYK-Chemie Japan K.K.).

(D) Structure Having Carbon-Carbon Triple Bond and Hydroxyl Group

The structure (D) having a carbon-carbon triple bond and a hydroxyl group is not particularly limited and examples of the surfactant having this structure include the following.

An example of the surfactant having the structure (D) having a carbon-carbon triple bond and a hydroxyl group is a compound having a triple bond and a hydroxyl group in a molecule and specific examples thereof include 2-propyne-1-ol, 1-butyne-3-ol, 2-butyne-1-ol, 3-butyne-1-ol, 1-pentyne-3-ol, 2-pentyne-1-ol, 3-pentyne-1-ol, 4-pentyne-1-ol, 4-pentyne-2-ol, 1-hexyne-3-ol, 2-hexyne-1-ol, 3-hexyne-1-ol, 5-hexyne-1-ol, 5-hexyne-3-ol, 1-heptyne-3-ol, 2-heptyne-1-ol, 3-heptyne-1-ol, 4-heptyne-2-ol, 5-heptyne-3-ol, 1-octyne-3-ol, 3-octyne-1-ol, 3-nonyne-1-ol, 2-decyne-1-ol, 3-decyne-1-ol, 10-undecyne-1-ol, 3-methyl-1-butyne-3-ol, 3-methyl-1-pentene-4-yn-3-ol, 3-methyl-1-pentyne-3-ol, 5-methyl-1-hexyne-3-ol, 3-ethyl-1-pentyne-3-ol, 3-ethyl-1-heptyne-3-ol, 4-ethyl-1-octyne-3-ol, 3,4-dimethyl-1-pentyne-3-ol, 3,5-dimethyl-1-hexyne-3-ol, 3,6-dimethyl-1-heptyne-3-ol, 2,2,8,8-tetramethyl-3,6-nonadiyne-5-ol, 4,6-nonadecadiyne-1-ol, 10,12-pentacosadiyne-1-ol, 2-butyne-1,4-diol, 3-hexyne-2,5-diol, 2,4-hexadiyne-1,6-diol, 2,5-dimethyl-3-hexyne-2,5-diol, 3,6-dimethyl-4-octyne-3,6-diol, 2,4,7,9-tetramethyl-5-decyne-4,7-diol, (+)-1,6-bis(2-chlorophenyl)-1,6-diphenyl-2,4-hexadiyne-1,6-diol, (−)-1,6-bis(2-chlorophenyl)-1,6-diphenyl-2,4-hexadiyne-1,6-diol, 2-butyne-1,4-diolbis(2-hydroxyethyl), 1,4-diacetoxy-2-butyne, 4-diethylamino-2-butyne-1-ol, 1,1-diphenyl-2-propyne-1-ol, 1-ethynyl-1-cyclohexanol, 9-ethynyl-9-fluorenol, 2,4-hexadiynediyl-1,6-bis(4-phenylazobenzene sulfonate), 2-hydroxy-3-butynoate, 2-hydroxy-3-ethylester butynoate, 2-methyl-4-phenyl-3-butyne-2-ol, methylproparagyl ether, 5-phenyl-4-pentyne-1-ol, 1-phenyl-1-propyne-3-ol, 1-phenyl-2-propyne-1-ol, 4-trimethylsilyl-3-butyne-2-ol, and 3-trimethylsilyl-2-propyne-1-ol.

Other examples thereof include compounds (for example, SURFYNOL 400 series (made by Shin Etsu Chemical Co., Ltd.)) in which alkylene oxide such as ethylene oxide is added to a part or all of a hydroxyl group of the above-mentioned compound.

Compounds represented by any one of Formulas (D1) and (D2) can be preferably used as the surfactant having the structure (D) having a carbon-carbon triple bond and a hydroxyl group.

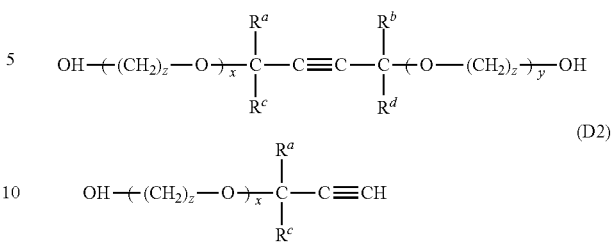

In Formulas (D1) and (D2), $R^a$, $R^b$, $R^c$, and $R^d$ independently represent a monovalent organic group and x, y, and z independently represent an integer equal to or greater than 1.

In the compounds represented by Formula (D1) or (D2), it is preferable that $R^a$, $R^b$, $R^c$, and $R^d$ are alkyl groups. It is more preferable that at least one of $R^a$ and $R^b$ and at least one of $R^c$ and $R^d$ are branched alkyl groups. In addition, z is preferably equal to or greater than 1 and equal to or less than 10 and x and y are preferably equal to or greater than 1 and equal to or less than 500.

Examples of the commercially-available product of the compound represented by Formula (D1) or (D2) include SURFYNOL 400 series (made by Shin Etsu Chemical Co., Ltd.)

The above-mentioned surfactants having the structures (A) to (D) may be used singly or in combination of two or more kinds thereof. When two or more surfactants are combined for use, a surfactant having a structure different from those of the surfactants having the structures (A) to (D) may be used together in the range not damaging the advantage.

Examples of the surfactant which can be together used include surfactants having a fluorine atom and surfactants having a silicone structure as described below.

That is, examples of the surfactant having a fluorine atom, which can be used together with the surfactants having the structures (A) to (D), include perfluoroalkyl sulfonates (such as perfluorobutane sulfonate and perfluorooctane sulfonate), perfluoroalkyl carboxylates (such as perfluorobutane carboxylate and perfluorooctane carboxylate), and ester phosphate containing a perfluoroalkyl group. The perfluoroalkyl sulfonates and the perfluoroalkyl carboxylates may be salts and amide-denatured compounds thereof.

Examples of a commercially-available product of the perfluoroalkyl sulfonates include MEGAFACE F-114 (made by DIC Corporation), Eftop EF-101, Eftop EF102, Eftop EF-103, Eftop EF-104, Eftop EF-105, Eftop EF-112, Eftop EF-121, Eftop EF-122A, Eftop EF-122B, Eftop EF-122C, and Eftop EF-123A (made by JEMCO Inc.), and FTERGENT 100, FTERGENT 100C, FTERGENT 110, FTERGENT 140A, FTERGENT 150, FTERGENT 150CH, FTERGENT A-K, and FTERGENT 501 (made by Neos Co., Ltd.).

Examples of a commercially-available product of the perfluoroalkyl carboxylates include MEGAFACE F-410 (made by DIC Corporation) and Eftop EF-201 and Eftop EF-204 (made by JEMCO Inc.).

Examples of a commercially-available product of the ester phosphate containing a perfluoroalkyl group include MEGAFACE F-493 and MEGAFACE F-494 (made by DIC Corporation) and Eftop EF-123A, Eftop EF-123B, Eftop EF-125M, and Eftop EF-132 (made by JEMCO Inc.).

The surfactant having a fluorine atom, which can be used together with the surfactants having the structures (A) to (D), is not limited to the above-mentioned, but compounds (such as FTERGENT 400SW, made by Neos Co., Ltd.) having a betaine structure containing a fluorine atom and surfactants (such as FTERGENT SW, made by Neos Co., Ltd.) having a dipolar ion group can be suitably used.

Examples of the surfactant having a silicone structure, which can be used together with the surfactants having the structures (A) to (D), include known silicone oils such as dimethyl silicone, methylphenyl silicone, diphenyl silicone, and derivatives thereof.

The content of the surfactant is preferably in the range of from 0.01% by mass to 1% by mass with respect to the charge-transporting composition (the total mass of solid from which a solvent is removed) and more preferably in the range of from 0.02% by mass to 0.5% by mass. When the content of the surfactant is less than 0.01% by mass, the coating defect preventing effect may not satisfactory. When the content of the surfactant is more than 1% by mass, the strength of the obtained hardened film may be lowered due to separation of the surfactant and the hardening component (such as the compound represented by Formula (I) or other monomers and oligomers) from each other.

The content of the surfactants having the structures (A) to (D) is preferably equal to or more than 1% by mass with respect to the total surfactants and more preferably equal to or more than 10% by mass.

Radical-polymerizable monomers or oligomers not having charge transportability may be added to the charge-transporting composition used to form the protective layer, for the purpose of control of viscosity, film strength, flexibility, smoothness, cleanability, and the like of the composition.

Examples of a monofunctional radical-polymerizable monomer include iso-butyl acrylate, t-butyl acrylate, iso-octyl acrylate, lauryl acrylate, stearyl acrylate, iso-bornyl acrylate, cyclohexyl acrylate, 2-methoxyethyl acrylate, methoxytriethylene glycol acrylate, 2-ethoxyethyl acrylate, tetrahydroperfurfuryl acrylate, benzyl acrylate, ethylcarbitol acrylate, phenoxyethyl acrylate, 2-hydroxy acrylate, 2-hydroxypropyl acrylate, 4-hydroxybutyl acrylate, methoxypolyethylene glycol acrylate, methoxypolyethylene glycol methacrylate, phenoxypolyethylene glycol acrylate, phenoxypolyethylene glycol methacrylate, hydroxyethyl o-phenylphenol acrylate, and o-phenylphenol glycidyl ether acrylate.

Examples of a bifunctional radical-polymerizable monomer include 1,4-butanediol diacrylate, 1,6-hexanediol diacrylate, 1,9-nonanediol diacrylate, 2-n-butyl-2-ethyl-1,3-propanediol diacrylate, tripropylene glycol diacrylate, tetraethylene glycol diacrylate, dioxane glycol diacrylate, polytetramethylene glycol diacrylate, ethoxylated Bisphenol A diacrylate, ethoxylated bosphenol A dimethacrylate, tricyclodecanemethanol dicarylate, and tricyclodecanemethanol dimethacrylate.

Examples of a trifunctional or higher radical-polymerizable monomer include trimethylolpropane triacrylate, trimethylolpropane trimethacrylate, pentaerythritol acrylate, trimethylolpropane EO-added triacrylate, glycerin PO-added triacrylate, trisacroyloxyethyl phosphate, pentaerythritol tetracrylate, and ethoxylated isocyanuric triacrylate.

Examples of the radical-polymerizable oligomer include epoxy acrylate-based, urethane acrylate-based, and polyester acrylate-based oligomers.

The content of the radical-polymerizable monomer or oligomer not having charge transportability is preferably in the range of from 0% by mass to 50% by mass with respect to the charge-transporting composition (the total mass of solid from which a solvent is removed), more preferably in the range of from 0% by mass to 40% by mass, and still more preferably in the range of from 0% by mass to 30% by mass.

A thermal radical initiator or derivatives thereof are preferably added to the charge-transporting composition used to form the protective layer. That is, the thermal radical initiator or the derivatives thereof are preferably contained in the protective layer.

Here, the "derivatives of the thermal radical initiator" means products after the thermal radical initiator generates a radical or products in which the thermal radical initiator is coupled to a terminal of a polymerization site.

Here, the hardened film (cross-linking film) constituting the protective layer can be obtained by hardening the charge-transporting composition including the above-mentioned components through the use of various methods using heat, light, electron beams, or the like, but the thermal hardening is preferably used to take a balance in characteristics such as electrical characteristics and mechanical characteristics of the hardened film. In general, electron beams enabling the hardening without using a catalyst and optical polymerization enabling the hardening for a short time can be preferably used to harden general acryl paints. However, in the electrophotographic photoreceptor, since the photosensitive layer having a surface of the outermost surface layer include a photosensitive material, the thermal hardening gently enabling the hardening can be preferably used to suppress the damaging of the photosensitive material and to enhance the surface characteristic and state of the obtained hardened film.

Therefore, the thermal hardening may be performed without using a catalyst, but the thermal radical initiator or derivatives thereof are preferably used as a catalyst. Accordingly, it is easy to suppress the occurrence of ghost due to the repeated use.

The thermal radical initiator or derivatives thereof are not particularly limited, but the 10-hour half-life period temperature is preferably in the range of from 40° C. to 110° C. so as to suppress the damaging of the photosensitive material in the photosensitive layer during the formation of the protective layer.

Examples of a commercially-available product of the thermal radical initiator include azo-based initiators such as V-30 (with a 10-hour half-life, period temperature of 104° C.), V-40 (with a 10-hour half-life period temperature of 88° C.), V-59 (with a 10-hour half-life period temperature of 67° C.), V-601 (with a 10-hour half-life period temperature of 66° C.), V-65 (with a 10-hour half-life period temperature of 51° C.), V-70 (with a 10-hour half-life period temperature of 30° C.), VF-096 (with a 10-hour half-life period temperature of 96° C.), Vam-110 (with a 10-hour half-life period temperature of 111° C.), Vam-111 (with a 10-hour half-life period temperature of 111° C.), and VE-073 (with a 10-hour half-life period temperature of 73° C.) (made by Waco Pure Chemical Industries Inc.), $OT_{AZO}$-15 (with a 10-hour half-life period temperature of 61° C.), $OT_{AZO}$-30 (with a 10-hour half-life period temperature of 57° C.), AIBN (with a 10-hour half-life period temperature of 65° C.), AMBN (with a 10-hour half-life period temperature of 67° C.), ADVN (with a 10-hour half-life period temperature of 52° C.), and ACVA (with a 10-hour half-life period temperature of 68° C.) (made by Otsuka Chemical Co., Ltd.); PERTETRA A, PERHEXA HC, PERHEXA C, PERHEXA V, PERHEXA 22, PERHEXA MC, PERBUTYL H, PERCUMYL H, PERCUMYL P, PERMENTA H, PEROCTA H, PERBUTYL C, PERBUTYL D, PERHEXYL D, PERLOYL IB, PERLOYL 355, PERLOYL L, PERLOYL SA, NYPER BW, NYPER BMP-K40/M, PERLOYL IPP, PERLOYL NPP, PERLOYL TCP, PERLOYL OPP, PERLOYL SBP, PERCUMYL ND, PEROCTA ND, PERHEXYL ND, PERBUTYL ND, PERBUTYL NHP, PERHEXYL PV, PERBUTYL PV, PERHEXA 250, PEROCTA O, PERHEXYL O, PERBUTYL O, PERBUTYL L, PERBUTYL 355, PERHEXYL I, PERBUTYL I, PERBUTYL E, PERHEXA 25Z, PERBUTYL A, PERHEXYL Z, PERBUTYL ZT, and PERBUTYL Z, (made by NOF Corporation), KAYAKETAL AM-055, TRIGONOX 36-C75, LAUROX, PARCADOX L-W75, PARCADOX CH-50L, TRIGONOX TMBH, KAYACUMEN H, KAYABUTYL H-70, PERKADOX BC-FF, KAYAHEXA AD, PERKADOX 14, KAYABUTYL C, KAYABUTYL D, KAYAHEXA YD-E85, PERKADOX 12-XL25, PERKADOX 12-EB20, TRIGONOX 22-N70, TRIGONOX 22-70E, TRIGONOX D-T50, TRIGONOX 423-C70, KAYAESTER CND-C70, KAYAESTER CND-W50, TRIGONOX 23-C70, TRIGONOX 23-W50N, TRIGONOX 257-C70, KAYAESTER P-70, KAYAESTER TMPO-70, TRIGONOX 121, KAYAESTER O, KAYAESTER HTP-65W, KAYAESTER AN, TRIGONOX 42, TRIGONOX F-050, KAYABUTYL B, KAYACARBON EH-C70, KAYACARBON EH-W 60, KAYACARBON 1-20, KAYACARBON BIC-75, TRIGONOX 117, KAYALENE 6-70 (made by Kayaku Akzo Co., Ltd.), LUPEROX LP (with a 10-hour half-life period temperature of 64° C.), LUPEROX 610 (with a 10-hour half-life period temperature of 37° C.), LUPEROX 188 (with a 10-hour half-life period temperature of 38° C.), LUPEROX 844 (with a 10-hour half-life period temperature of 44° C.), LUPEROX 259 (with a 10-hour half-life period temperature of 46° C.), LUPEROX 10 (with a 10-hour half-life period temperature of 48° C.), LUPEROX 701 (with a 10-hour half-life period temperature of 53° C.), LUPEROX 11 (with a 10-hour half-life period temperature of 58° C.), LUPEROX 26 (with a 10-hour half-life period temperature of 77° C.), LUPEROX 80 (with a 10-hour half-life period temperature of 82° C.), LUPEROX 7 (with a 10-hour half-life period temperature of 102° C.) LUPEROX 270 (with a 10-hour half-life period temperature of 102° C.), LUPEROX P (with a 10-hour half-life period temperature of 104° C.), LUPEROX 546 (with a 10-hour half-life period temperature of 46° C.), LUPEROX 554 (with a 10-hour half-life period temperature of 55° C.), LUPEROX 575 (with a 10-hour half-life period temperature of 75° C.), LUPEROX TANPO (with a 10-hour half-life period temperature of 96° C.), LUPEROX 555 (with a 10-hour half-life period temperature of 100° C.), LUPEROX 570 (with a 10-hour half-life period temperature of 96° C.), LUPEROX TAP (with a 10-hour half-life period temperature of 100° C.), LUPEROX TBIC (with a 10-hour half-life period temperature of 99° C.), LUPEROX TBEC (with a 10-hour half-life period temperature of 100° C.), LUPEROX JW (with a 10-hour half-life period temperature of 100° C.), LUPEROX TAIC (with a 10-hour half-life period temperature of 96° C.), LUPEROX TAEC (with a 10-hour half-life period temperature of 99° C.), LUPEROX DC (with a 10-hour half-life period temperature of 117° C.), LUPEROX 101 (with a 10-hour half-life period temperature of 120° C.), LUPEROX F (with a 10-hour half-life period temperature of 116° C.), LUPEROX DI (with a 10-hour half-life period temperature of 129° C.), LUPEROX 130 (with a 10-hour half-life period temperature of 131° C.), LUPEROX 220 (with a 10-hour half-life period temperature of 107° C.), LUPEROX 230 (with a 10-hour half-life period temperature of 109° C.), LUPEROX 233 (with a 10-hour half-life period temperature of 114° C.), and LUPEROX 531 (with a 10-hour half-life period temperature of 93° C.) (made by Arkema Yoshitomi, Ltd.).

The content of the thermal radical initiator or the derivatives thereof is preferably in the range of from 0.001% by mass to 10% by mass with respect to reactive compounds (the compound represented by Formula (I)+other reactive compounds) in the charge-transporting composition, more preferably in the range of from 0.01% by mass to 5% by mass, and still more preferably in the range of from 0.1% by mass to 3% by mass.

For the purpose of effectively suppressing oxidation due to a discharge-produced gas, other thermosetting resins such as a phenol resin, melamine resin, and benzoguanamine may be added to the charge-transporting composition used to form the protective layer.

For the purpose of adjusting film formability, flexibility, lubrication, and adhesiveness of the film, a coupling agent, a hard coating agent, and a fluorine-containing compound may be added to the charge-transporting composition used to form the protective layer. Specifically, various silane coupling agents and commercially-available silicone-based hard coating agents are used as the additives.

Examples of the silane coupling agents include vinyl trichlorosilane, vinyl trimethoxysilane, vinyl triethoxysilane, γ-glycidoxypropylmethyl diethoxysilane, γ-glycidoxypropyl trimethoxysilane, γ-aminopropyl triethoxysilane, γ-aminopropyl trimethoxysilane, γ-aminopropylmethyl dimethoxysilane, N-β(aminoethyl) γ-aminopropyl triethoxysilane, tetramethoxysilane, methyl trimethoxysilane, and dimethyl dimethoxysilane.

Examples of a commercially-available hard coating agent include KP-85, X-40-9740, and X-8239 (made by Shin Etsu Silicone Co., Ltd.) and AY42-440, AY42-441 and AY49-208 (made by Dow Corning Corporation).

For the purpose of imparting water repellancy, fluorine-containing compounds such as (tridecafluoro-1,1,2,2-tetrahydrooctyl) triethoxysilane, (3,3,3-trifluoropropyl) trimethoxysilane, 3-(heptafluoroisopropoxy)propyl triethoxysilane, 1H,1H,2H,2H-perfluoroalkyl triethoxysilane, 1H,1H,2H,2H-perfluorodecyl triethoxysilane, and 1H,1H,2H,2H-perfluorooctyl triethoxysilane may be added thereto.

The content of the silane coupling agent is arbitrary, but the content of the fluorine-containing compound is preferably equal to or less than 0.25 time the mass of the compounds not containing fluorine. When the content is greater than this amount, a problem may occur in formability of a cross-linked film.

A thermoplastic resin may be added to the charge-transporting composition used to form the protective layer, for the purpose of discharged-gas resistance, mechanical strength, scratch resistance, decrease in torque, control of abrasion, elongation of pot life, control of particle dispersibility and viscosity, and the like.

Examples thereof include a polyvinyl butyral resin, a polyvinyl formal resin, a polyvinyl acetal resin (such as S-REC B and S-REC K, made by Sekisui Chemical Co., Ltd.) such as a partially-acetalized polyvinyl acetal resin in which a part of butyral is denatured with formal or acetacetal, a polyamide resin, a cellulose resin, and a polyvinyl phenol resin. Particularly, from the viewpoint of electrical characteristics, the polyvinyl acetal resin and the polyvinyl phenol resin can be preferably used. The weight-average molecular weight of the resin is preferably in the range of from 2,000 to 100,000 and more preferably in the range of from 5,000 to 50,000. When the molecular weight of the resin is less than 2,000, the advantage of the addition of the resin may not be satisfactory. When the molecular weight is more than 100,000, solubility may be lowered to limit the additive amount, thereby causing film formation failure during coating. The amount of resin added is preferably in the range of from 1% by mass to 40% by mass, more preferably in the range of from 1% by mass to 30% by mass, and still more preferably in the range of from 5% by mass to 20% by mass. When the amount of resin added is less than 1% by mass, the advantage of the addition of the resin may not be satisfactory. When the amount of resin added is more than 40% by mass, image blur may easily occur under a high temperature and a high humidity (for example, at 28° C. and 85% RH).

An antioxidant is preferably added to the charge-transporting composition used to form the protective layer, for the purpose of preventing deterioration due to oxidation gas such as ozone generated in a charging device of the protective layer. When the mechanical strength of the surface of the photoreceptor is enhanced and thus the photoreceptor is elongated in lifetime, the photoreceptor is in contact with the oxidation gas for a longtime and thus there is a need for stronger oxidation resistance.

Hindered phenols or hindered amines can be preferably used as the antioxidant and known antioxidants such as an organic sulfur-based antioxidant, a phosphite-based antioxidant, a dithiocarbamate-based antioxidant, a thiourea-based antioxidant, and a benzimidazole-based antioxidant may be used. The amount of antioxidant added is preferably equal to or less than 20% by mass and more preferably equal to or less than 10% by mass.

Examples of the hindered phenol-based antioxidant include 2-6-di-t-butyl-4-methylphenol, 2,5-di-t-butylhydroquinone, N,N'-hexamethylene bis(3,5-di-t-butyl-4-hydroxyhydrocinamide, 3,5-di-t-butyl-4-hydroxybenzyl phosphonate diethylester, 2,4-bis[(octylthio)methyl]-o-cresol, 2,6-di-t-butyl-4-ethylphenol, 2,2'-methylene bis(4-methyl-6-t-butylphenol), 2,2'-methylene bis(4-ethyl-6-t-butylphenol), 4,4'-butylidene bis(3-methyl-6-t-butylphenol), 2,5-di-t-amylhydroquinone, 2-t-butyl-6-(3-butyl-2-hydroxy-5-methylbenzyl)-4-methylphenyl acrylate, and 4,4'-butylidene bis (3-methyl-6-t-butylphenol).

Various particles may be added to the charge-transporting composition used to form the protective layer, for the purpose of the decrease in residual potential of the protective layer and the increase in strength thereof.

Silicon-containing particles can be used as the particles. The silicon-containing particles are particles including silicon as a constituent element and specific examples thereof include colloidal silica particles and silicone particles. The colloidal silica particles used as the silicon-containing particles are selected from particles in which silica particles having an average particle diameter of from 1 nm to 100 nm and preferably having an average particle diameter of from 10 nm to 30 nm are dispersed in an organic solvent such as an acidic or alkali aqueous dispersion, alcohol, ketone, and ester and commercially-available products may be used. The solid content of the colloidal silica in the protective layer is not particularly limited, but is preferably in the range of from 0.1% by mass to 50% by mass with respect to the charge-transporting composition (the total mass of solid from which a solvent is removed) and more preferably in the range of from 0.1% by mass to 30% by mass, from the viewpoint of film formability, electrical characteristics, and strength.

The silicone particles used as the silicon-containing particles are selected from silicone resin particles, silicone rubber particles, and silicone-surface treated silica particles and commercially-available products may be used. These silicone particles are spherical and the average particle diameter thereof is preferably in the range of from 1 nm to 500 nm and more preferably in the range of from 10 nm to 100 nm. Since the silicone particles are small-diameter particles which are chemically inert and excellent in dispersibility in resins and the content necessary for achieving satisfactory characteristics is low, the surface property and state of the electrophotographic photoreceptor are improved without hindering the cross-linking reaction. That is, in the state wherein they are introduced without causing unevenness in the strong cross-linked structure, the lubricating property and the water-repellant property of the surface of the electrophotographic photoreceptor are improved and thus superior abrasion resistance and contamination resistance are maintained for a long term of time.

The content of the silicone particles in the protective layer is preferably in the range of from 0.1% by mass to 30% by mass with respect to the charge-transporting composition (the total mass of solid from which a solvent is removed) and more preferably in the range of from 0.5% by mass to 10% by mass.

Other examples of the particles include fluorine-based particles of tetrafluoroethylene, trifluoroethylene, hexafluoropropylene, vinyl fluoride, vinylidene fluoride, and the like, particles formed of a resin in which a fluorine resin and a monomer having a hydroxyl group are copolymerized as described in "Proceeding of Eighth Polymer Material Forum Lecture, p 89", and semi-conductive metal oxides such as $ZnO$—$Al_2O_3$, $SnO_2$—$Sb_2O_3$, $In_2O_3$—$SnO_2$, $ZnO_2$—$TiO_2$, $ZnO$—$TiO_2$, $MgO$—$Al_2O_3$, $FeO$—$TiO_2$, $TiO_2$, $SnO_2$, $In_2O_3$, $ZnO$, and $MgO$. For the same purpose, oils such as silicone oil may be added thereto. Examples of the silicone oil include silicone oils such as dimethyl polysiloxane, diphenyl polysiloxane, and phenylmethyl siloxane; reactive silicone oils such as amino-denatured polysiloxane, epoxy-denatured polysiloxane, carboxyl-denatured polysiloxane, carbinol-denatured polysiloxane, methacryl-denatured polysiloxane, mercapto-denatured polysiloxane, and phenol-denatured polysiloxane; cyclic dimethylcyclo siloxanes such as hexamethylcyclo trisiloxane, octamethylcyclo tetrasiloxane, decamethylcyclo pentasiloxane, and dodecamethylcyclo hexasiloxane; cyclic methylphenylcyclo siloxanes such as 1,3,5-trimethyl-1,3,5-triphenylcyclo trisiloxane, 1,3,5,7-tetramethyl-1,3,5,7-tetraphenylcyclo tetrasiloxane, and 1,3,5,7,9-pentamethyl-1,3,5,7,9-pentaphenylcyclo pentasiloxane; cyclic phenylcyclo siloxanes such as hexaphenylcyclo trisiloxane; fluorine-containing cyclo siloxanes such as (3,3,3-trifluoropropyl)methylcyclo trisiloxane; hydrosilyl group-containing cyclo siloxanes such as methylhydro siloxane mixture, pentamethylcyclo pentasiloxane, and phenylhydrocyclo siloxane; and vinyl group-containing cyclo siloxanes such as pentavinyl pentamethylcyclo pentasiloxane.

Metal, metal oxide, carbon black, and the like may be added to the charge-transporting composition used to form the protective layer. Examples of the metal include aluminum, zinc, copper, chromium, nickel, silver, stainless steel, and plastic particles of which the surface is coated with the metals. Examples of the metal oxide include zinc oxide, titanium oxide, tin oxide, antimony oxide, indium oxide, bismuth oxide, indium oxide doped with tin, tin oxide doped with antimony or tantalum, and zirconium oxide doped with antimony. These may be used singly or in combination of two or more kinds thereof. When two or more species are combined for use, they may be mixed simply or in the form of solid solution or fusion. The average particle diameter of the conductive particles is preferably equal to or less than 0.3 µm and more preferably equal to or less than 0.1 µm, in terms of transparency of the protective layer.

The charge-transporting composition used to form the protective layer is preferably prepared as a coating solution for forming a protective layer and the coating solution for forming a protective layer may be free of a solvent or may include solvents such as alcohols such as methanol, ethanol, propanol, butanol, cyclopentanol, and cyclohexanol; ketones such as acetone and methylethyl ketone; and ethers such as tetrahydrofuran, diethyl ether, and dioxane.

These solvents may be used singly or in combination of two or more kinds thereof. The boiling point thereof is preferably equal to or lower than 100° C. Particularly, solvents (such as alcohols) having at least one hydroxyl group can be preferably used as the solvent.

A film can be obtained by coating the charge-transporting layer with the coating solution for forming a protective layer, which includes the charge-transporting composition used to form the protective layer, through the use of known coating methods such as a blade coating method, a wire-bar coating method, a spray coating method, a dip coating method, a bead coating method, an air knife coating method, and a curtain coating method and heating the resultant, for example, at a temperature of from 100° C. to 170° C. to polymerize (harden) the resultant. As a result, it is possible to obtain a protective layer formed of the film.

The oxygen concentration during polymerizing (hardening) the coating solution for forming a protective layer is preferably equal to or less than 1%, more preferably equal to or less than 1000 ppm, and still more preferably equal to or less than 500 ppm.

An example of a function-separated type has been described hitherto as the electrophotographic photoreceptor. The content of the charge-generating material in the single-layered photosensitive layer 6 (a charge-generating/charge-transporting layer) shown in FIG. 3 is in the range of from 10% by mass to 85% by mass and preferably in the range of from 20% by mass to 50% by mass. The content of the charge-transporting material is preferably in the range of from 5% by mass to 50% by mass. The method of forming the single-layered photosensitive layer 6 (a charge-generating/charge-transporting layer) is similar to the method of forming the charge-generating layer or the charge-transporting layer. The thickness of the single-layered photosensitive layer 6 (a charge-generating/charge-transporting layer) is preferably in the range of from 5 µm to 50 µm and more preferably in the range of from 10 µm to 40 µm.

Although it has been stated in this exemplary embodiment that the outermost surface layer formed of the above-mentioned charge-transporting film is a protective layer, the charge-transporting layer is located at the outermost surface in the layer structure not having a protective layer and the charge-transporting film may be used for the outermost surface layer.

Even if the protective layer is provided, the above-mentioned charge-transporting film may be used as a charge-transporting layer below the protective layer.

Image Forming Apparatus/Process Cartridge

An image forming apparatus according to this exemplary embodiment includes a charging unit that charges the electrophotographic photoreceptor according to this exemplary embodiment, a latent image forming unit that forms an electrostatic latent image on the charged electrophotographic photoreceptor, a developing unit that develops the electrostatic latent image formed on the electrophotographic photoreceptor with a developer to form a toner image, and a transfer unit that transfers the developed toner image to a transfer medium.

Figure 4:
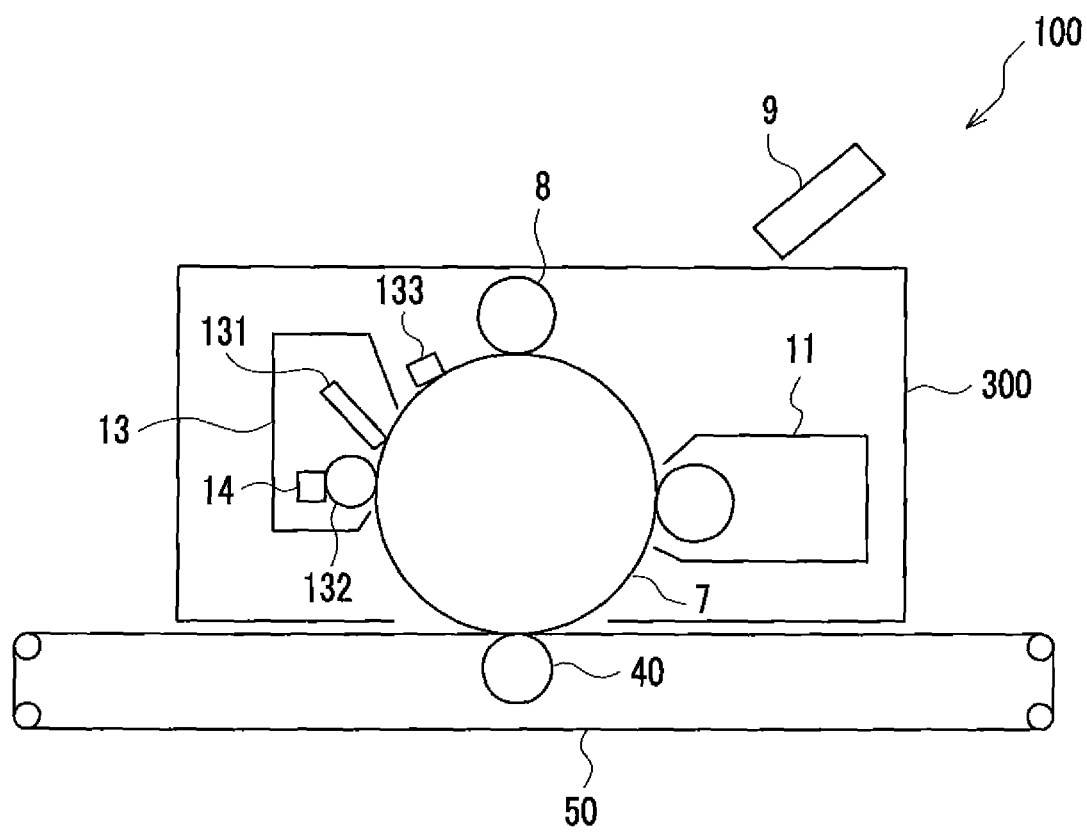
FIG. 4 is a diagram schematically illustrating an image forming apparatus according to an exemplary embodiment of the invention.

FIG. 4 is a diagram schematically illustrating the configuration of an image forming apparatus 100 according to an exemplary embodiment.

The image forming apparatus 100 shown in FIG. 4 includes a process cartridge 300 having an electrophotographic photoreceptor 7, an exposing device (an electrostatic latent image forming unit) 9, a transfer device (a transfer unit) 40, and an intermediate transfer member 50. In the image forming apparatus 100, the exposing device 9 is disposed at a position where it can expose the electrophotographic photoreceptor 7 through the opening of the process cartridge 300, the transfer device 40 is disposed at a position facing the electrophotographic photoreceptor 7 with the intermediate transfer member 50 interposed therebetween, and the intermediate transfer member 50 is disposed so that a part thereof is in contact with the electrophotographic photoreceptor 7.

Here, the above-mentioned electrophotographic photoreceptor according to this exemplary embodiment is used as the electrophotographic photoreceptor 7. Since the electrophotographic photoreceptor according to this exemplary embodiment suppresses its deterioration in electrical characteristics in spite of environmental variations as described above, the process cartridge and the image forming apparatus having the electrophotographic photoreceptor can provide an image in which deterioration due to environmental variations is suppressed and which is stable for a long term of time.

In the process cartridge 300 shown in FIG. 4, the electrophotographic photoreceptor 7, a charging device (a charging unit) 8, a developing device (a developing unit) 11, and a cleaning device 13 are supported integrally in a housing. The cleaning device 13 includes a cleaning blade (a cleaning member) and the cleaning blade 131 is disposed to be in contact with the surface of the electrophotographic photoreceptor 7.

The configuration of the process cartridge 300 is not particularly limited as long as it includes the electrophotographic photoreceptor 7 and is attached to and detached from the image forming apparatus, and may have a configuration in which a device (for example, one selected from the charging device (the charging unit) 8, the developing device (the developing unit) 11, and the cleaning device 13) other than the electrophotographic photoreceptor 7 is supported as a body along with the electrophotographic photoreceptor 7 if necessary.

FIG. 4 shows an example including a fiber-shape member 132 (roll shape) supplying a lubricant 14 to the surface of the photoreceptor 7 and a fiber-shape member 133 (flat brush shape) assisting the cleaning process as the cleaning device 13, but these are used if necessary.

For example, a contact-type charger using a conductive or semi-conductive charging roller, a charging brush, a charging film, a charging rubber blade, a charging tube, and the like is used as the charging device 8. In addition, known chargers such as a non-contact-type roller charger and a scorotron charger or a corotron charger using corona discharge are also used.

Although not shown in the drawing, a photoreceptor heating member raising the temperature of the electrophotographic photoreceptor 7 to lower the relative temperature may be disposed around the electrophotographic photoreceptor 7, for the purpose of enhancing the stability of an image.

An example of the exposing device 9 is an optical instrument exposing the surface of the photoreceptor 7 into a desired image with light such as a semiconductor laser beam, an LED beam, and a liquid crystal shutter beam. The wavelength of the light is in a spectrally-sensitized region of the photoreceptor. The near-infrared region having an oscillation wavelength in the vicinity of 780 nm is mainly used as the wavelength of the semiconductor laser. However, the laser is not limited to this wavelength, but a laser beam having an oscillation wavelength around 600 nm or a laser having an oscillation wavelength around 400 nm to 450 nm as a blue laser may be used. A surface-emission laser source of such a type capable of outputting multiple beams can be effectively used to form a color image.

For example, known developing devices performing a developing process by using magnetic or nonmagnetic single-component developer or two-component developer in a contact manner or a non-contact manner may be used as the developing device 11. The developing device is not particularly limited as long as it has the above-mentioned function, and can be selected depending on its application. Examples thereof include known developing devices having a function of attaching the single-component or two-component developer to the photoreceptor 7 by the use of a brush, a roller, or the like. Among these, developing devices including a developing roller having a developer held on the surface thereof can be preferably used.

Known transfer chargers such as contact-type transfer chargers using a belt, a roller, a film, a rubber blade, or the like and a scorotron transfer charger or corotron transfer charger using corona discharge can be used as the transfer device 40.

Belt-like members (intermediate transfer belts) of polyimide, polyamideimide, polycarbonate, polyarylate, polyester, rubber and the like can be used as the intermediate transfer member 50. The intermediate transfer member 50 may have a drum shape as well as the belt shape.

The image forming apparatus 100 may further include an optical erasing device removing the charge of the photoreceptor 7, in addition to the above-mentioned devices.

Figure 5:
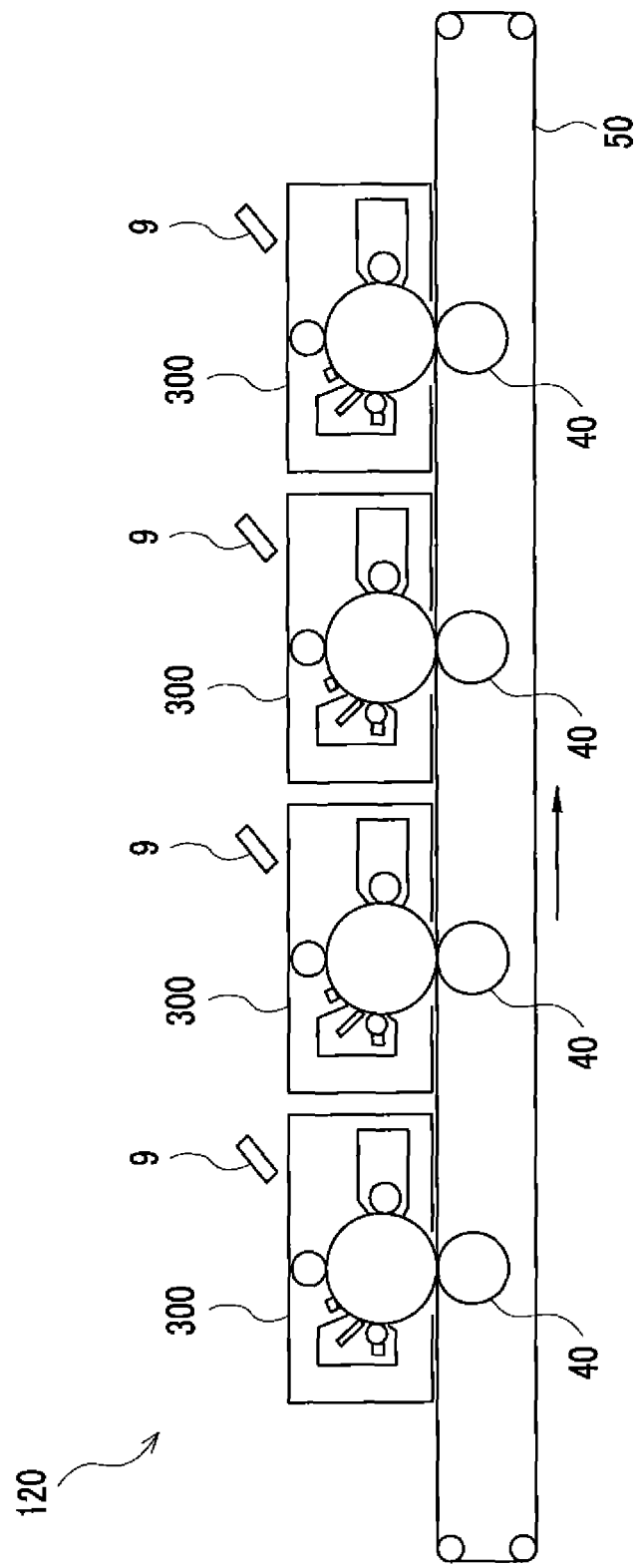
FIG. 5 is a diagram schematically illustrating an image forming apparatus according to another exemplary embodiment of the invention.

FIG. 5 is a sectional view schematically illustrating an image forming apparatus 120 according to another exemplary embodiment.

The image forming apparatus 120 shown in FIG. 5 is a tandem color image forming apparatus mounted with four process cartridges 300.

The image forming apparatuses 120 has a configuration in which four process cartridges 300 are arranged in parallel on the intermediate transfer member 50 and one electrophotographic photoreceptor is used for each color. The image forming apparatus 120 has the same configuration as the image forming apparatus 100, except that it is a tandem type.

The image forming apparatus according to this exemplary embodiment is not limited to the above-mentioned configuration, and ether known types of image forming apparatuses can be employed.

EXAMPLES

The invention will be more specifically described below with reference to examples, but the invention is not limited to the examples.

Example A1

An ITO glass substrate having an ITO film on a glass substrate is prepared and the ITO film is etched in the form of strips with a width of 2 mm to form ITO electrodes (positive electrodes). This ITO glass substrate is ultrasonically washed with isopropanol (for electronics industry, made by Kanto Chemical Co., Inc.) and then is dried with a spin coater.

By depositing sublimated and refined copper phthalocyanine on the surface of the ITO glass substrate having the ITO electrodes formed thereon under vacuum, a thin film with a thickness of 0.015 µm is formed.

Subsequently, 2 parts by mass of the compound (compound iv-9) represented by Formula (III) is dissolved in 100 parts by mass of tetrahydrofuran (THF) not containing a stabilizer and 0.3 part by mass of an initiator V-601 (made by Waco Pure Chemical Industries Inc.) is further dissolved therein, whereby a coating solution for forming a protective layer is obtained. A charge-transporting layer is coated with this coating solution and is heated under the atmosphere with an oxygen concentration of about 80 ppm at 150° C. for 40 minutes, whereby a thin film with a thickness of 0.050 µm is formed.

Then, by depositing a compound ($Alq_3$) represented by the following formula as a light-emitting material on the hole-transporting layer, a light-emitting layer with a thickness of 0.060 µm is formed.

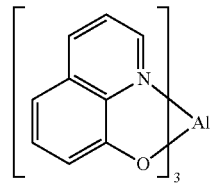

An Mg—Ag alloy is deposited on the light-emitting layer by co-deposition to form a stripe-shape Mg—Ag electrode (negative electrode) with a width of 2 mm and a thickness of 0.13 µm, whereby an organic electroluminescence element is obtained. The ITO electrode and the Mg—Ag electrode are formed to extend perpendicularly to each other. The effective area of the obtained organic electroluminescence element is 0.04 $cm^2$.

Light is emitted by applying a DC voltage between the ITO electrode as plus (positive electrode) and the Mg—Ag electrode as minus (negative electrode) in vacuum (0.133 Pa). The maximum brightness at this time is 820 $cd/m^2$, the driving current is 8.4 $mA/cm^2$, and the element lifetime is 35 hours.

As can be clearly seen from this result, the organic electroluminescence element according to this exemplary embodiment can achieve superior electrical characteristics and can form a long-lifetime element without any change in morphology.

Example 1

Production of Electrophotographic Photoreceptor

Formation of Undercoat Layer 100 parts by mass of zinc oxide (with an average particle diameter of 70 nm and a specific surface area 15 $m^2/g$, made by Tayca Corporation) is stirred and mixed with 500 parts by mass of toluene, 1.3 parts by mass of a silane coupling agent (KBM 503, made by Shin Etsu Chemical Co., Ltd.) is added thereto, and the resultant is stirred for 2 hours. Thereafter, toluene is distilled through depressurized distillation and the resultant is baked at 120° C. for 3 hours, whereby zinc oxide subjected to surface treatment with the silane coupling agent is obtained.

110 parts by mass of zinc oxide subjected to surface treatment is stirred and mixed with 500 parts by mass of tetrahydrofuran, a solution in which 0.6 part by mass of alizarin is dissolved in 50 parts by mass of tetrahydrofuran is added thereto, and the resultant is stirred at 50° C. for 5 hours. Thereafter, zinc oxide having alizarin attached thereto is filtrated by depressurized filtration and the resultant is dried at 60° C. under depressurization, whereby zinc oxide having alizarin attached thereto is obtained.

38 parts by mass of a solution in which 60 parts by mass of zinc oxide having alizarin attached thereto, 13.5 parts by mass a hardener (blocked isocyanate SUMIDUR 3175, made by Sumitomo Bayer Urethane Co., Ltd.), and 15 parts by mass of a butyral resin (S-REC BM-1, made by Sekisui Chemical Co., Ltd.) are mixed with 85 parts by mass of methylethyl ketone is mixed with 25 parts by mass of methylethyl ketone and the resultant is dispersed for 2 hours by the use of a sand mill using glass beads with a diameter of 1 mmϕ, whereby a dispersion is obtained. 0.005 parts by mass of dioctyltin dilaurate as a catalyst and 40 parts by mass of silicone resin particles (TOSPEARL 145, made by GE Toshiba Silicones Co., Ltd.) are added to the obtained dispersion, whereby a coating solution for forming an undercoat layer is obtained. An aluminum substrate is coated with the coating solution through the use of a dip coating method and the resultant is dried and hardened at 170° C. for 40 minutes, whereby an undercoat layer with a thickness of 20 μm is obtained.

Formation of Charge-Generating Layer

A mixture including 15 parts by mass of hydroxygallium phthalocyanine having a diffraction peak at least at Bragg angles (2θ±0.2°) of 7.3°, 16.0°, 24.9°, and 28.0° in an X-ray diffraction spectrum using CuKα characteristic X-rays as a charge-generating material, 10 parts by mass of a vinyl chloride-vinyl acetate copolymer resin (VMCH, made by Nippon Unicar Co., Ltd.) as a binder resin, and 200 parts by mass of n-butyl acetate is dispersed by the use of a sand mill using glass beads with a diameter of 1 mmϕ for 4 hours. 175 parts by mass of n-butyl acetate and 180 parts by mass of methylethyl ketone are added to the obtained dispersion and the resultant is stirred, whereby a coating solution for forming a charge-generating layer is obtained. The undercoat layer is coated with the coating solution for forming a charge-generating layer through the use of a dip coating method and the resultant is dried at a normal temperature (25° C.) whereby a charge-generating layer with a thickness of 0.2 μm is formed.

Formation of Charge-Transporting Layer 48 parts by mass of N,N'-diphenyl-N,N'-bis(3-methylphenyl)-[1,1']biphenyl-4,4'-diamine (hereinafter, referred to as "TPD") and 52 parts by mass of a Bisphenol Z polycarbonate resin (hereinafter, referred to as "PCZ 500", with a viscosity-average molecular weight of 50,000) are added to and dissolved in 800 parts by mass of chlorobenzene, whereby a coating solution for forming a charge-transporting layer is obtained. The charge-generating layer is coated with the obtained coating solution and the resultant is dried at 130° C. for 45 minutes, whereby a charge-transporting layer with a thickness of 20 μm is formed.

Formation of Protective Layer 20 parts by mass of the compound (compound iv-4) represented by Formula (III) is dissolved in 100 parts by mass of tetrahydrofuran (THF) not containing a stabilizer and 3.5 parts by mass of initiator V-601 (made by Waco Pure Chemical Industries Inc.) (thermal radical initiator) is additionally dissolved therein, whereby a coating solution for forming a protective layer is obtained. The charge-transporting layer is coated with the obtained coating solution and the resultant is heated under the atmosphere with an oxygen concentration of about 80 ppm at 150° C. for 40 minutes, whereby a protective layer with a thickness of 7 μm is formed.

In this way, an electrophotographic photoreceptor is obtained. This photoreceptor is defined as Electrophotographic Photoreceptor 1.

Evaluation (1) Measurement of Charge Potential (Surface Potential) and Residual Potential The obtained electrophotographic photoreceptor is provided to Steps (A) to (C) at a high temperature and a high humidity (at 28.5° C. and 65% RH).

Step (A): a step of charging the electrophotographic photoreceptor with a scorotron charger with a grid-applied voltage of −700 V Step (B): an exposing step of irradiating the electrophotographic photoreceptor with a laser beam of 10.0 erg/cm² by the use of a semiconductor laser with a wavelength of 780 nm in 1 second after Step (A)

Step (C): an erasing step of irradiating the electrophotographic photoreceptor with a red LED beam of 50.0 erg/cm² in 3 seconds after Step (A)

At this time, the above-mentioned steps are repeated by 100K cycles by the use of a scanner modified from a laser printer (modified from XP-15 made by Fuji Xerox Co., Ltd.).

VH (the surface potential of the photoreceptor after it is charged in Step (A)), VL (the surface potential of the photoreceptor after it is exposed in Step (B)), and VRP (the surface potential (residual potential) of the photoreceptor after it is erased in Step (C)) are measured at the first time and after 100 kcycles to obtain initial VH, VL, and VRP and variations ΔVH, ΔVL, and ΔVRP from the initial.

A surface electrometer MODEL 344 (made by Trek Japan Co., Ltd.) is used to measure the surface potential (residual potential).

The evaluation indices are as follows.

(Evaluation Indices of VL)
A: equal to or higher than −240 V
B: equal to or higher than −280 V and less than −240 V
C: equal to or higher than −300 V and less than −280 V
D: less than −300 V (Evaluation Indices of VRP)
A: equal to or higher than −130 V
B: equal to or higher than −150 V and less than −130 V
C: equal to or higher than −170 V and less than −150 V
D: less than −170 V (Evaluation Indices of ΔVH, ΔVL, and ΔVRP)
A: equal to or less than 10 V
B: more than 10 V and equal to or less than 20 V
C: more than 20 V and equal to or less than 30 V
D: more than 30 V The results are shown in Table 2.

(2) Ghost Test

The electrophotographic Photoreceptor thus obtained is evaluated according to (1), is then mounted on "Apeos Port-III C4400" made by Fuji Xerox Co., Ltd. and the evaluation of ghost is performed under an environment of 28.5° C. and 65% RH. Thereafter, a print test of 15% halftone is performed on 10,000 sheets of paper under the environment of 28.5° C. and 65% RH and then a ghost test is performed as follows.

P paper made by Fuji Xerox Co., Ltd. (with a size of A4 and paper feed in the transverse direction) is used in this test.

Ghost Test

Figures 6A, 6B, 6C:
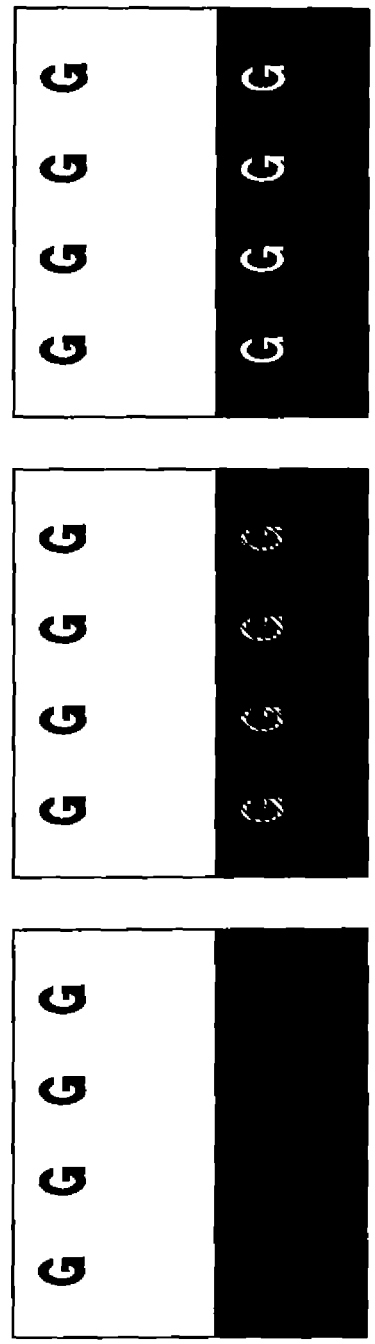
FIGS. 6A to 6C are diagrams illustrating criteria for ghost evaluation.

Regarding the ghost, a chart of patterns including G and a black area shown in FIG. 6A is printed and the state of G appearing in the black area is evaluated with naked eyes.

A: good or slight as shown in FIG. 6A
B: slightly visible as shown in FIG. 6B
C: clearly visible as shown in FIG. 6C (3) Surface Observation The obtained electrophotographic photoreceptor is mounted on "Apeos Port-III C4400" made by Fuji Xerox Co., Ltd., the surface of the electrophotographic photoreceptor is observed before and after a print test of 15% halftone is performed on 10,000 sheets of paper under the environment of 28.5° C. and 65% RH, and the surface observation (Test 1) is performed as follows.

P paper made by Fuji Xerox Co., Ltd. (with a size of A4 and paper feed in the transverse direction) is used in this test.

Surface Observation

The surface of the electrophotographic photoreceptor is observed and is evaluated as follows.

A: Scratch and attachment are not observed with 20 times of enlargement, which is good.
B: Attachment is observed with 20 times of enlargement.
C: Slight scratch is observed with 20 times of enlargement.

D: Slight scratch or attachment is observed with naked eyes.

Examples 2 to 26 and Comparative Examples 2 and 3

Production of Electrophotographic Photoreceptor

The same steps as in Example 1 are performed up to the formation of the charge-transporting layer and the composition of the material used to form a protective layer is then changed as shown in Table 1, whereby coating solutions for forming a protective layer are obtained. The charge-transporting layer is coated with the coating solutions and the resultant is heated under the atmosphere with an oxygen concentration of about 80 ppm at 145° C. for 40 minutes, whereby protective layers with a thickness of 7 μm are formed.

In this way, electrophotographic photoreceptors are obtained. These photoreceptors are defined as Photoreceptors 2 to 26 and Comparative Photoreceptor 2.

Here, Ref CT-1 used as a compound having charge transportability in Comparative Example 2 is described below.

Ref CT-2 used as a compound having charge transportability in Comparative Example 3 is described below.

tion of the material used to form a protective layer is then changed as shown in Table 1, whereby a coating solution for forming a protective layer is obtained. The charge-transporting layer is coated with the coating solution and the resultant is irradiated with UV rays under the atmosphere with an oxygen concentration of about 80 ppm with a luminance of 700 mW/cm$^2$ (based on 365 nm) an irradiation time of 120 seconds by the use of a metal halide lamp (made by Ushio Inc.). The resultant is heated at 150° C. for 40 minutes to form a protective layer with a thickness of 7 μm.

In this way, an electrophotographic photoreceptor is obtained. This photoreceptor is defined as Photoreceptor 27.

Evaluation

The same evaluation as in Example 1 is performed on the obtained photoreceptor. The results are shown in Table 2.

Example 28

Production of Electrophotographic Photoreceptor

The same steps as in Example 1 are performed up to the formation of the charge-generating layer, the composition of the material used to form a charge-transporting layer is then changed as shown in Table 1, and the amount of solvent used is changed to 250 parts by mass, whereby a coating solution for forming a charge-transporting layer is obtained. The

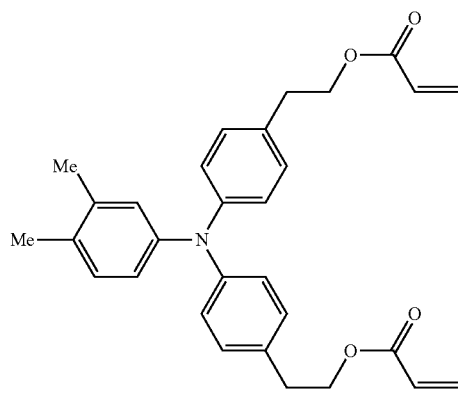

Ref CT-1

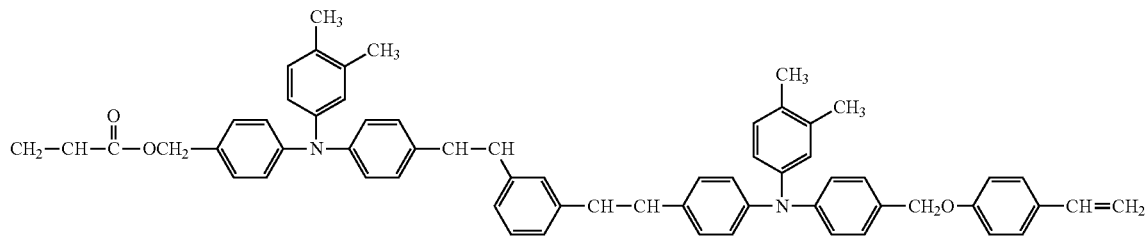

Ref CT-2

Evaluation

The same evaluation as in Example 1 is performed on the obtained photoreceptors. The results are shown in Table 2.

Example 27

Production of Electrophotographic Photoreceptor

The same steps as in Example 1 are performed up to the formation of the charge-transporting layer and the composicharge-generating layer is coated with the coating solution and the resultant is heated under the atmosphere with an oxygen concentration of about 80 ppm at 145° C. for 40 minutes, whereby a charge-transporting layer with a thickness of 20 μm is formed.

In this way, an electrophotographic photoreceptor is obtained. This photoreceptor is defined as Photoreceptor 28.

Evaluation

The same evaluation as in Example 1 is performed on the obtained photoreceptor. The results are shown in Table 2.

Comparative Example 1

Production of Electrophotographic Photoreceptor

The same steps as in Example 1 are performed up to the formation of the charge-generating layer and a charge-transporting layer with a thickness of 25 μm is formed in the same procedure as in Example 1.

In this way, an electrophotographic photoreceptor is obtained. This photoreceptor is defined as Comparative Photoreceptor 1.

TABLE 1

| | | Examples | | | | |
|---|---|---|---|---|---|---|
| | | Ex. 1 | Ex. 2 | Ex. 3 | Ex. 4 | Ex. 5 |
| Compound having charge transportability | (1) Content (parts by mass) | iv-4 20 | ii-9 5 | iii-2 20 | ii-1 15 | iv-9 20 |
| | (2) Content (parts by mass) | | iv-10 15 | | | |
| Monomer not having charge transportability | (1) Content (parts by mass) | | | | SR351 5 | |
| Thermoplastic resin | Type Content (parts by mass) | | | | | |
| Thermal radical initiator | type Content (parts by mass) | V-601 3.5 | V-601 3.5 | V-601 3.5 | V-601 3.5 | V-601 3.5 |
| Photoreceptors | | Photoreceptor 1 | Photoreceptor 2 | Photoreceptor 3 | Photoreceptor 4 | Photoreceptor 5 |
| | | Examples | | | | |
| | | Ex. 6 | Ex. 7 | Ex. 8 | Ex. 9 | Ex. 10 |
| Compound having charge transportability | (1) Content (parts by mass) | ii-9 15 | ii-14 15 | ii-9 20 | ii-14 5 | ii-14 15 |
| | (2) Content (parts by mass) | | | | iv-10 15 | |
| Monomer not having charge transportability | (1) Content (parts by mass) | SR399 5 | SR351 5 | | | SR399 5 |
| Thermoplastic resin | Type Content (parts by mass) | | | | | |
| Thermal radical initiator | Type Content (parts by mass) | V-601 3.5 | V-601 3.5 | V-601 3.5 | V-601 3.5 | V-601 3.5 |
| Photoreceptors | | Photoreceptor 6 | Photoreceptor 7 | Photoreceptor 8 | Photoreceptor 9 | Photoreceptor 10 |
| | | Examples | | | | |
| | | Ex. 11 | Ex. 12 | Ex. 13 | Ex. 14 | Ex. 15 |
| Compound having charge transportability | (1) Content (parts by mass) | iv-10 15 | iv-10 20 | ii-1 5 | ii-26 20 | ii-14 5 |
| | (2) Content (parts by mass) | | | iv-9 15 | | iv-9 15 |
| Monomer not having charge transportability | (1) Content (parts by mass) | SR348 5 | | | | |
| Thermoplastic resin | Type Content (parts by mass) | | | | | |
| Thermal radical initiator | type Content (parts by mass) | V-601 3.5 | V-601 3.5 | V-601 3.5 | V-601 3.5 | V-601 3.5 |
| Photoreceptors | | Photoreceptor 11 | Photoreceptor 12 | Photoreceptor 13 | Photoreceptor 14 | Photoreceptor 15 |
| | | Examples | | | | |
| | | Ex. 16 | Ex. 17 | Ex. 18 | Ex. 19 | Ex. 20 |
| Compound having charge transportability | (1) Content (parts by mass) | ii-9 5 | ii-1 20 | ii-1 5 | ii-30 20 | iv-17 20 |
| | (2) Content (parts by mass) | iv-9 15 | | iv-10 15 | | |
| Monomer not having charge transportability | (1) Content (parts by mass) | | | | | |
| Thermoplastic resin | Type Content (parts by mass) | | | | | |
| Thermal radical initiator | Type Content (parts by mass) | V-601 3.5 | V-601 3.5 | V-601 3.5 | V-601 3.5 | V-601 3.5 |
| Photoreceptors | | Photoreceptor 16 | Photoreceptor 17 | Photoreceptor 18 | Photoreceptor 19 | Photoreceptor 20 |

TABLE 1-continued

|  |  | Examples | | | | |
| --- | --- | --- | --- | --- | --- | --- |
|  |  | Ex. 21 | Ex. 22 | Ex. 23 | Ex. 24 | Ex. 25 |
| Compound having charge transportability | (1) | ii-1 | ii-9 | ii-14 | iv-9 | iv-9 |
|  | Content (parts by mass) | 15 | 15 | 20 | 15 | 15 |
|  | (2) |  |  |  |  |  |
|  | Content (parts by mass) |  |  |  |  |  |
| Monomer not having charge transportability | (1) | SR399 | SR351 |  | SR348 |  |
|  | Content (parts by mass) | 5 | 5 |  | 5 |  |
| Thermoplastic resin | Type |  |  |  |  | PCZ400 |
|  | Content (parts by mass) |  |  |  |  | 5 |
| Thermal radical initiator | Type | V-601 | V-601 | V-601 | V-601 |  |
|  | Content (parts by mass) | 3.5 | 3.5 | 3.5 | 3.5 |  |
|  | Photoreceptors | Photoreceptor 21 | Photoreceptor 22 | Photoreceptor 23 | Photoreceptor 24 | Photoreceptor 25 |

|  |  | Examples | | | | | |
| --- | --- | --- | --- | --- | --- | --- | --- |
|  |  | Ex. 26 | Ex. 27 | Ex. 28 | Com. Ex. 1 | Com. Ex. 2 | Com. Ex. 3 |
| Compound having charge transportability | (1) | iv-10 | iv-10 | ii-1 |  | Ref CT1 | Ref CT2 |
|  | Content (parts by mass) | 15 | 15 | 5 |  | 15 | 15 |
|  | (2) |  | TPD | iv-10 |  |  |  |
|  | Content (parts by mass) |  | 5 | 15 |  |  |  |
| Monomer not having charge transportability | (1) |  |  |  |  | SR399 | SR399 |
|  | Content (parts by mass) |  |  |  |  | 5 | 5 |
| Thermoplastic resin | Type | PCZ400 | PCZ400 |  |  |  |  |
|  | Content (parts by mass) | 5 | 15 |  |  |  |  |
| Thermal radical initiator | Type |  |  | V-601 |  | V-601 | V-601 |
|  | Content (parts by mass) |  |  | 3.5 |  | 3.5 | 3.5 |
|  | Photoreceptors | Photo-receptor 26 | Photo-receptor 27 | Photo-receptor 28 | Comparative Photo-receptor 1 | Comparative Photo-receptor 2 | Comparative Photo-receptor 3 |

TABLE 2

|  |  |  | Ex. 1 | Ex. 2 | Ex. 3 | Ex. 4 | Ex. 5 | Ex. 6 | Ex. 7 | Ex. 8 | Ex. 9 | Ex. 10 |
| --- | --- | --- | --- | --- | --- | --- | --- | --- | --- | --- | --- | --- |
| Test 1 |  | VL | A | A | A | A | A | A | A | A | A | A |
|  |  | VRP | A | A | A | A | A | A | A | A | A | A |
|  |  | ΔVH | A | A | A | A | A | A | A | A | A | A |
|  |  | ΔVL | A | A | A | A | A | B | B | A | A | B |
|  |  | ΔVRP | A | A | A | A | A | A | A | A | A | B |
| Tests 2 and 3 | Before | Ghost | A | A | A | A | A | A | A | A | A | A |
|  |  | Surface Observation | A | A | A | A | A | A | A | A | A | A |
|  | After | Ghost | A | B | A | B | A | B | B | A | B | A |
|  |  | Surface Observation | A | A | C | A | A | A | A | C | A | A |

|  |  |  | Ex. 11 | Ex. 12 | Ex. 13 | Ex. 14 | Ex. 15 | Ex. 16 | Ex. 17 | Ex. 18 | Ex. 19 | Ex. 20 |
| --- | --- | --- | --- | --- | --- | --- | --- | --- | --- | --- | --- | --- |
| Test 1 |  | VL | A | A | A | A | A | A | A | A | A | A |
|  |  | VRP | A | A | A | A | A | A | A | A | A | A |
|  |  | ΔVH | A | A | A | A | A | A | A | A | A | A |
|  |  | ΔVL | A | A | A | B | A | A | A | A | B | A |
|  |  | ΔVRP | A | A | A | B | A | A | A | A | B | A |
| Tests 2 and 3 | Before | Ghost | A | A | A | B | A | A | A | A | B | A |
|  |  | Surface Observation | A | A | A | A | A | A | A | A | A | A |
|  | After | Ghost | A | A | B | B | B | B | A | B | B | A |
|  |  | Surface Observation | C | A | A | C | A | A | C | A | C | A |

|  |  |  | Ex. 21 | Ex. 22 | Ex. 23 | Ex. 24 | Ex. 25 | Ex. 26 | Ex. 27 | Ex. 28 | Comparative Ex. 1 | Comparative Ex. 2 | Comparative Ex. 3 |
| --- | --- | --- | --- | --- | --- | --- | --- | --- | --- | --- | --- | --- | --- |
| Test 1 |  | VL | A | A | A | A | A | A | A | A | A | A | B |
|  |  | VRP | A | A | A | A | A | A | A | A | A | B | B |
|  |  | ΔVH | A | A | A | A | A | A | A | A | A | A | A |
|  |  | ΔVL | A | A | A | A | A | B | B | A | C | C | C |
|  |  | ΔVRP | A | A | A | A | A | A | A | B | A | D | C |
| Tests 2 and 3 | Before | Ghost | A | A | A | A | A | B | B | A | A | B | B |
|  |  | Surface Observation | A | A | A | A | B | B | A | A | A | A | A |

TABLE 2-continued

| After | Ghost | B | B | A | A | B | B | B | B | B | C | C |
| | Surface Observation | B | B | C | B | C | C | C | C | E | B | B |

From these results, it can be seen that the examples are superior in ghost and surface observation under a high-temperature and high-humidity environment, compared with the comparative examples.

It can also be seen that the residual potential in the examples is smaller than that in Comparative Example 2.

Abbreviations described in Table 1 will be described below.

Monomer not Having Charge Transportability
  SR351: Trimethylolpropane triacrylate (made by Sartomer Company Inc.)
  SR399: Dipentaerythritol pentaacrylate (made by Sartomer Company Inc.)
  SR348: Ethoxylated (2) Bisphenol A dimethacrylate (made by Sartomer Company, Inc.)

Thermoplastic Resin
  PCZ-400: Bisphenol Z polycarbonate resin (with a viscosity-average molecular weight of 40,000) made by Mitsubishi Gas Chemical Company, Inc.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A charge-transporting film comprising:
a polymer of a compound represented by Formula (I):

(Ra)$_n$-Fa-Xa-Fa'-(Ra')$_{n'}$   (I)

wherein:
  Fa and Fa' independently represent a charge-transporting sub-unit including an aromatic ring,
  Ra and Ra' independently represent a —CH=CH$_2$ directly bonded to the aromatic ring of the charge-transporting sub-unit represented by Fa and Fa' respectively or a group represented by Formula (a):

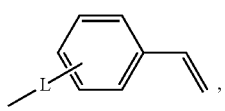

(a)

Xa represents —CH$_2$—CH$_2$—, —CH$_2$—O—CH$_2$—, —C(=O)O—CH$_2$—CH$_2$—OC(=O)—, —CH$_2$—O—CH$_2$—CH$_2$—O—CH$_2$—, —CH$_2$—O—(CH$_2$—CH$_2$—O)$_2$—CH$_2$—, —CH$_2$—CH$_2$—CH$_2$—CH$_2$—, or —CH$_2$—S—CH$_2$—, n and n' independently represent an integer of 0 or more (wherein n and n' are not simultaneously 0), and L represents a linking group which is represented by *—(CH$_2$)$_{n''}$—O—CH$_2$— and which is bonded to the aromatic ring of the charge-transporting sub-unit represented by Fa and Fa', wherein n" is 1 or 2 and the linking group is bonded to the aromatic ring of the charge-transporting sub-unit with *.

2. The charge-transporting film according to claim 1, wherein n+n' in the compound represented by Formula (I) is an integer of 2 or more.

3. The charge-transporting film according to claim 1, wherein the compound represented by Formula (I) is a compound represented by Formula (III):

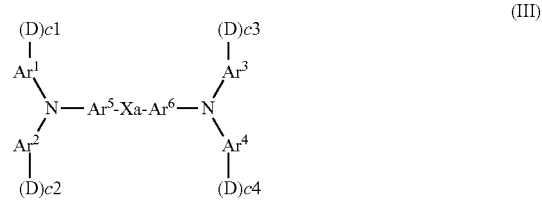

(III)

wherein:
  Ar$^1$ to Ar$^4$ independently represent a substituted or non-substituted aryl group,
  Ar$^5$ and Ar$^6$ independently represent a substituted or non-substituted allylene group,
  Xa represents —CH$_2$—CH$_2$—, —CH$_2$—O—CH$_2$—, —C(=O)O—CH$_2$—CH$_2$—OC(=O)—, —CH$_2$—O—CH$_2$—CH$_2$—O—CH$_2$—, —CH$_2$—O—(CH$_2$—CH$_2$—O)$_2$—CH$_2$—, —CH$_2$—CH$_2$—CH$_2$—CH$_2$—, or —CH$_2$—S—CH$_2$—,
  D represents —CH=CH$_2$ or a group represented by Formula (a'):

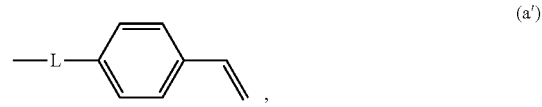

(a')

c1 to c4 each independently represent 0 or 1,
the total number of D is 2 or more, and
L represents a linking group which is represented by *—(CH$_2$)$_{n''}$—O—CH$_2$— and which is bonded to the aromatic ring of the charge-transporting sub-unit represented by Fa and Fa', wherein n" is 1 or 2 and the linking group is bonded to the aromatic ring of the charge-transporting sub-unit with *.

4. A photoelectric conversion device comprising the charge-transporting film according to claim 1.

5. The photoelectric conversion device according to claim 4, wherein the compound represented by Formula (I) of the charge-transporting film is a compound represented by Formula (III):

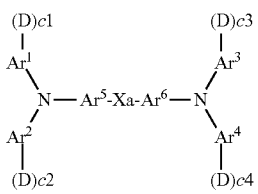

(III)

wherein:
Ar¹ to Ar⁴ independently represent a substituted or non-substituted aryl group,
Ar⁵ and Ar⁶ independently represent a substituted or non-substituted allylene group,
Xa represents an alkylene group or a bivalent group in which an alkylene group and a group selected from —O—, —S—, and ester are combined,
D represents —CH=CH₂ or a group represented by Formula (a'):

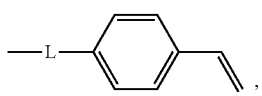

(a')

c1 to c4 each independently represent 0 or 1,
the total number of D is 2 or more, and
L represents a linking group which is represented by *—(CH₂)$_{n''}$—O—CH₂— and which is bonded to the aromatic ring of the charge-transporting sub-unit represented by Fa and Fa', wherein n" is 1 or 2 and the linking group is bonded to the aromatic ring of the charge-transporting sub-unit with *.

6. An electrophotographic photoreceptor comprising the charge-transporting film according to claim 1.

7. The electrophotographic photoreceptor according to claim 6, wherein n+n' in the compound represented by Formula (I) is an integer of 2 or more.

8. The electrophotographic photoreceptor according to claim 6, wherein the compound represented by Formula (I) of the charge-transporting film is a compound represented by Formula (III):

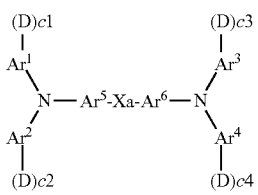

(III)

wherein:
Ar¹ to Ar⁴ independently represent a substituted or non-substituted aryl group,
Ar⁵ and Ar⁶ independently represent a substituted or non-substituted allylene group,
Xa represents —CH₂—CH₂—, —CH₂—O—CH₂—, —C(=O)O—CH₂—CH₂—OC(=O)—, —CH₂—O—CH₂—CH₂—O—CH₂—, —CH₂—O—(CH₂—CH₂—O)₂—CH₂—, —CH₂—CH₂—CH₂—CH₂—, or —CH₂—S—CH₂—, D represents —CH=CH₂ or a group represented by Formula (a'):

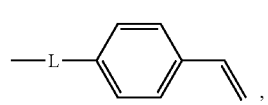

(a')

c1 to c4 each independently represent 0 or 1,
the total number of D is 2 or more, and
L represents a linking group which is represented by *—(CH₂)$_{n''}$—O—CH₂— and which is bonded to the aromatic ring of the charge-transporting sub-unit represented by Fa and Fa', wherein n" is 1 or 2 and the linking group is bonded to the aromatic ring of the charge-transporting sub-unit with *.

9. The electrophotographic photoreceptor according to claim 6, wherein the electrophotographic photoreceptor includes the charge-transporting film as an outermost surface layer.

10. The electrophotographic photoreceptor according to claim 6, wherein the charge-transporting film further includes a thermal radical initiator or a derivative thereof.

11. The electrophotographic photoreceptor according to claim 9, wherein the compound represented by Formula (I) of the charge-transporting film is a compound represented by Formula (III):

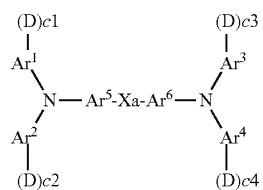

(III)

wherein:
Ar¹ to Ar⁴ independently represent a substituted or non-substituted aryl group,
Ar⁵ and Ar⁶ independently represent a substituted or non-substituted allylene group,
Xa represents —CH₂—CH₂—, —CH₂—O—CH₂—, —C(=O)O—CH₂—CH₂—OC(=O)—, —CH₂—O—CH₂—CH₂—O—CH₂—, —CH₂—O—(CH₂—CH₂—O)₂—CH₂—, —CH₂—CH₂—CH₂—CH₂—, or —CH₂—S—CH₂—, D represents —CH=CH₂ or a group represented by Formula (a'):

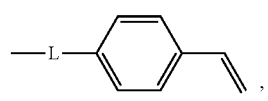

(a')

c1 to c4 each independently represent 0 or 1,
the total number of D is 2 or more, and
L represents a linking group which is represented by *—(CH₂)$_{n''}$—O—CH₂— and which is bonded to the aromatic ring of the charge-transporting sub-unit represented by Fa and Fa', wherein n" is 1 or 2 and the linking group is bonded, to the aromatic ring of the charge-transporting sub-unit with *.

12. The electrophotographic photoreceptor according to claim 9, wherein the charge-transporting film further includes a thermal radical initiator or a derivative thereof.

13. A process cartridge comprising the electrophotographic photoreceptor according to claim 6.

14. The process cartridge according to claim 13, wherein the compound represented by Formula (I) of the charge-transporting film of the electrophotographic photoreceptor is a compound represented by Formula (III):

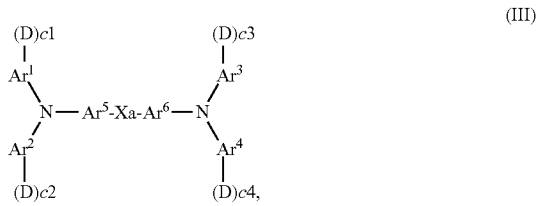

wherein:
- $Ar^1$ to $Ar^4$ independently represent a substituted or non-substituted aryl group,
- $Ar^5$ and $Ar^6$ independently represent a substituted or non-substituted allylene group,
- Xa —$CH_2$—$CH_2$—, —$CH_2$—O—$CH_2$—, —C(=O)O—$CH_2$—$CH_2$—OC(=O)—, —$CH_2$—O—$CH_2$—$CH_2$—O—$CH_2$—, —$CH_2$—O—($CH_2$—$CH_2$—O)$_2$—$CH_2$—, —$CH_2$—$CH_2$—$CH_2$—$CH_2$—, or —$CH_2$—S—$CH_2$—,
- D represents —CH=$CH_2$ or a group represented by Formula (a'):

- c1 to c4 each independently represent 0 or 1,
- the total number of D is 2 or more, and
- L represents a linking group which is represented by *—$(CH_2)_{n''}$—O—$CH_2$— and which is bonded to the aromatic ring of the charge-transporting sub-unit represented by Fa and Fa', wherein n" is 1 or 2 and the linking group is bonded to the aromatic ring of the charge-transporting sub-unit with *.

15. The process cartridge according to claim 13, wherein the charge-transporting film of the electrophotographic photoreceptor further includes a thermal radical initiator or a derivative thereof.

16. An image forming apparatus comprising:
- a charging unit that charges the electrophotographic photoreceptor according to claim 6;
- a latent image forming unit that forms an electrostatic latent image on the charged electrophotographic photoreceptor;
- a developing unit that develops the electrostatic latent image formed on the electrophotographic photoreceptor with a developer to form a toner image; and
- a transfer unit that transfers the developed toner image to a transfer medium.

17. The image forming apparatus according to claim 16, wherein the compound represented by Formula (I) of the charge-transporting film of the electrophotographic photoreceptor is a compound represented by Formula (III):

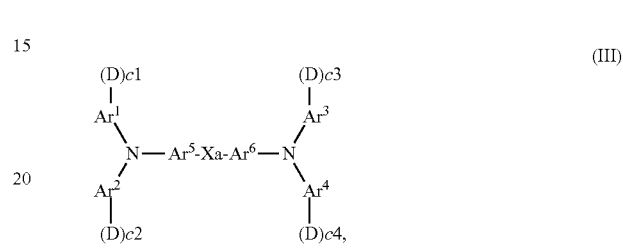

wherein:
- $Ar^1$ to $Ar^4$ independently represent a substituted or non-substituted aryl group,
- $Ar^5$ and $Ar^6$ independently represent a substituted or non-substituted allylene group,
- Xa represents —$CH_2$—$CH_2$—, —$CH_2$—O—$CH_2$—, —C(=O)O—$CH_2$—$CH_2$—OC(=O)—, —$CH_2$—O—$CH_2$—$CH_2$—O—$CH_2$—, —$CH_2$—O—($CH_2$—$CH_2$—O)$_2$—$CH_2$—, —$CH_2$—$CH_2$—$CH_2$—$CH_2$—, or —$CH_2$—S—$CH_2$—,
- D represents —CH=$CH_2$ or a group represented by Formula (a'):

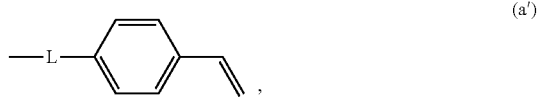

- c1 to c4 each independently represent 0 or 1,
- the total number of D is 2 or more, and
- L represents a linking group which is represented by *—$(CH_2)_{n''}$—O—$CH_2$— and which is bonded to the aromatic ring of the charge-transporting sub-unit represented by Fa and Fa', wherein n" is 1 or 2 and the linking group is bonded to the aromatic ring of the charge-transporting sub-unit with *.

18. The image forming apparatus according to claim 16, wherein the charge-transporting film of the electrophotographic photoreceptor further includes a thermal radical initiator or a derivative thereof.

* * * * *